United States Patent
Lu et al.

(10) Patent No.: US 10,522,474 B2
(45) Date of Patent: Dec. 31, 2019

(54) STAIRCASE ETCH CONTROL IN FORMING THREE-DIMENSIONAL MEMORY DEVICE

(71) Applicant: Yangtze Memory Technologies Co., Ltd., Wuhan, Hubei (CN)

(72) Inventors: Zhenyu Lu, Hubei (CN); Lidong Song, Hubei (CN); Yongna Li, Hubei (CN); Feng Pan, Hubei (CN); Xiaowang Dai, Hubei (CN); Dan Liu, Hubei (CN); Steve Weiyi Yang, Hubei (CN); Simon Shi-Ning Yang, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/046,820

(22) Filed: Jul. 26, 2018

(65) Prior Publication Data

US 2019/0051610 A1    Feb. 14, 2019

Related U.S. Application Data

(63) Continuation of application No. PCT/CN2018/077931, filed on Mar. 2, 2018.

(30) Foreign Application Priority Data

Mar. 8, 2017 (CN) .......................... 2017 1 0134787

(51) Int. Cl.
*H01L 21/76* (2006.01)
*H01L 23/544* (2006.01)
(Continued)

(52) U.S. Cl.
CPC ........ *H01L 23/544* (2013.01); *H01L 21/0217* (2013.01); *H01L 21/0273* (2013.01);
(Continued)

(58) Field of Classification Search
CPC ............... H01L 23/544; H01L 21/0273; H01L 27/11551; H01L 27/11578
(Continued)

(56) References Cited

U.S. PATENT DOCUMENTS 5,716,889 A * 2/1998 Tsuji .......................... G03F 9/70
257/797
5,869,383 A * 2/1999 Chien .................. G03F 7/70358
257/E21.596
(Continued)

FOREIGN PATENT DOCUMENTS

CN  101399251 A  4/2009
CN  102610614 A  7/2012
(Continued)

OTHER PUBLICATIONS

International Search Report and Written Opinion of the International Searching Authority directed to related International Patent Application No. PCT/CN2018/077931, dated Jun. 1, 2018; 9 pages.

*Primary Examiner* — S. V. Clark
(74) *Attorney, Agent, or Firm* — Sterne, Kessler, Goldstein & Fox P.L.L.C.

(57) ABSTRACT

Embodiments of three-dimensional (3D) memory devices and methods for controlling a photoresist (PR) trimming rate in the formation of the 3D memory devices are disclosed. In an example, a method includes forming a dielectric stack over a substrate, measuring a first distance between the first trimming mark and the PR layer along a first direction, and trimming the PR layer along the first direction. The method also includes etching the dielectric stack using the trimmed PR layer as an etch mask to form a staircase, forming a second trimming mark using the first trimming mark as an etch mask, measuring a second distance between the second trimming mark and the trimmed PR layer, comparing the first distance with the second distance to determine a dif-
(Continued)

ference between an actual PR trimming rate and an estimated PR trimming rate, and adjusting PR trimming parameters based on the difference.

19 Claims, 42 Drawing Sheets

(51) Int. Cl.
  *H01L 21/027* (2006.01)
  *H01L 21/02* (2006.01)
  *H01L 21/311* (2006.01)
  *H01L 21/66* (2006.01)
  *H01L 27/11551* (2017.01)
  *H01L 27/11578* (2017.01)
  *H01L 27/11548* (2017.01)
  *H01L 27/11556* (2017.01)
  *H01L 27/11575* (2017.01)
  *H01L 27/11582* (2017.01)

(52) U.S. Cl.
  CPC .. *H01L 21/02164* (2013.01); *H01L 21/31111* (2013.01); *H01L 21/31144* (2013.01); *H01L 22/20* (2013.01); *H01L 22/26* (2013.01); *H01L 27/11551* (2013.01); *H01L 27/11578* (2013.01); *H01L 21/02271* (2013.01); *H01L 22/12* (2013.01); *H01L 27/11548* (2013.01); *H01L 27/11556* (2013.01); *H01L 27/11575* (2013.01); *H01L 27/11582* (2013.01); *H01L 2223/5442* (2013.01); *H01L 2223/54426* (2013.01)

(58) Field of Classification Search
  USPC .......................... 438/401, 462; 257/797, 798
  See application file for complete search history.

(56) References Cited

U.S. PATENT DOCUMENTS

| | | | |
|---|---|---|---|
| 8,748,970 | B1 | 6/2014 | Lee et al. |
| 8,759,217 | B1 | 6/2014 | Chen |
| 9,196,628 | B1 | 11/2015 | Chen |
| 9,362,226 | B2 | 6/2016 | Lee et al. |
| 9,397,115 | B1 | 7/2016 | Nozawa |
| 2008/0295023 | A1* | 11/2008 | Matsumoto ............. G06T 11/60 715/788 |
| 2009/0097376 | A1* | 4/2009 | Yamaoka ........... G11B 7/00456 369/94 |
| 2010/0013950 | A1* | 1/2010 | Kikuchi ............... H04N 1/3872 348/222.1 |
| 2012/0181701 | A1 | 7/2012 | Chen et al. |
| 2012/0187471 | A1 | 7/2012 | Yu et al. |
| 2013/0020707 | A1 | 1/2013 | Or-Bach et al. |
| 2015/0263029 | A1* | 9/2015 | Kim ................. H01L 27/11575 257/314 |
| 2015/0318203 | A1 | 11/2015 | Ha et al. |
| 2016/0329345 | A1 | 11/2016 | Hu et al. |
| 2017/0358594 | A1* | 12/2017 | Lu ..................... H01L 27/11582 |
| 2019/0051610 | A1 | 2/2019 | Lu et al. |

FOREIGN PATENT DOCUMENTS

| | | |
|---|---|---|
| CN | 102915955 A | 2/2013 |
| CN | 103871994 A | 6/2014 |
| CN | 104900648 A | 9/2015 |
| CN | 106206454 A | 12/2016 |
| CN | 106847822 A | 6/2017 |

\* cited by examiner

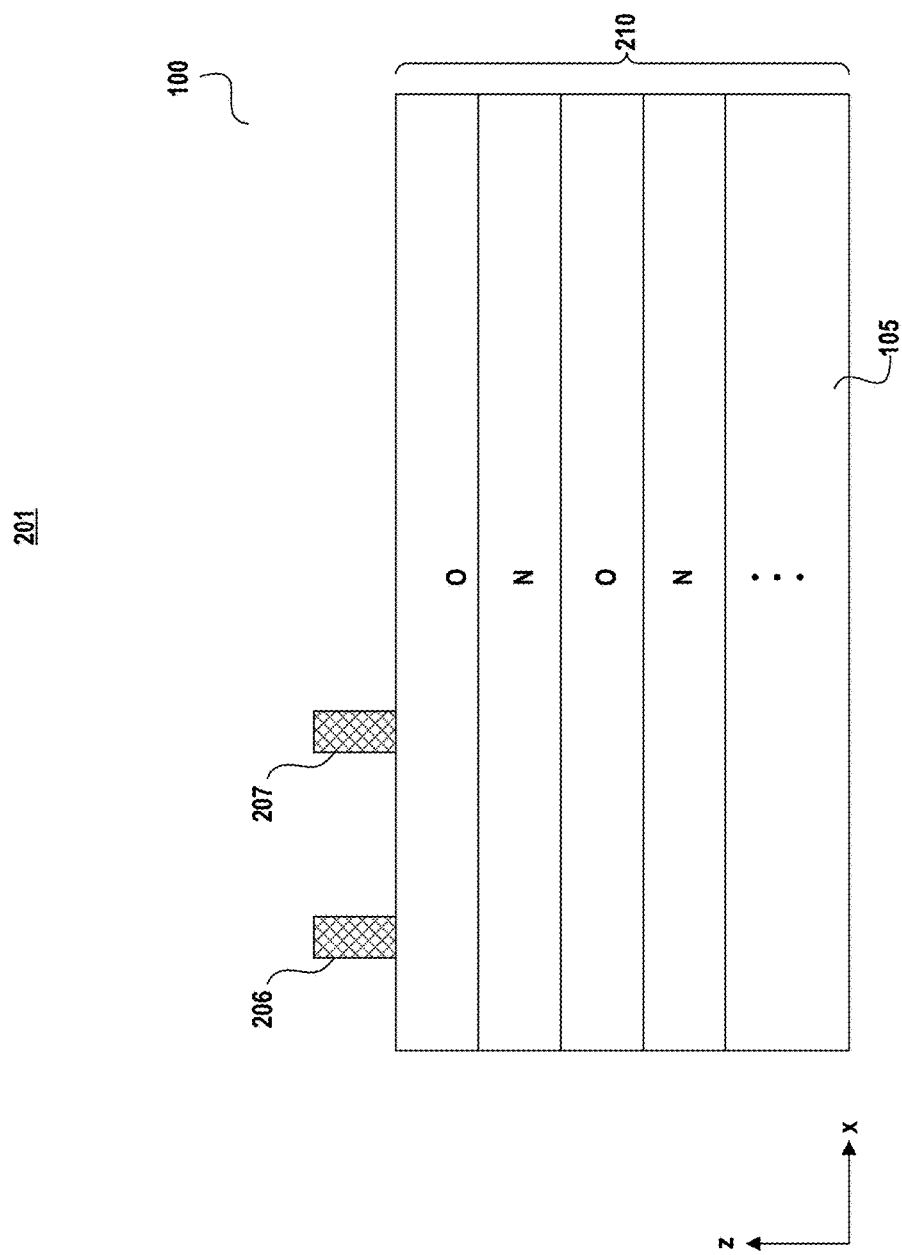

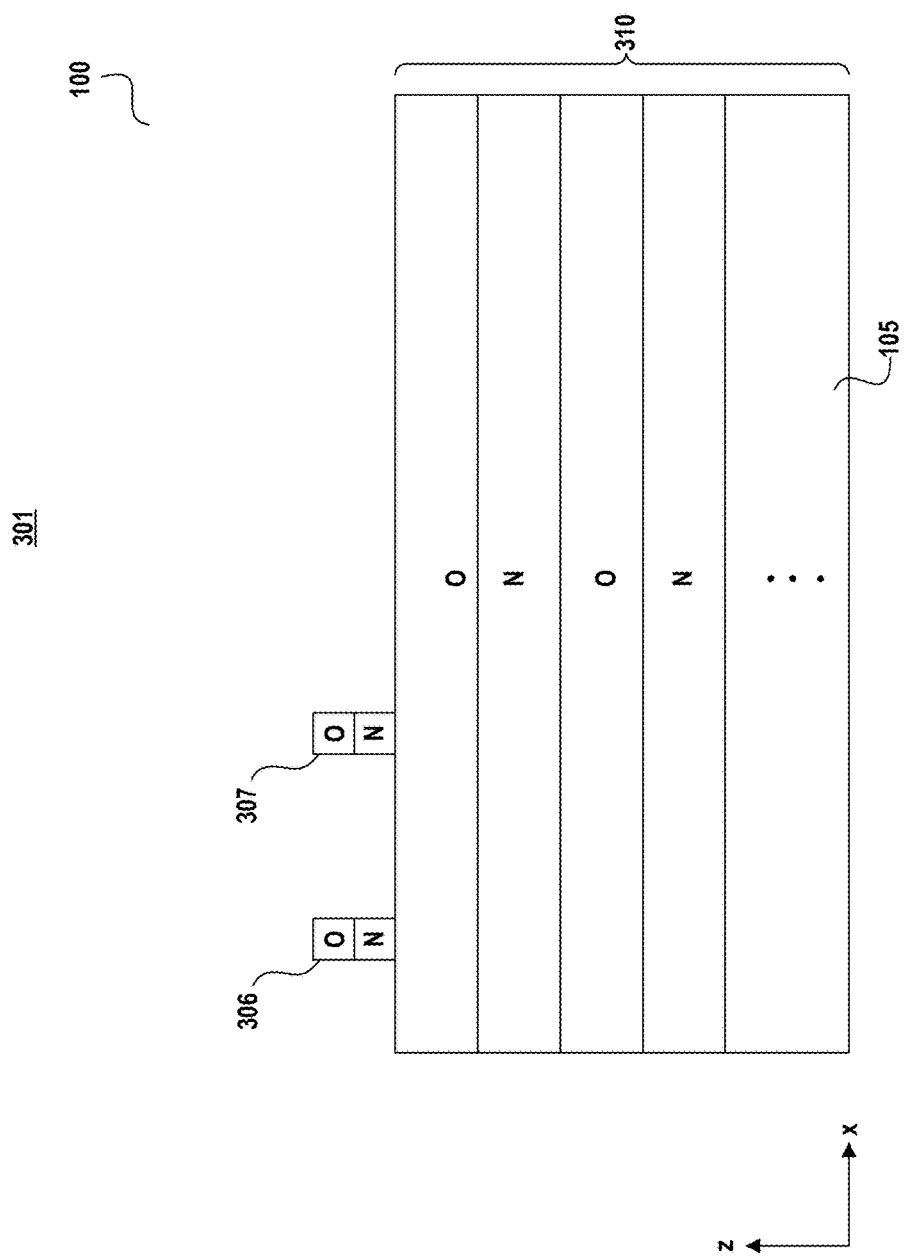

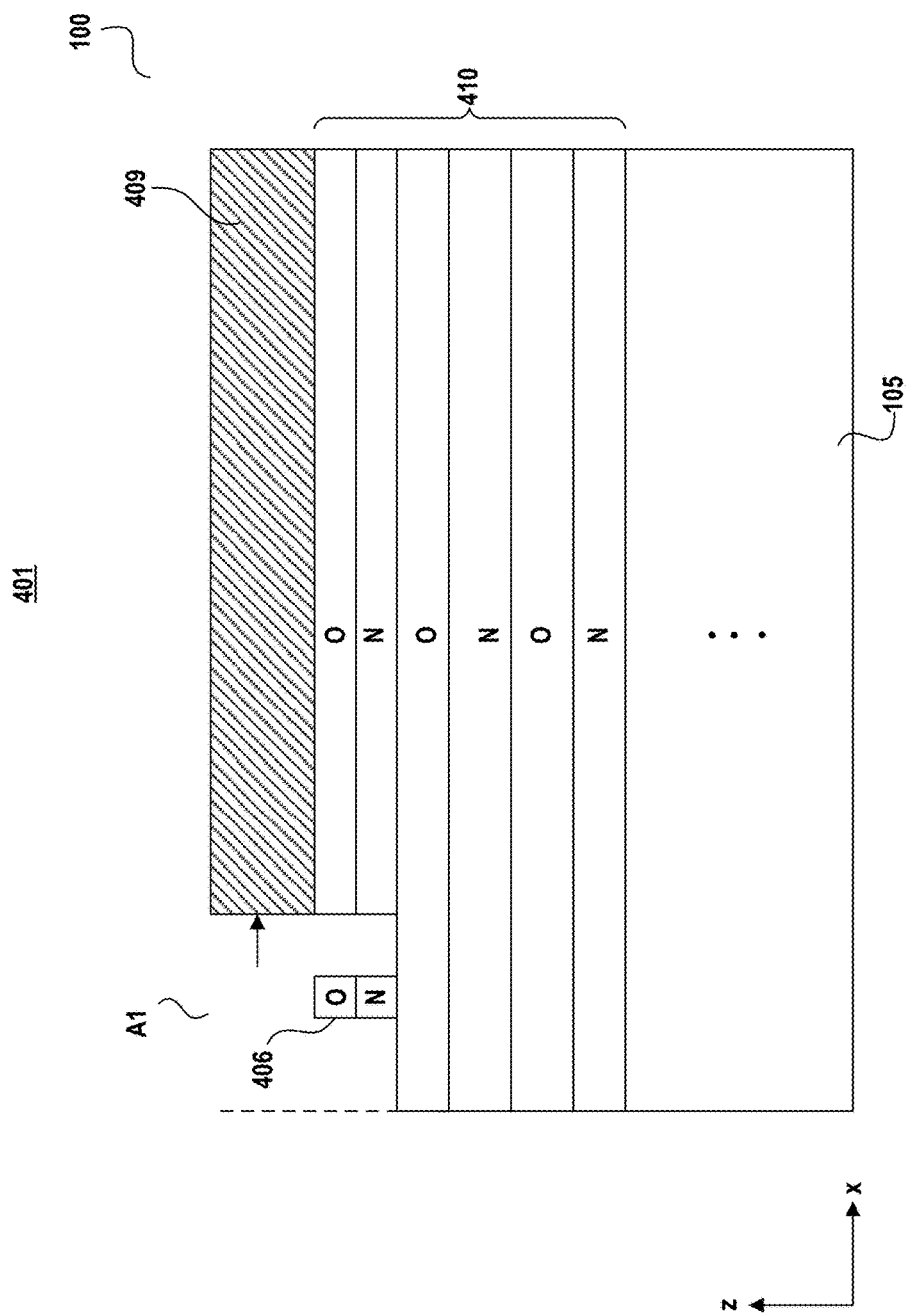

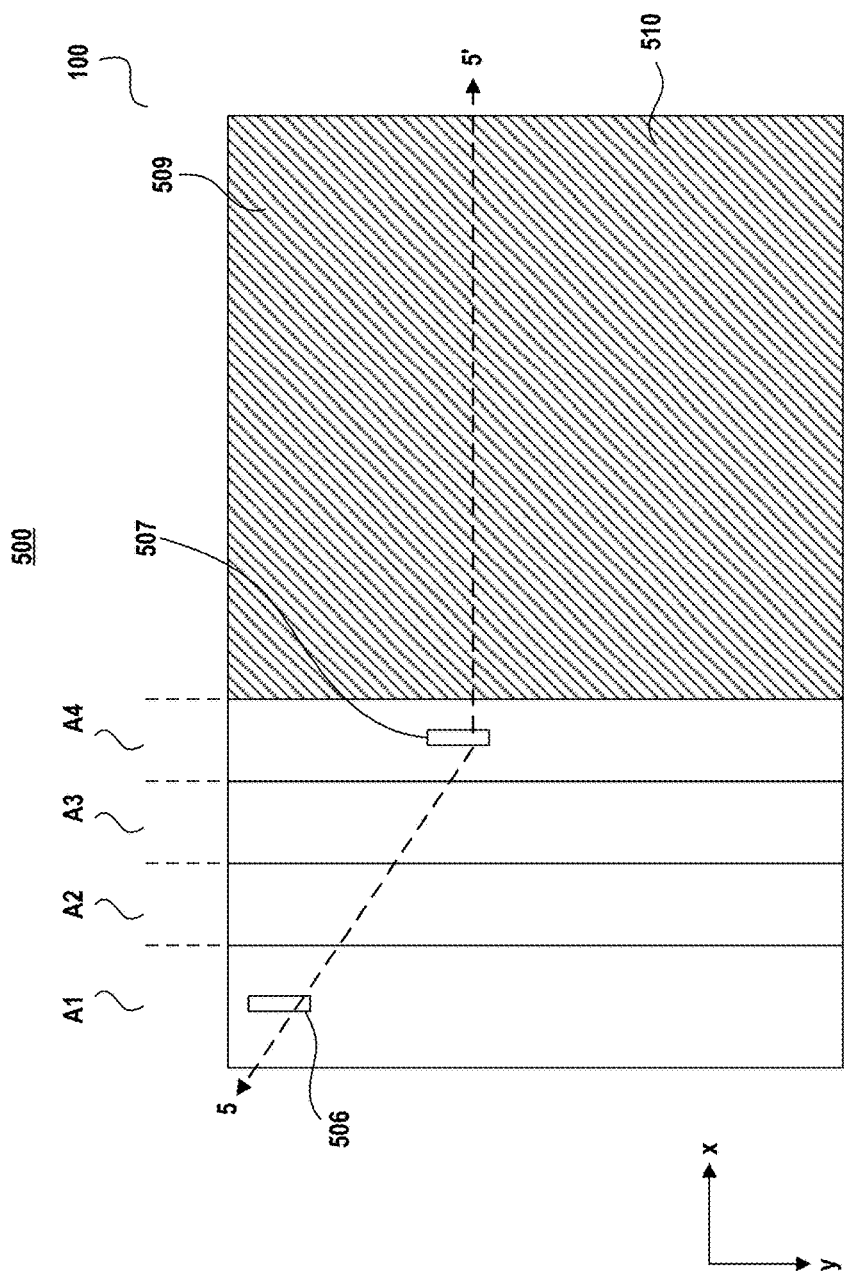

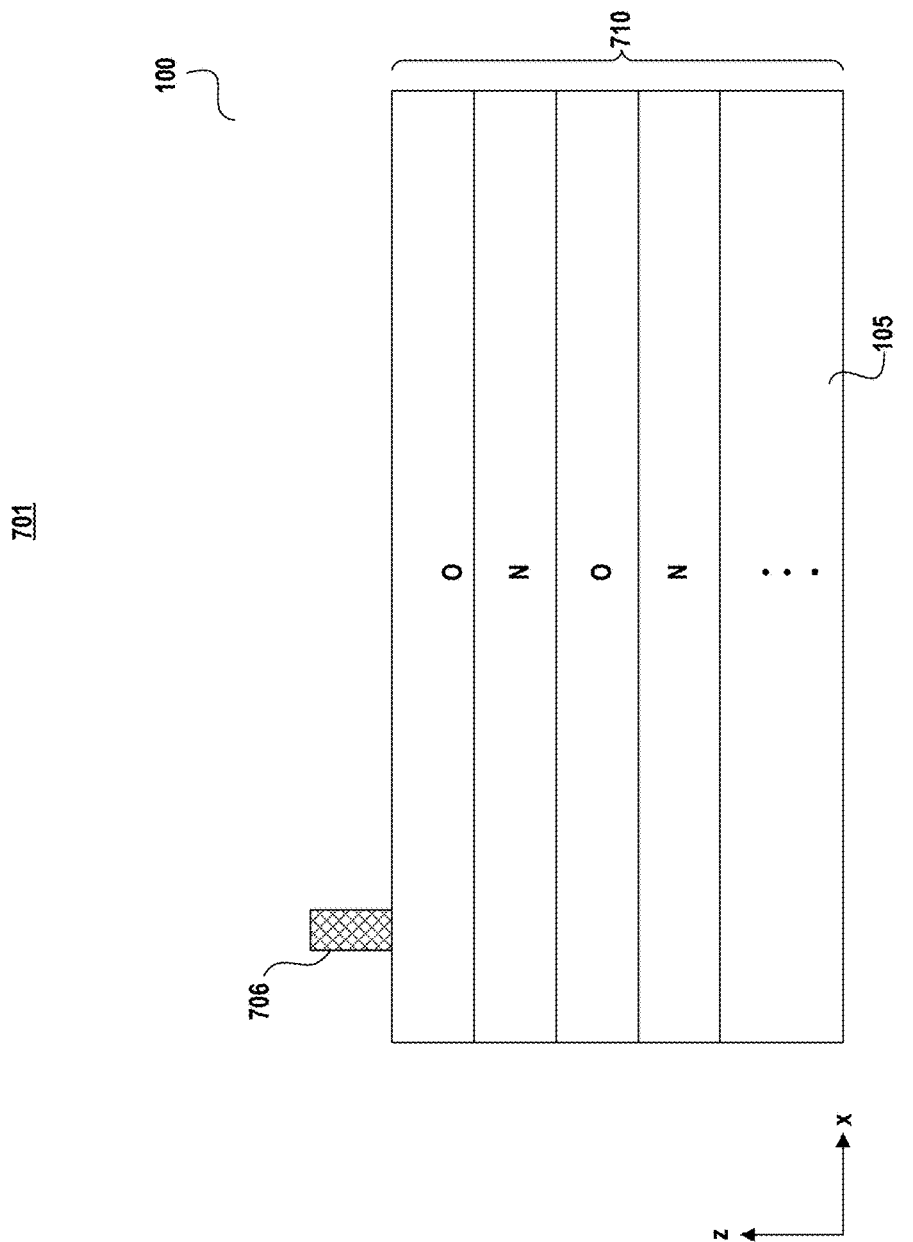

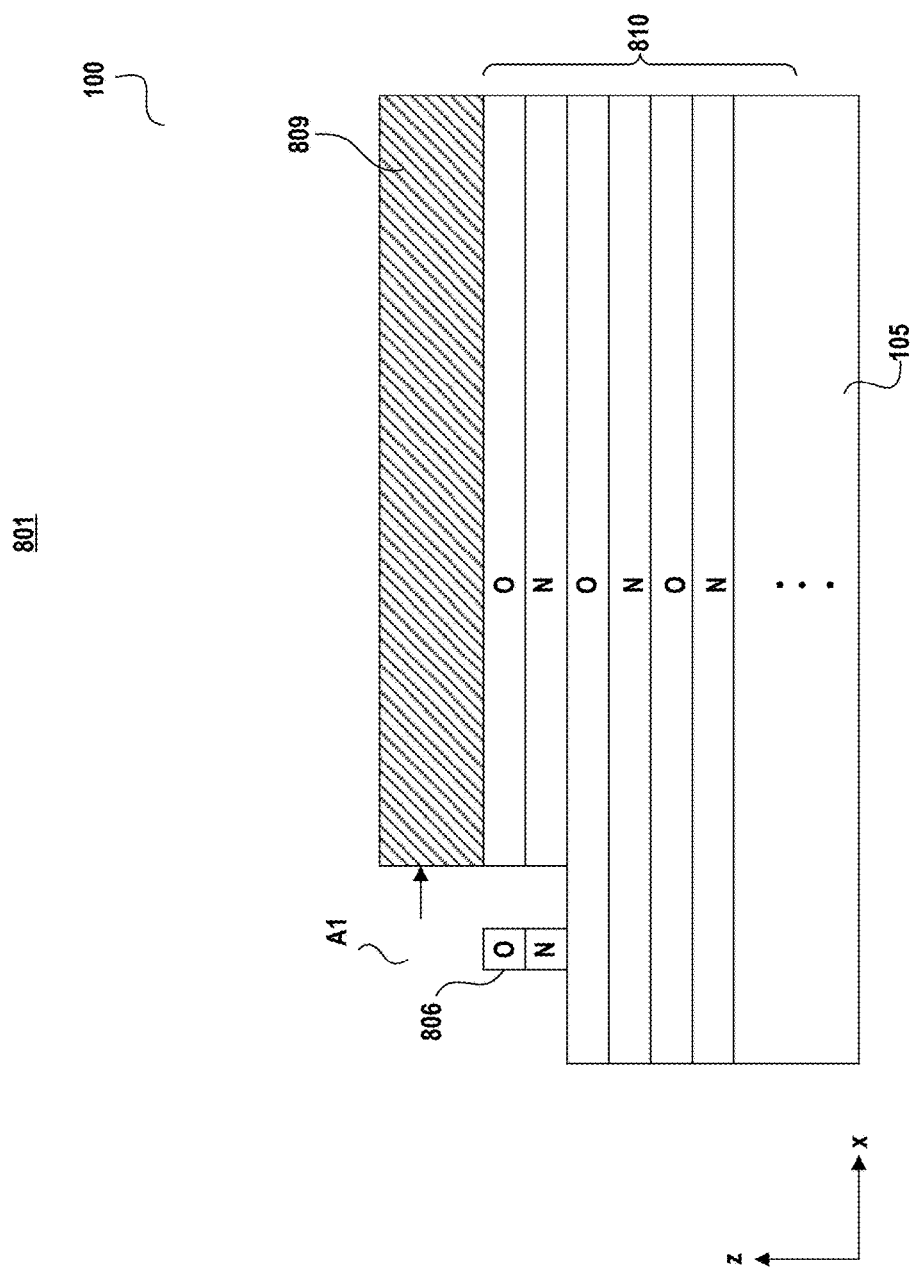

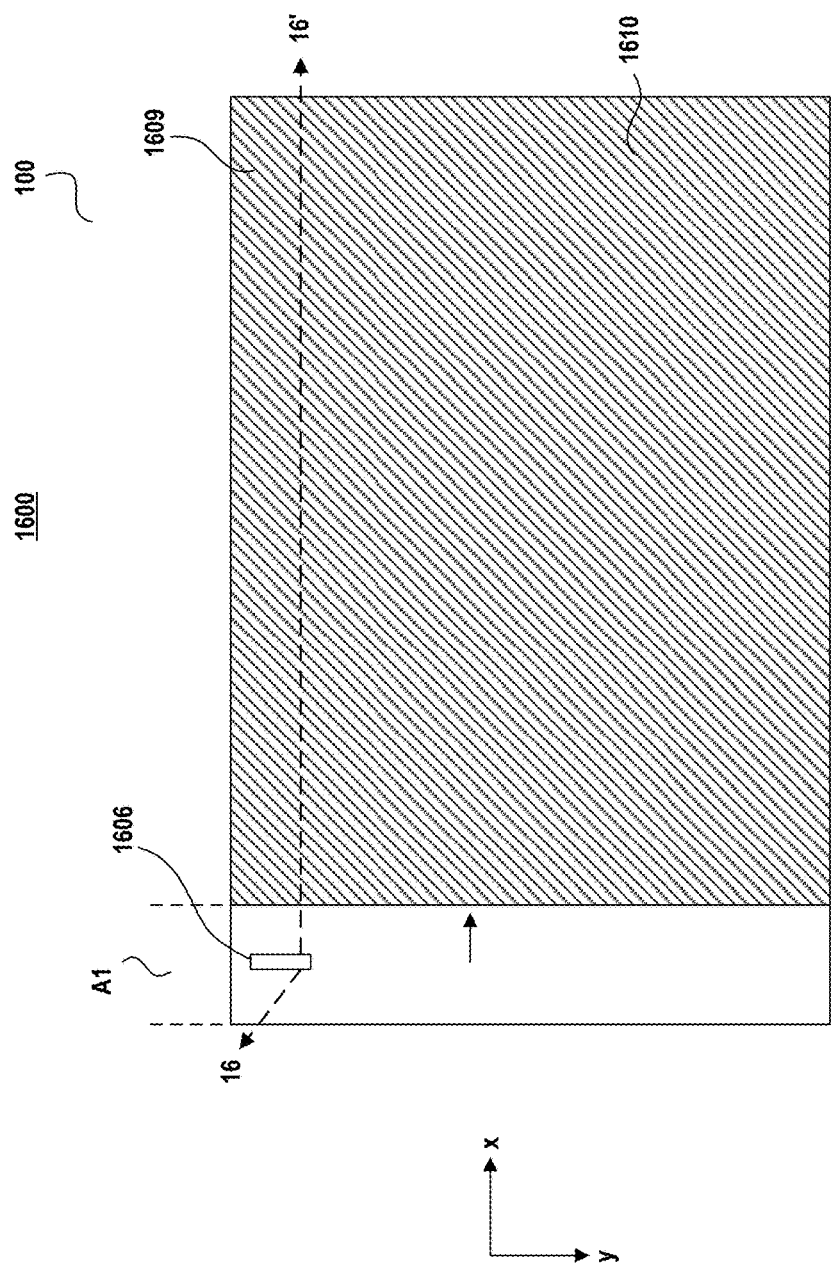

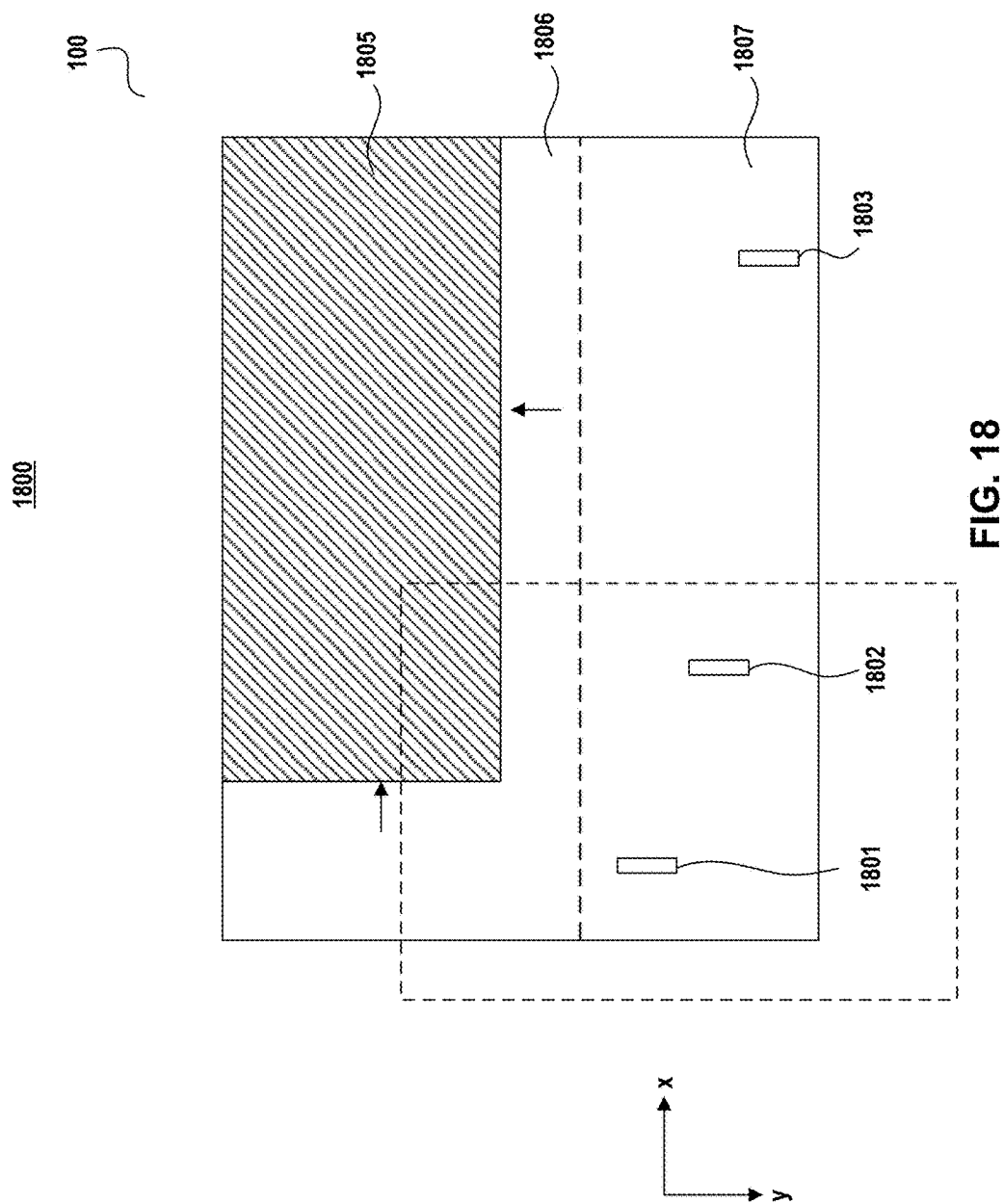

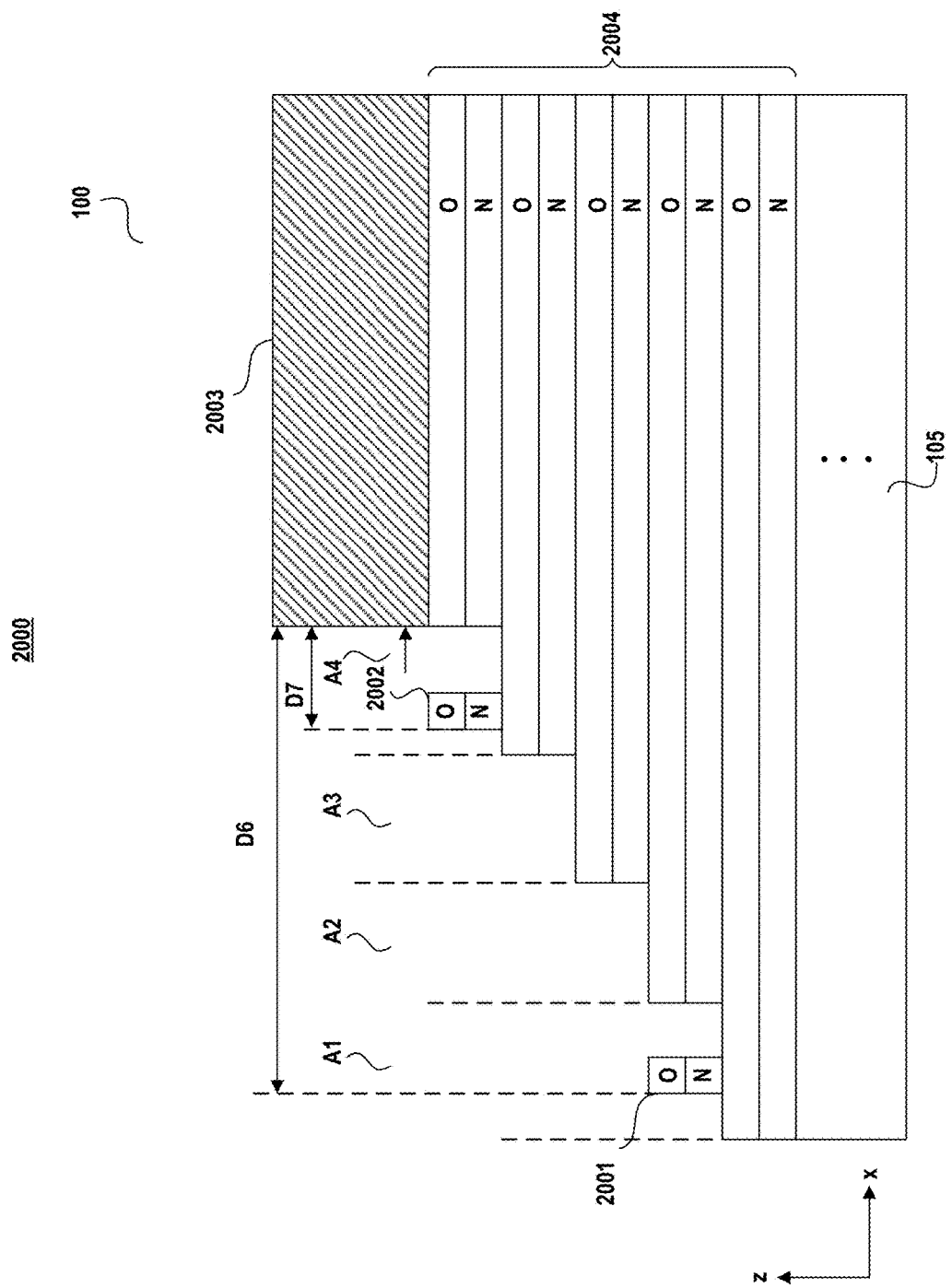

STAIRCASE ETCH CONTROL IN FORMING THREE-DIMENSIONAL MEMORY DEVICE

CROSS-REFERENCE TO RELATED APPLICATIONS

This application claims priority to Chinese Patent Application No. 201710134787.4 filed on Mar. 8, 2017 and PCT Patent Application No. PCT/CN2018/077931 filed on Mar. 2, 2018, the entire content of which is incorporated herein by reference.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

BRIEF SUMMARY

Embodiments of 3D memory architectures and fabrication methods thereof are disclosed herein.

According to some embodiments of the present disclosure, a method for controlling a photoresist (PR) trimming rate in a PR trimming process, includes forming a PR layer over a first region of a substrate, forming a first trimming mark in a second region neighboring the first region, and trimming the PR layer. The method can also include measuring a first distance between the first trimming mark and the PR layer along a first direction parallel to a top surface of the substrate to determine an actual PR trimming rate of the PR trimming process along the first direction, comparing the actual PR trimming rate along the first direction with an estimated PR trimming rate along the first direction to determine a first difference between the actual PR trimming rate along the first direction and the estimated PR trimming rate along the first direction, and adjusting PR trimming parameters of the PR trimming process based on the first difference.

In some embodiments, the first trimming mark is formed by patterning the second region of the substrate.

In some embodiments, the first trimming mark includes one or more of a protruding structure and a recessed structure.

In some embodiments, the first trimming mark includes a rectangular shape, a circular shape, an irregular shape, a squared shape, and a combination thereof.

In some embodiments, the method further includes forming a second trimming mark over the second region and measuring a second distance between the second trimming mark and the PR layer along a second direction parallel to the top surface of the substrate to determine an actual PR trimming rate of the PR trimming process along the second direction. The actual PR trimming rate along the second direction is compared with an estimated PR trimming rate along the second direction to determine a second difference between the actual PR trimming rate along the second direction and the estimated PR trimming rate along the second direction. The PR trimming parameters of the PR trimming process are adjusted based on the second difference.

In some embodiments, the first direction and the second direction are different from one another.

In some embodiments, the second trimming mark and the first trimming mark are formed by a same patterning process.

In some embodiments, the second trimming mark and the first trimming mark have same or different shapes.

In some embodiments, the second region includes one or more of a planar surface and a 3D surface.

According to some embodiments of the present disclosure, a method for controlling a PR trimming rate in a PR trimming process, includes providing an estimated PR trimming rate, determining an actual PR trimming rate, and comparing the actual PR trimming rate and the estimated PR trimming rate to determine a difference between the actual PR trimming rate and the estimated PR trimming rate. In response to the difference being greater than the threshold, one or more PR trimming parameters for the PR trimming process can be adjusted. Accordingly, the actual PR trimming rate is the same as the estimated PR trimming rate.

In some embodiments, an adjustment of the one or more PR trimming parameters is proportional to a value of the difference.

According to some embodiments of the present disclosure, a method for controlling a PR trimming rate in a PR trimming process for forming a three-dimensional memory structure includes forming a dielectric stack over a substrate, the dielectric stack including a plurality of sacrificial material layers and a plurality of insulating material layers arranged alternatingly, trimming a PR layer over the dielectric stack, etching the dielectric stack, using the trimmed PR layer as an etch mask, to form a plurality of staircases, and forming a first trimming mark for the trimmed PR layer. The method also includes measuring a first distance between the first trimming mark and the trimmed PR layer along a first direction parallel to the top surface of the substrate to determine an actual PR trimming rate of the PR trimming process along the first direction, comparing the actual PR trimming rate along the first direction with an estimated PR trimming rate along the first direction to determine a first difference between the actual PR trimming rate along the first direction and the estimated PR trimming rate along the first direction; and adjusting one or more PR trimming parameters of the PR trimming process based on the first difference.

In some embodiments, forming a first trimming mark includes forming the first trimming mark over one or more of the dielectric stack and a region neighboring the dielectric stack.

In some embodiments, forming the first trimming mark includes patterning the one or more of the dielectric stack and the region neighboring the dielectric stack to form an initial trimming mark, and etching, repetitively, the dielectric stack using the initial trimming mark as an etch mask to form the first trimming mark.

In some embodiments, the first trimming mark has one or more of a protruding structure and a recessed structure.

In some embodiments, the protruding structure includes a height of a thickness of a staircase and the recessed structure includes a depth of the thickness of the staircase.

In some embodiments, the method further includes forming a second trimming mark for the trimmed PR layer over the dielectric stack, measuring a second distance between the second trimming mark and the trimmed PR layer along a second direction parallel to the top surface of the substrate to determine an actual PR trimming rate of the PR trimming process along the second direction, and comparing the actual PR trimming rate along the second direction with an estimated PR trimming rate along the second direction to determine a second difference between the actual PR trimming rate along the second direction and the estimated PR trimming rate along the second direction. In some embodiments, the method also includes adjusting the one or more PR trimming parameters of the PR trimming process based on the second difference.

In some embodiments, the second trimming mark and the first trimming mark are formed by a same patterning process.

In some embodiments, the second trimming mark and the first trimming mark have a same shape.

In some embodiments, the second direction is same as the first direction.

In some embodiments, the method further includes forming a third trimming mark for the trimmed PR layer over the region neighboring the dielectric stack, measuring a third distance between the third trimming mark and the PR layer along a third direction parallel to the top surface of the substrate to determine an actual PR trimming rate of the PR trimming process along the third direction, comparing the actual PR trimming rate along the third direction with an estimated PR trimming rate along the third direction to determine a third difference between the actual PR trimming rate along the third direction and the estimated PR trimming rate along the third direction, and adjusting the PR trimming parameter of the PR trimming process based on the third difference.

In some embodiments, the region neighboring the dielectric stack includes one or more of a planar surface and a three-dimensional surface.

In some embodiments, the third direction is different from the first direction.

In some embodiments, the method further includes controlling the trimming of the PR layer based on the adjusted one or more PR trimming parameters.

In some embodiments, the method further includes controlling a trimming of an other PR layer based on the adjusted one or more PR trimming parameters, and etching an other dielectric stack, using the other trimmed PR layer as an etch mask, to form an other plurality of staircases.

According to some embodiments of the present disclosure, a 3D memory structure includes a substrate and a staircase structure disposed over the substrate, the staircase structure including a plurality of conductor layers and a plurality of insulating layers arranged alternatingly. In some embodiments, a conductor layer and an insulating layer adjacent to the conductor layer form a staircase, and a first trimming mark over one or more of the staircase structure and a region neighboring the staircase structure over the substrate. In some embodiments, the first trimming mark has one or more of a protruding structure and a recessed structure.

In some embodiments, the first trimming mark has a same thickness as the staircase.

In some embodiments, the first trimming mark is over one staircase of the staircase structure.

In some embodiments, the first trimming mark includes a rectangular shape, a circular shape, an irregular shape, a squared shape, or a combination thereof.

In some embodiments, the structure further includes a second trimming mark disposed over another staircase of the staircase structure, the second trimming mark having a same thickness and same shape as the first trimming mark.

In some embodiments, the staircases of the staircase structure are aligned along a first direction and the first trimming mark and the second trimming mark are aligned along a direction that has an angle to the first direction.

According to some embodiments of the present disclosure, a method for controlling a PR trimming rate in a PR trimming process for forming a three-dimensional memory structure includes forming a dielectric stack over a substrate, the dielectric stack including a plurality of sacrificial material layers and a plurality of insulating material layers arranged alternatingly. A PR layer can be disposed over the dielectric stack. The method also includes forming a first trimming mark for the PR layer, measuring a first distance between the first trimming mark and the PR layer along a first direction parallel to the top surface of the substrate, trimming the PR layer along the first direction, and etching the dielectric stack, using the trimmed PR layer as an etch mask, to form a staircase. The method further includes forming a second trimming mark, using the first trimming mark as an etch mask, for the trimmed PR layer, measuring a second distance between the second trimming mark and the trimmed PR layer along the first direction, comparing the first distance with the second distance to determine a difference between an actual PR trimming rate and an estimated PR trimming rate along the first direction, and adjusting one or more PR trimming parameters of the PR trimming process based on the difference.

In some embodiments, forming a first trimming mark includes forming the first trimming mark over one or more of the dielectric stack and a region neighboring the dielectric stack.

In some embodiments, forming the first trimming mark includes patterning the one or more of the dielectric stack and the region neighboring the dielectric stack to form an initial trimming mark, and etching, repetitively, the dielectric stack using the initial trimming mark as an etch mask to form the first trimming mark.

In some embodiments, the first trimming mark has one or more of a protruding structure and a recessed structure.

In some embodiments, the protruding structure includes a height of a thickness of a staircase and the recessed structure includes a depth of the thickness of the staircase.

In some embodiments, the region over the dielectric stack and the region neighboring the dielectric stack include one or more of a planar surface and a three-dimensional surface.

In some embodiments, the method further includes controlling the trimming of the trimmed PR layer based on the adjusted one or more PR trimming parameters, and etching the dielectric stack using the trimmed PR layer as an etch mask to form an other staircase.

In some embodiments, the method further includes controlling a trimming of an other PR layer based on the adjusted one or more PR trimming parameters, and etching an other dielectric stack using the other trimmed PR layer as an etch mask to form an other staircase.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 2B illustrates a cross-sectional view of the 3D memory structure in FIG. 2A.

FIG. 3B illustrates a cross-sectional view of the 3D memory structure in FIG. 3A.

FIG. 4B illustrates a cross-sectional view of the 3D memory structure in FIG. 4A.

FIG. 5A illustrates a top view of an exemplary 3D memory structure, according to some embodiments.

FIG. 7B illustrates a cross-sectional view of the 3D memory structure in FIG. 7A.

FIG. 8B illustrates a cross-sectional view of the 3D memory structure in FIG. 8A.

FIG. 16A illustrates a top view of an exemplary 3D memory structure, according to some embodiments.

FIG. 18 illustrates a top view of an exemplary 3D memory structure, according to some embodiments.

FIG. 20 illustrates a cross-sectional view of an exemplary 3D memory structure, according to some embodiments.

Figure 1A:
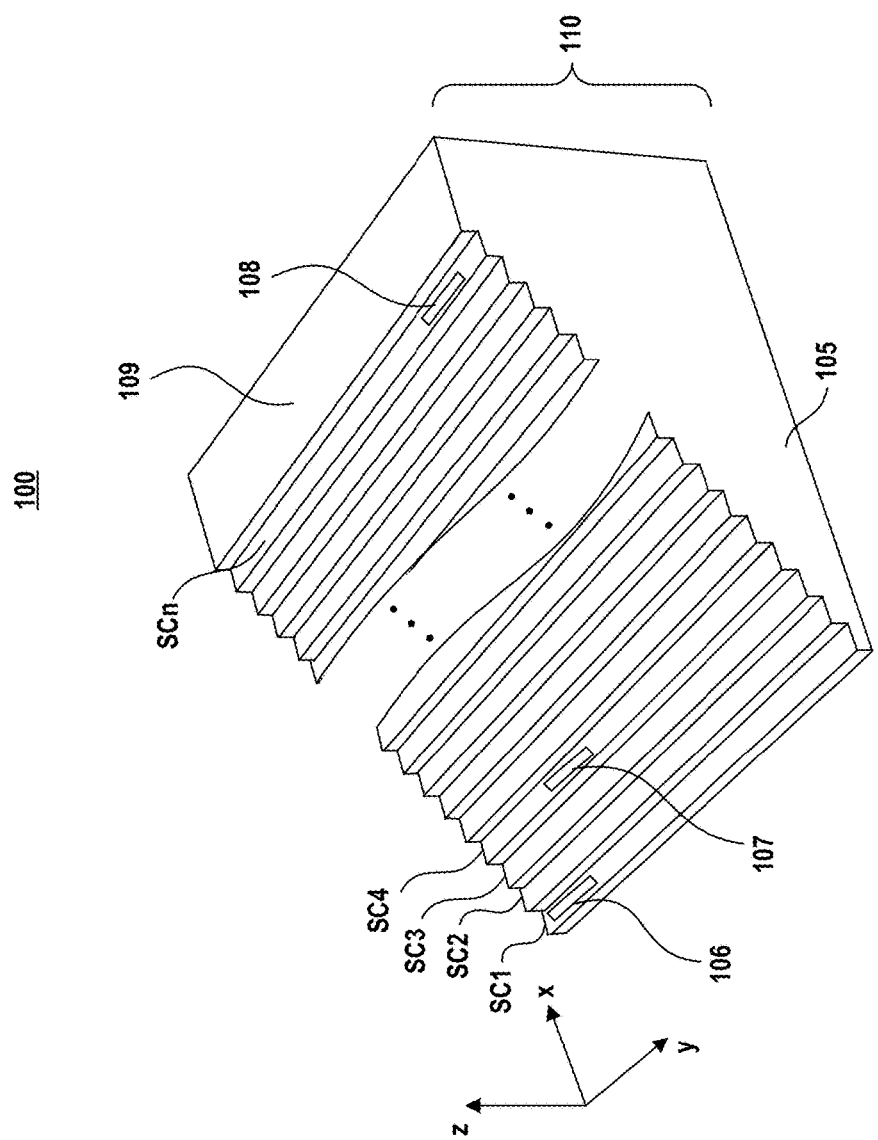
FIG. 1A illustrates an exemplary 3D memory structure, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In 3D memory device architectures, memory cells for storing data are vertically stacked to form a stacked storage structure. 3D memory devices usually include a staircase structure formed on one or more sides of the stacked storage structure for purposes such as word line fan-out. As the demand for higher storage capacity continues to increase, the number of vertical levels of the stacked storage structure also increases. Accordingly, a thicker photoresists (PR) layer is needed to etch the staircase structure with increased levels. However, the increase of thickness of the PR layer can make the etch control of the staircase structure more challenging.

In the present disclosure, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, term "staircase" and term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

In some embodiments, a staircase structure can be formed from a dielectric stack layer (e.g., material layer), which includes a plurality of alternatingly arranged dielectric pairs (e.g., insulating material layer/sacrificial material layer pair) by repetitively etching the dielectric pairs using a PR layer formed over the dielectric stack layer. The insulating material layer and the underlying sacrificial material layer in one dielectric pair can have nominally the same height over the substrate so that one pair can form one step, in some embodiments. During the formation of the staircase structure, the PR layer is trimmed (e.g., etched incrementally and inwardly from the boundary of the dielectric stack layer, often from all directions) and used as the etch mask for etching the exposed portion of the dielectric stack. The amount of trimmed PR can be directly relevant (e.g., determinant) to the dimensions of the staircases. The trimming of the PR layer can be obtained using a suitable etch, e.g., an isotropic dry etch or a wet etch. One or more PR layers can be formed and trimmed consecutively for the formation of the staircase structure. Each dielectric pair can be etched, after the trimming of the PR layer, using suitable etchants to remove a portion of both the insulating material layer and the underlying sacrificial material layer. The etched insulating material layer and the sacrificial material layers are referred to as insulating layers and sacrificial layers. After the formation of the staircase structure, the PR layer can be removed and the sacrificial layers can be replaced with metal/conductor layers (e.g., tungsten). The metal/conductor layers can form the gate electrodes (or word lines) of the 3D memory structure.

In the present disclosure, the terms "the actual PR trimming rate" and "the measured PR trimming rate" are interchangeable, both referring to the PR trimming rate extracted from measurement under a specific reaction condition; the term "the PR trimming parameters" refers to the system parameters (e.g., pressure, power level, and gas flow rates) that can affect the actual PR trimming rate; and the term "the estimated/calculated PR trimming rate" refers to the PR trimming rate (e.g., ideal PR trimming rate) determined by design and/or calculation prior to the fabrication process.

In the present disclosure, the term "SC" refers to a staircase, and the term "staircase-forming area" or the like refers to the horizontal area/region for forming the staircase. The projected area of a stair-case forming area on the top surface of the substrate stays unchanged during the fabrication. For example, a "first staircase (SC1)-forming area" refers to the horizontal area for forming the first staircase (e.g., the lowest staircase along the vertical direction) after the fabrication is completed. Accordingly, a trimming mark formed in SC1-forming area at the beginning of the fabrication process can undergo a plurality of repetitive etches, and the pattern and horizontal location of the trimming mark can be preserved or stay nominally unchanged when the etching is completed. A trimming mark can then be formed over the first staircase after the fabrication/etch is completed. The trimming mark formed over the first staircase can have the same pattern and horizontal location of the trimming mark formed at the beginning of the fabrication process. In the figures of the present disclosure, A1, . . . , An represent SC1-forming area, . . . , and SCn-forming area, respectively. Accordingly, SC1, . . . , SCn can be formed in A1, . . . , An, respectively.

The present disclosure provides a staircase structure in a 3D memory device, methods for forming the structure, and control methods related to the structure. The disclosed staircase structure includes a plurality of trimming marks distributed over and/or neighboring the structure. The trimming marks can be formed before and/or during the formation of the staircase structure. The trimming marks can be used to control and/adjust the trimming/etch rate of the photoresist (PR) layer before and/or during the formation of the staircase structure so that the formation of the staircases/steps of the staircase structure can be more precisely controlled. For example, the trimming marks can be used to determine the actual PR trimming rate in the formation of the current batch (also known as "lot") of staircase structures, and the determined/current PR trimming rate can be used to adjust or determine the actual PR trimming rate in the formation of the next batch of staircase structures. In another example, the current PR trimming rate can be used to determine and/or adjust the PR trimming parameters in the subsequent PR etching/trimming operations of the same batch of staircase structures. Using the methods and structures disclosed herein, the PR layer for forming the staircases of the staircase structure can be trimmed at a desired (e.g., more uniform or more controllable) rate, such that the etching process of the staircases of the staircase structure can be easier to monitor and control. Thus, the formation of the staircase structure (e.g., the steps of the staircase structure) is less susceptible to the increase of staircase/pair numbers, and the staircases can have desired lengths (e.g., lengths close to designed lengths).

Figure 1B:
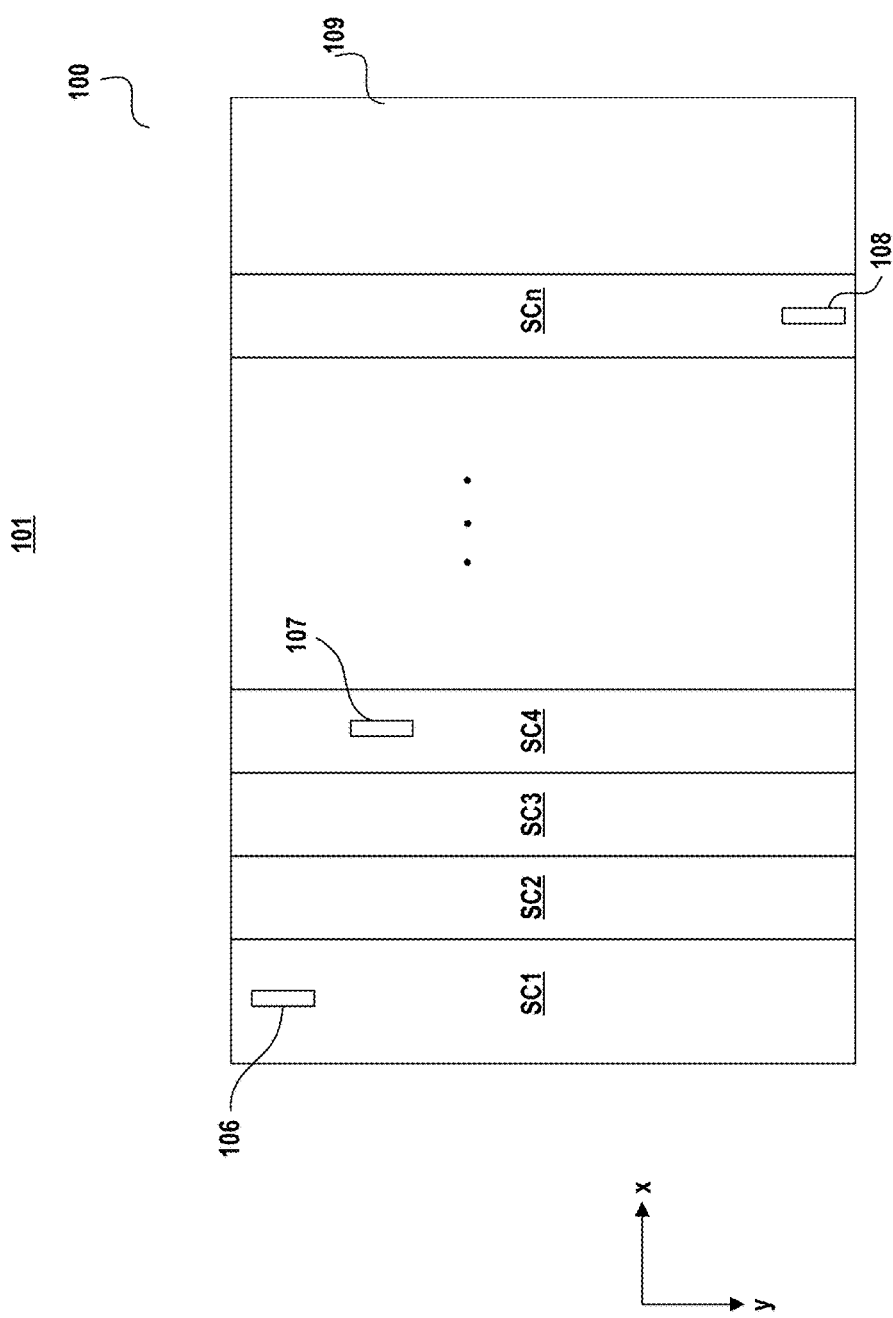
FIG. 1B illustrates a top view of the 3D memory structure in FIG. 1A.

FIG. 1A illustrates a staircase structure 100 in a 3D memory device, and FIG. 1B illustrates a top view 101 of staircase structure 100 along the vertical direction (e.g., the z-axis), according to some embodiments. In some embodiments, staircase structure 100 is a portion of a patterned dielectric stack of the 3D memory device. For illustrative purposes, each staircase is represented by "SC." For example, the first staircase is represented by "SC1," and so on. As shown in FIG. 1A, staircase structure 100 includes a plurality of staircases/steps, each staircase containing a dielectric pair. In some embodiments, a dielectric pair includes an insulating layer and an underlying sacrificial layer. The insulating layer and the sacrificial layer can each include a suitable material. For example, the sacrificial layer can include silicon nitride, and the insulating layer can include silicon oxide. For illustrative purposes, in the present disclosure, the sacrificial layer is represented by "N" and the insulating layer is represented by "O." As shown in FIGS. 1A and 1B, staircase structure 100 includes a plurality of staircases (e.g., SC1, SC2, . . . , SCn) arranged along the z-axis. In some embodiments, each staircase has a different length along the x-axis and the length decreases upwardly along the z-axis. Staircase structure 100 can be formed over a substrate 105, which provides the fabrication base for the subsequent processing of staircase structure 100. The plurality of alternatingly arranged insulating layers and sacrificial layers are represented by element 110. Staircase structure 100 can include a top surface 109. Top surface 109 can be the top surface of an insulating material layer and can provide the fabrication base for other structures (e.g., bit lines) formed over staircase structure 100 in subsequent fabrication operations. For illustrative purposes, other structures over staircase structure 100 are omitted from the present disclosure.

In some embodiments, substrate 105 includes any suitable material for forming the 3D memory structure. For example, substrate 105 can include silicon, silicon germanium, silicon carbide, silicon on insulator (SOI), germanium on insulator (GOI), glass, gallium nitride, gallium arsenide, and/or other suitable III-V compounds.

In some embodiments, staircase structure 100 includes an alternating stack of insulating layers "O" and sacrificial layers "N" arranged vertically (along the z-axis) over substrate 105. The thickness of the top insulating layer "O" can be the same as or different from the thickness of other insulating layers "O." In some embodiments, sacrificial layers N are removed subsequently for depositing gate metal material (e.g., a conductor) for forming word lines of the 3D memory device. In some embodiments, sacrificial layers N include any suitable material different from insulating layers O. For example, sacrificial layers N can include poly-crystalline silicon, silicon nitride, poly-crystalline germanium, and/or poly-crystalline germanium-silicon. In some embodiments, sacrificial layers N include silicon nitride. Insulating layers O can include any suitable insulating materials, e.g., silicon oxide. Staircase structure 100 can be formed by alternatingly depositing sacrificial material layers and insulating material layers over substrate 105 and subsequently etching each dielectric pair to form staircases along the z-axis. For example, a sacrificial material layer can be deposited over substrate 105, and an insulating material layer can be deposited on the sacrificial material layer, and so on and so forth. The deposition of sacrificial material layers and insulating material layers can include any suitable deposition methods such as chemical vapor deposition (CVD), physical vapor deposition (PVD), plasma-enhanced CVD (PECVD), sputtering, metal-organic chemical vapor deposition (MOCVD), and/or atomic layer deposition (ALD). In some embodiments, the sacrificial material layers and the insulating material layers are each formed by CVD.

Referring to FIGS. 1A and 1B, staircase structure 100 can include a plurality of trimming marks (e.g., elements 106, 107, and 108) distributed over the top surfaces of the staircases. For illustrative purposes, trimming marks formed in regions neighboring staircase structure 100 are not shown in FIGS. 1A and 1B. Staircase structure 100 can include any suitable number of staircases. For example, staircase structure 100 can include 64 staircases. For illustrative purposes, only staircases at the bottom and the top of staircase structure 100 (e.g., SC1-4 and SCn) and the trimming marks over these staircases (e.g., 106-108) are shown. The trimming marks can be arranged in any suitable patterns, such as aligned along the x-axis, aligned at an angle to the x-axis, etc. The trimming marks can be formed on each staircase (e.g., the number of the trimming marks is equal to the number of staircases), or not at every staircase (as the example shown in FIG. 1A). The distance (e.g., vertical or horizontal) between two adjacent (e.g., closest) trimming marks can be uniform or can vary. The trimming marks can be distributed from the bottom to the top of staircase structure 100 (as the example shown in FIG. 1A) or can be distributed at any portion of staircase structure 100. The trimming marks can have any suitable shapes such as squared shapes, rectangular shapes, "L" shapes, irregular shapes, and/or circular shapes, depending on the measurement requirements. A trimming mark can be formed at any location of a staircase. For example, a trimming mark can be formed on an edge or between the edges of a staircase. The trimming marks can include protruding structures, recessed structures, and/or a combination of both. In some embodiments, the trimming marks are formed from the same material of a dielectric pair, e.g., including a layer of insulating material and a layer of sacrificial material. The plurality of trimming marks can include trimming marks of the same shape or of different shapes. For example, an "L-shaped" trimming mark can be arranged at a corner (not shown) of staircase structure 100 and rectangular trimming marks can be arranged at other locations of staircase structure 100. The arrangement, shape, number, and pattern of the trimming marks over a staircase structure should be determined based on the actual measurement requirement and should not be limited by the embodiments of the present disclosure.

The trimming marks can be formed before or during the formation of staircase structure 100. For example, the trimming marks can be formed over the dielectric stack before the trimming of the PR layer for etching the dielectric pairs. In another example, the trimming marks can be formed during the etching of the staircases, e.g., before forming a subsequent PR layer for the etching of the subsequent dielectric pairs or between the etching of two adjacent dielectric pairs. Because the location and the height/depth (along the z-axis) of a trimming mark can maintain nominally constant during the formation of staircase structure 100, the trimming marks can be used as references to determine the trimming/etch rate of the PR layer (or the etch rate of the staircases). For example, the horizontal distance (e.g., along the x-axis) between a trimming mark and the PR layer can be measured and recorded to determine the actual PR trimming rate. The measured PR trimming rate can be compared with a predetermined PR trimming rate (or calculated/estimated trimming rate, based on design) to determine the deviation between the actual PR trimming rate and the estimated PR trimming rate. The actual PR trimming rate for the subsequent etches of next batch of staircase structures and/or next staircases of the current batches can thus be adjusted based on the difference. The etching of the staircases is thus more controllable and the staircases can be etched to desired lengths accordingly.

For example, referring to FIG. 1B, staircase structure 100 includes a plurality of trimming marks distributed over a plurality of staircases. In some embodiments, the trimming marks can have the same shape and can be aligned along a line that has an angle to the x-axis. In some embodiments, the shape can be rectangular. In some embodiments, each two adjacent trimming marks (e.g., 106 and 107 formed over A1 and A4, respectively) are separated by two staircases (e.g., formed over A2 and A3). In some embodiments, the trimming marks are formed between the edges, e.g., nominally at the middle position along the x-axis, of the corresponding staircases. In some embodiments, the trimming marks are formed from a dielectric pair (O, N), and the height/depth of a trimming mark is nominally equal to the thickness of the dielectric pair. FIGS. 2A-17B illustrate different formation methods of trimming marks at various stages of fabrication processes.

Figure 2A:
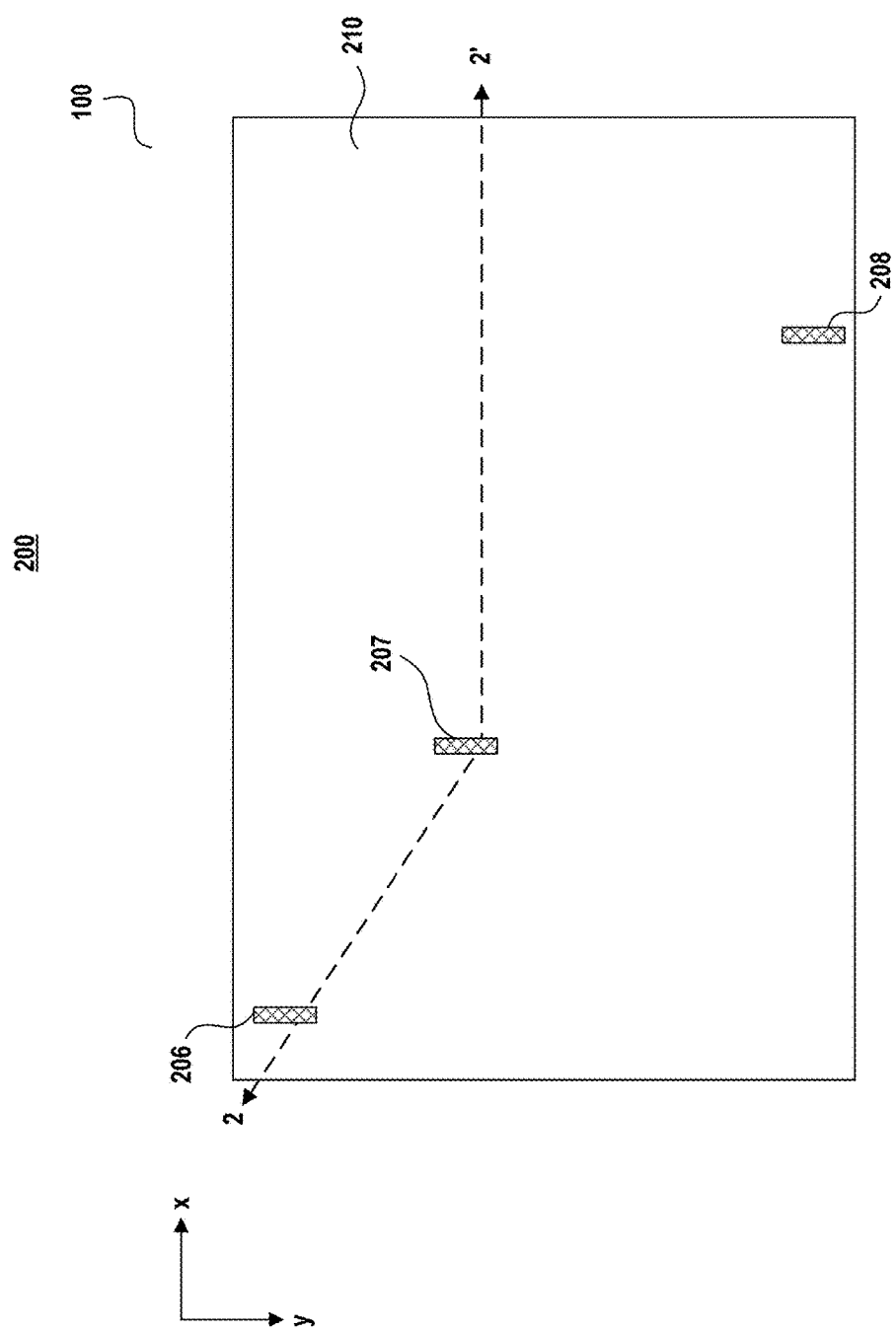
FIG. 2A illustrates a top view of an exemplary 3D memory structure, according to some embodiments.

FIGS. 2A, 2B, 3A, 3B, 4A, 4B, 5A, 5B, 6A, and 6B illustrate an exemplary formation method of trimming marks in staircase structure 100, according to some embodiments. Using the fabrication process shown in FIGS. 2A-6B, trimming marks with a protruding structure can be formed. FIG. 2A illustrates a top view 200 of staircase structure 100 at the beginning of an exemplary fabrication process. FIG. 2B illustrates a cross-sectional view of staircase structure 100 along 2-2' direction.

At the beginning of the fabrication process, a substrate 105, including a dielectric stack 210 formed over substrate 105, can be provided. Substrate 105 can include any suitable semiconductor material, and dielectric stack 210 can include a plurality of sacrificial material layers (N) and a plurality of insulating material layers (O) alternatingly arranged as a stack. The sacrificial material layers and the insulating material layers can include different materials. In some embodiments, substrate 105 includes silicon, sacrificial material layers N include silicon nitride, and insulating material layers O include silicon oxide. An insulating material layer O and the underlying sacrificial material layer N can form a dielectric pair. The stacked dielectric pairs can be etched subsequently using a PR layer to desired lengths, forming staircases or steps. The PR layer can be repetitively trimmed horizontally (along the x-y plane) and vertically (along the z-axis) for the repetitive etching of the dielectric pairs. In some embodiments, stack 210 includes 64 dielectric pairs, which can form up to 64 staircases. For ease of description, only the dielectric pairs associated with the description of the fabrication process are shown.

A PR layer can be formed and patterned over dielectric stack 210. In some embodiments, a positive photoresist is used and patterned to cover portions/locations of the trimming marks. As shown in FIGS. 2A and 2B, PR portions 206, 207, . . . , 208 can be formed over dielectric stack 210 and used as etch masks in a subsequent etching process so that the portions of the top dielectric pair of dielectric stack 210 exposed by the PR portions can be removed in a subsequent etching process.

Further, an etching process (e.g., a first etching process) can be performed to remove the portions of dielectric stack 210 exposed by the PR portions. Any suitable etchants (e.g., of wet etch and/or dry etch) can be used to sequentially remove the insulating material layer O and the sacrificial material layer N of the first/top dielectric pair. In some embodiments, two different etchants are used to respectively remove insulating material layer O and sacrificial material layer N. The etchant of sacrificial material layer N has a sufficient high etching selectivity over the material of insulating material layer O. Accordingly, insulating material layer O of the dielectric pair underlying the etched dielectric pair can function as an etch-stop layer so that only the top dielectric pair is patterned/etched. In some embodiments, these top material layers are etched using dry etch, the etchant for sacrificial material layers N includes fluorine ($CF_4$) based gases, and the etchant for insulating material layers O includes hexafluoroethane ($C_2F_6$) based gases. In some embodiments, one etchant (e.g., of timed a wet etch process) is used to remove both sacrificial material layer N and insulating material layer O, and the etchant includes phosphoric acid. In various embodiments, the methods and etchants to remove the top dielectric pair of dielectric stack 210 should not be limited by the embodiments of the present disclosure. In some embodiments, the PR portions can be removed after the formation of the trimming marks.

Figure 3A:
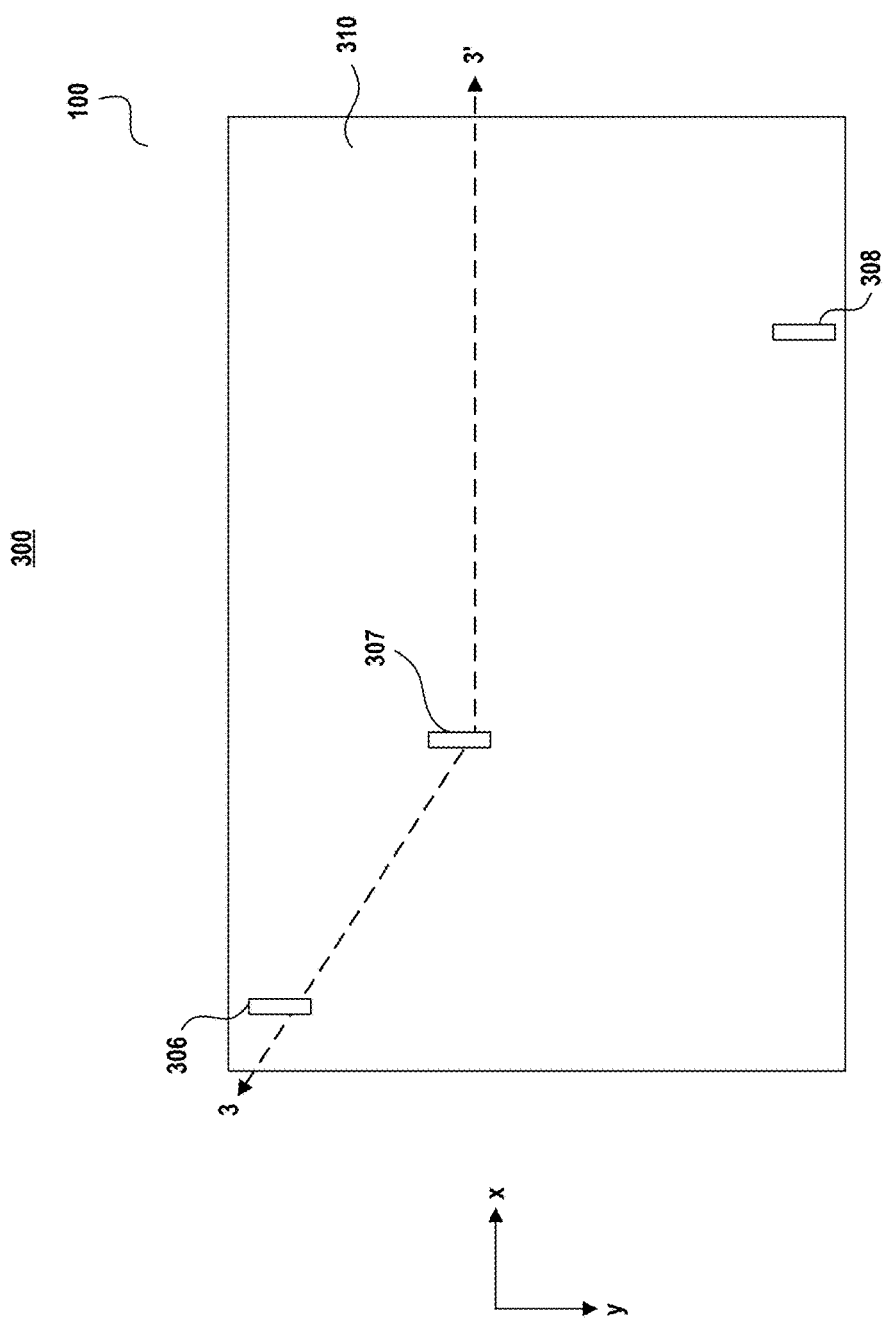
FIG. 3A illustrates a top view of an exemplary 3D memory structure, according to some embodiments.

FIG. 3A illustrates a top view 300 of staircase structure 100 after the removal of the PR portions and FIG. 3B illustrates a cross-sectional view of staircase structure 100 along direction 3-3'. As shown in FIGS. 3A and 3B, a plurality of trimming marks (e.g., initial trimming marks, each including a layer of insulating material layer O over a layer of sacrificial material layer N) 306, 307, ..., 308 can be formed at locations covered by the PR portions in FIGS. 2A and 2B. In some embodiments, dielectric stack 310 can represent dielectric stack 210 after portions of the top dielectric pair are removed and trimming marks are formed from the remaining portions of the top dielectric pair. As shown in FIG. 3B, the height of a trimming mark can be nominally equal to the thickness of the top dielectric pair. For example, each initial trimming mark (e.g., 306 or 307) can include a layer of insulating material and an underlying layer of sacrificial material.

Figure 4A:
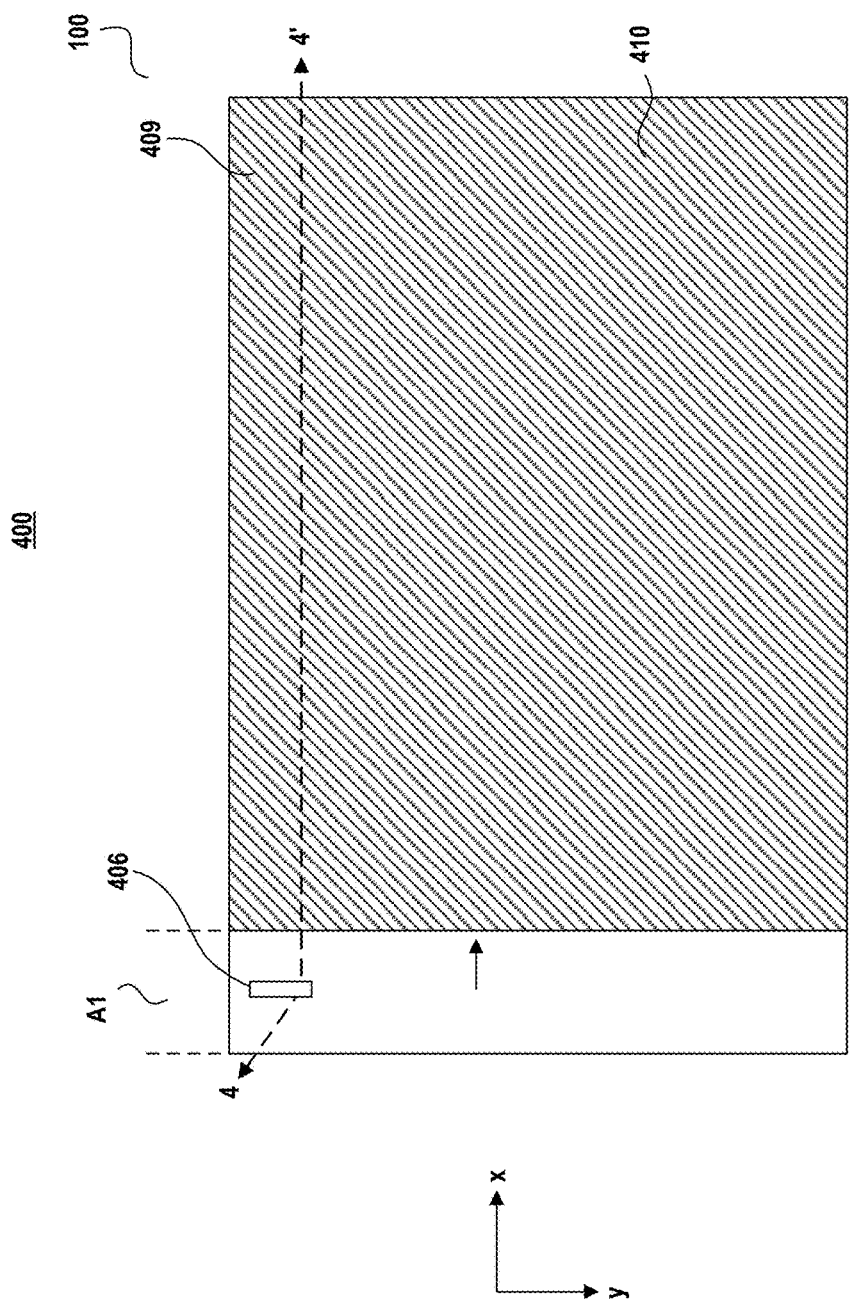
FIG. 4A illustrates a top view of an exemplary 3D memory structure, according to some embodiments.

Further, a first PR layer can be formed and patterned over dielectric stack 310 to expose the portion of dielectric stack 310 for forming the first staircase-forming area "SC1-forming area" or A1 and an etching process (e.g., a second etching process) can be performed to remove the exposed portion of the top dielectric pair of dielectric stack 310. FIG. 4A illustrates a top view 400 of staircase structure 100 after the etching process and FIG. 4B illustrates a cross-sectional view 401 of staircase structure 100 along 4-4' direction. In some embodiments, trimming mark 406 represents trimming mark 306 after the second etching process, and dielectric stack 410 represents dielectric stack 310 after the second etching process. The first PR layer, after patterned, is represented by element 409.

The second etching process can include any suitable etchant to sequentially remove the exposed top portion of dielectric stack 310. First PR layer 409 can expose A1, where initial trimming mark 306 is formed over. In some embodiments, the second etching process includes using the initial trimming mark 306 and first PR layer 409 as the etch mask to remove the exposed top dielectric pair (O, N). In some embodiments, the etchants of the material layers can be similar to or same as the first etching process described in FIGS. 2A and 2B. First PR layer 409 can expose A1 of the first dielectric pair of dielectric stack 310 and can be used as an etch mask for the removal of the exposed portion of the top dielectric pair. After the etch, referring to FIG. 4B, trimming mark 406 (e.g., including a layer of insulating material layer O over a layer of sacrificial material layer N) can be formed on the second dielectric pair of dielectric stack 410 and first PR layer 409 can be over the remaining portion of the top dielectric pair of dielectric stack 410. In the subsequent fabrication operations, first PR layer 409 can be trimmed to allow subsequent etches of underlying dielectric pairs (O, N). In the present disclosure, arrows (e.g., pointing to the x-axis) represent the trimming direction of a PR layer, e.g., being along the x-axis. In some embodiments, the trimming of a PR layer (e.g., first PR layer 409) can be obtained by using an isotropic dry etch.

First PR layer 409 can be trimmed vertically (e.g., along the z-axis) and horizontally (e.g., along the x-axis and the y-axis). In some embodiments, first PR layer 409 is further trimmed to expose the A2 over dielectric stack 410. An etching process (e.g., a third etching process) can be performed on the top dielectric pair of portions exposed by first PR layer 409 (e.g., A1 and A2). The third etching process can be the same as or similar to any one of the first etching process and the second etching process described in FIGS. 2A-4B. Similarly, first PR layer 409 can further be trimmed along the x-axis for exposing and etching A3 and A4.

Figure 5B:
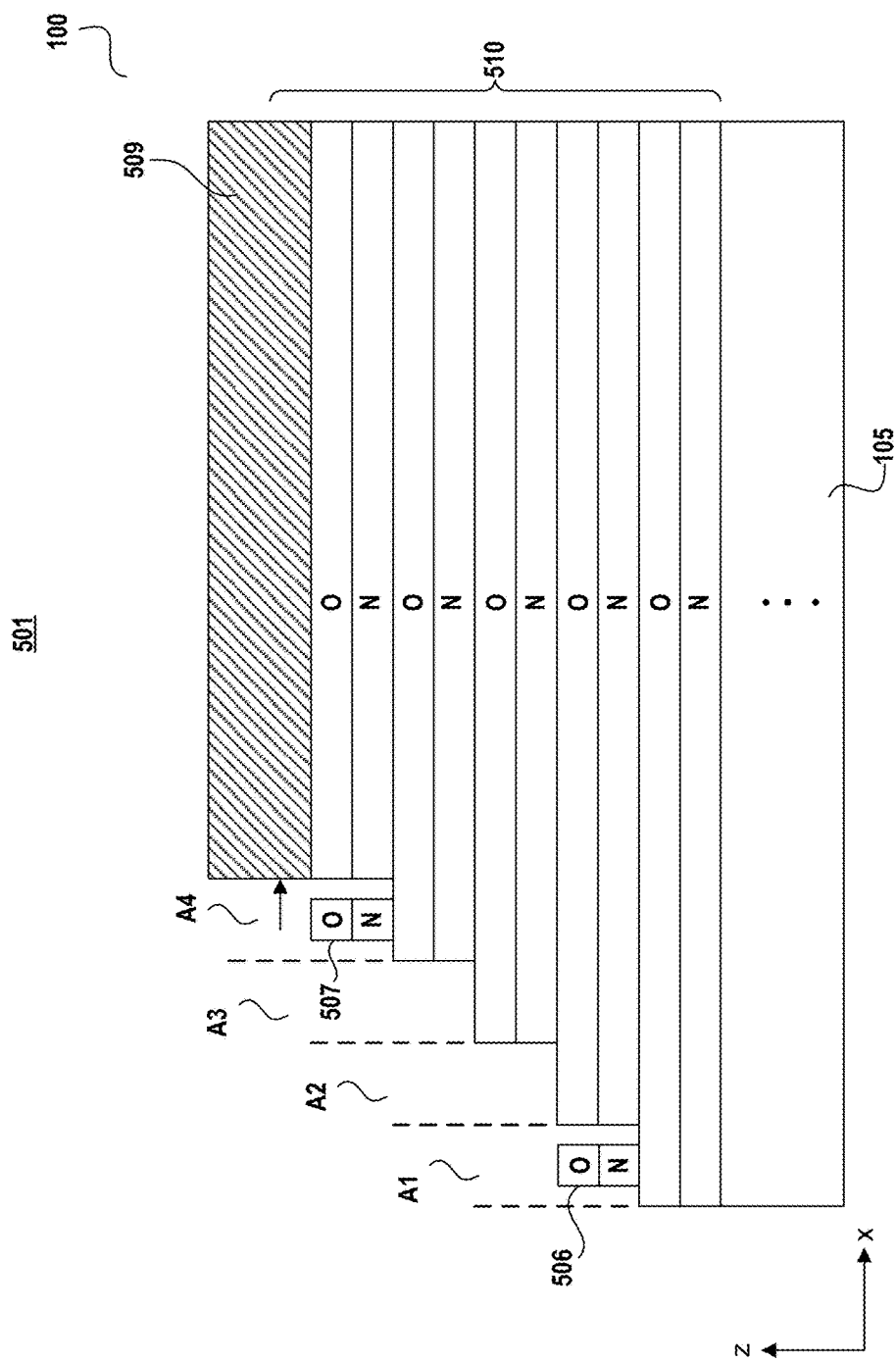
FIG. 5B illustrates a cross-sectional view of the 3D memory structure in FIG. 5A.

FIG. 5A illustrates a top view 500 of staircase structure 100 after A4 has been etched and FIG. 5B illustrates a cross-sectional view 501 of staircase structure 100 along 5-5' direction, according to some embodiments. Second PR layer 509 represents first PR layer 409 after the trimming and dielectric stack 510 represents dielectric stack 410 after the etching of A3 and A4. As shown in FIGS. 5A and 5B, trimming marks 506 and 507 can be formed. Trimming marks 506 and 507 can be separated by two staircases (e.g., exposed portions of dielectric stack 510 for forming A2 and A3) in between along the x-z plane. Second PR layer 509 can further be trimmed along the x-axis for the formation of the rest of the staircases.

Figure 6A:
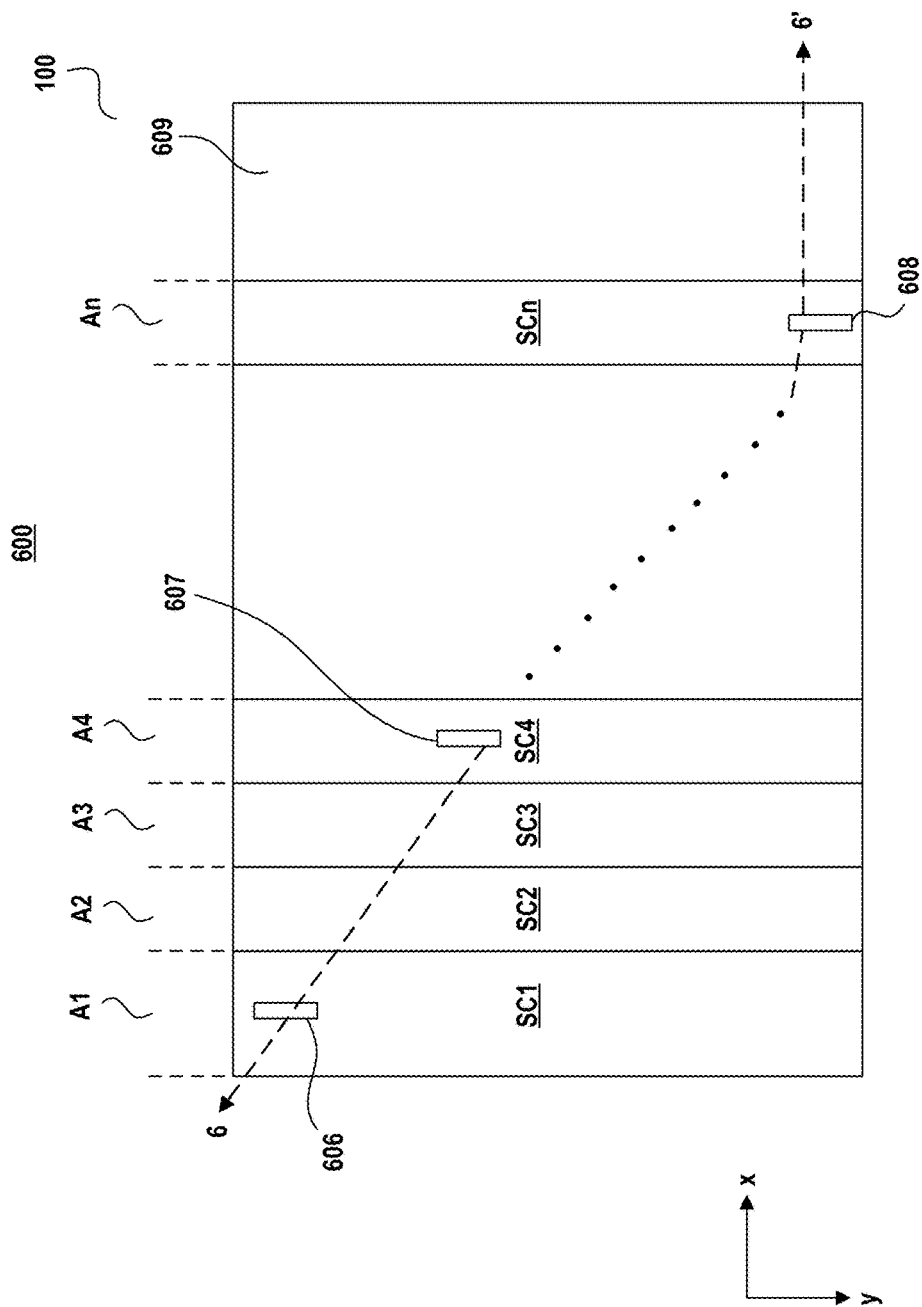
FIG. 6A illustrates a top view of an exemplary 3D memory structure, according to some embodiments.
Figure 6B:
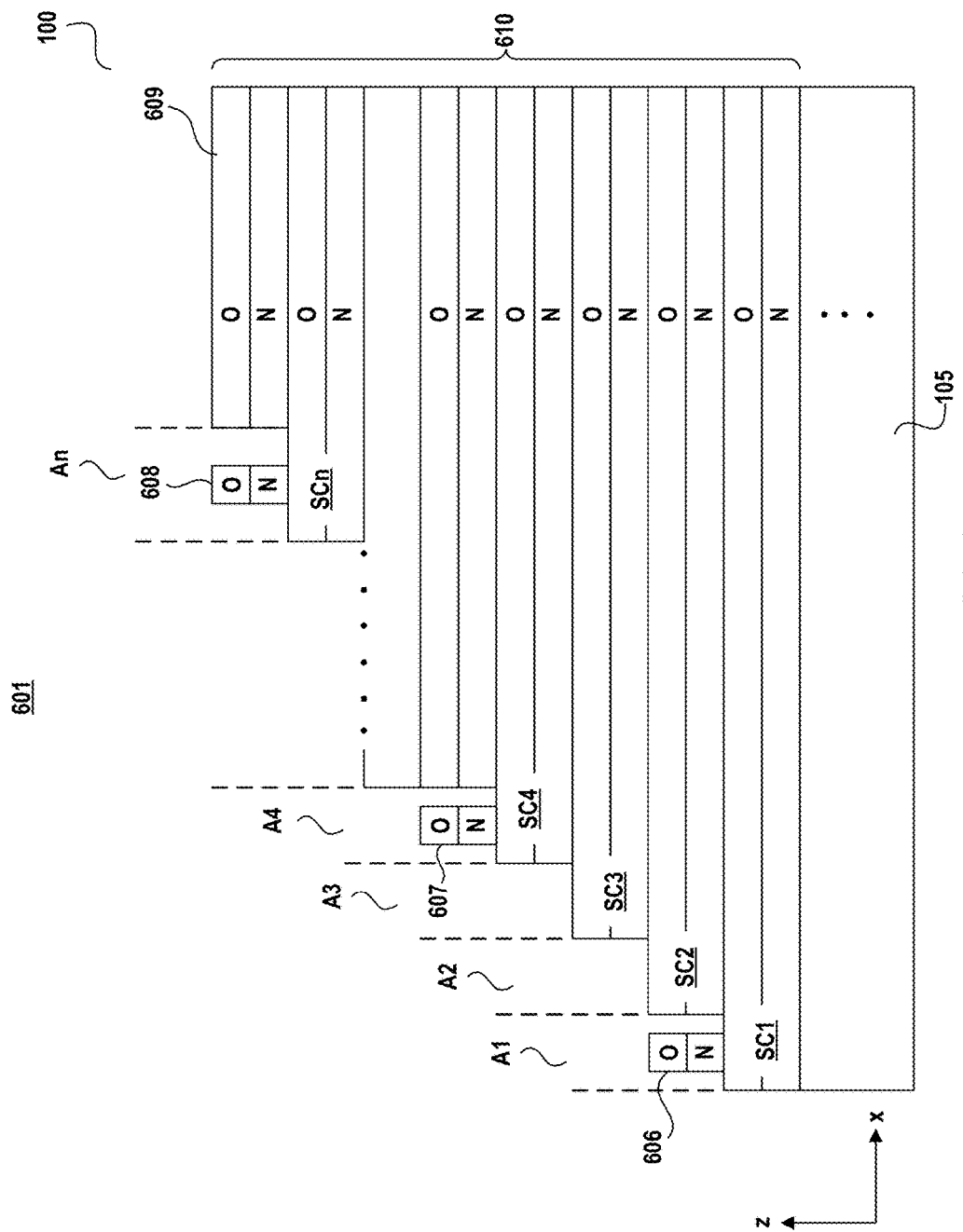
FIG. 6B illustrates a cross-sectional view of the 3D memory structure in FIG. 6A.

FIG. 6A illustrates a top view 600 of staircase structure 100 after the formation of all the staircases and FIG. 6B illustrates a cross-sectional view 601 of staircase structure 100 along 6-6' direction, according to some embodiments. The PR layer(s) used for the formation of the staircases can be removed using a suitable wet etch and/or dry etch and top surface 609 of dielectric stack 610 can be exposed to provide a fabrication base for subsequent processing operations. Dielectric stack 610 represents dielectric stack 510 after the etches for the formation of the staircases SC1, SC2, ..., SCn. As shown in FIGS. 6A and 6B, trimming marks 606, 607, ..., 608 can be formed over the staircases of staircase structure 100. The actual PR trimming rate can be determined based on the locations of the trimming marks 606-608, 506-508, 406-408, and/or 306-308, during or after the formation of staircase structure 100. The determined actual PR trimming rate can be further used to control actual the PR trimming rate for the same batch of staircase structures or the next batch of staircase structures. Details can be described in the following paragraphs.

FIGS. 7A, 7B, 8A, 8B, 9A, 9B, 10A, and 10B illustrate another exemplary method for forming staircase structure 100, according to some embodiments. Different from the method shown in FIGS. 2A-6B, according to the method illustrated in FIGS. 7A-10B, the trimming marks can be formed separately/individually. Each trimming mark can be separately formed at a desired location during the formation of the staircase structure (e.g., with the formation of the staircases).

Figure 7A:
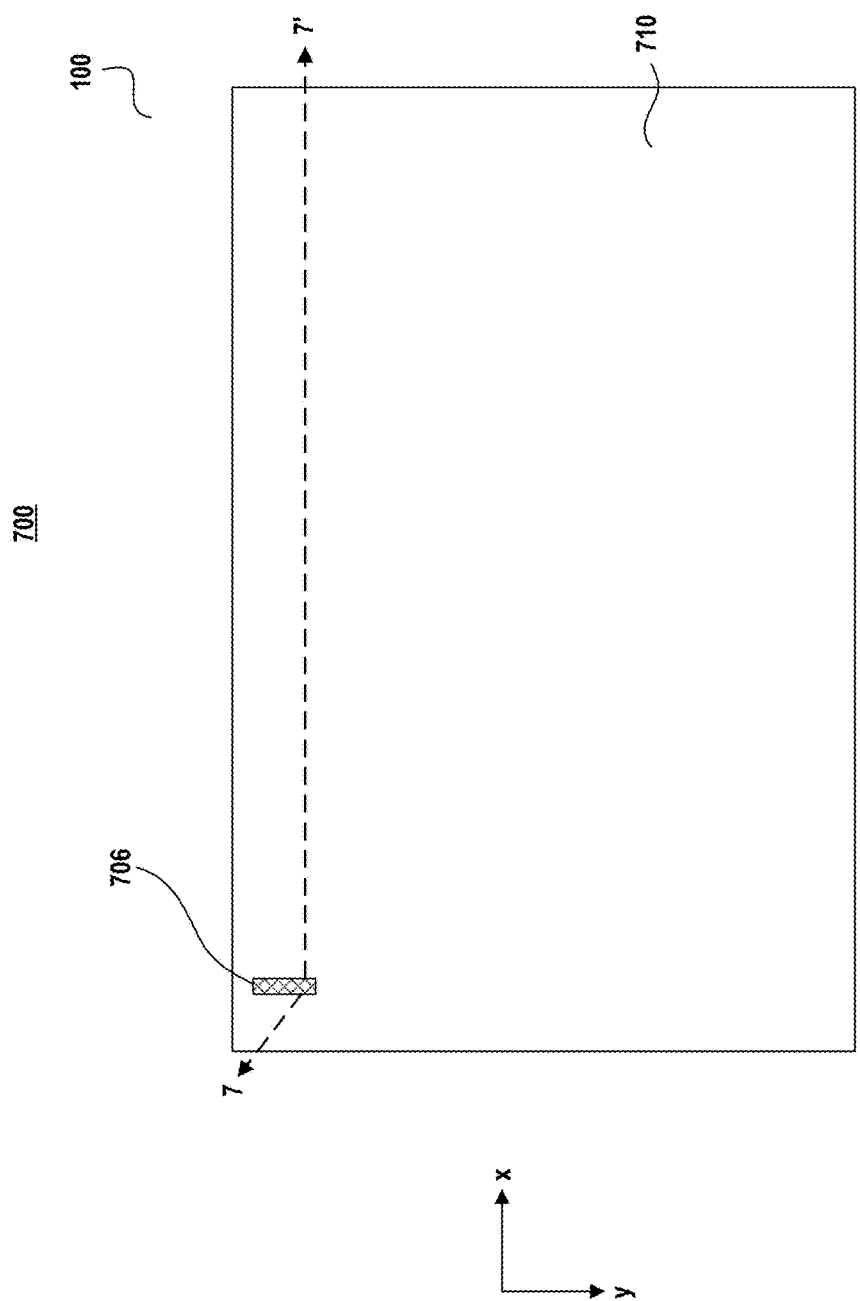
FIG. 7A illustrates a top view of an exemplary 3D memory structure, according to some embodiments.

FIG. 7A illustrates a top view 700 of staircase structure 100 at the beginning of an exemplary fabrication process and FIG. 7B illustrates a cross-sectional view of staircase structure 100 along 7-7' direction, according to some embodiments. At the beginning of the process, a substrate 105 (not shown in FIGS. 7A-10B) having a dielectric stack 710 thereon can be provided. Dielectric stack 710 can be the same as or similar to dielectric stack 210. A PR layer can be formed patterned over dielectric stack 710 to form a PR portion 706 over dielectric stack 710. PR portion 706 can be used as an etch mask for the subsequent etch and formation of a trimming mark in the A1.

Further, the portions of the top dielectric pair (O, N) of dielectric stack 710 exposed by PR portion 706 can be removed using similar or the same etching process as any one of the first etching process, the second etching process, and the third etching process described in FIGS. 2A-6B, and PR portion 706 can be removed after the etch. A trimming mark (e.g., initial trimming mark) can be formed in A1. Further, a first PR layer can be formed and patterned over the etched dielectric stack to expose the A1. The second etching process can be performed to remove the exposed dielectric pair (O, N) of the A1. The second etching process can be similar to or same as any one of the first etching process, the second etching process, and the third etching process described in FIGS. 2A-6B.

Figure 8A:
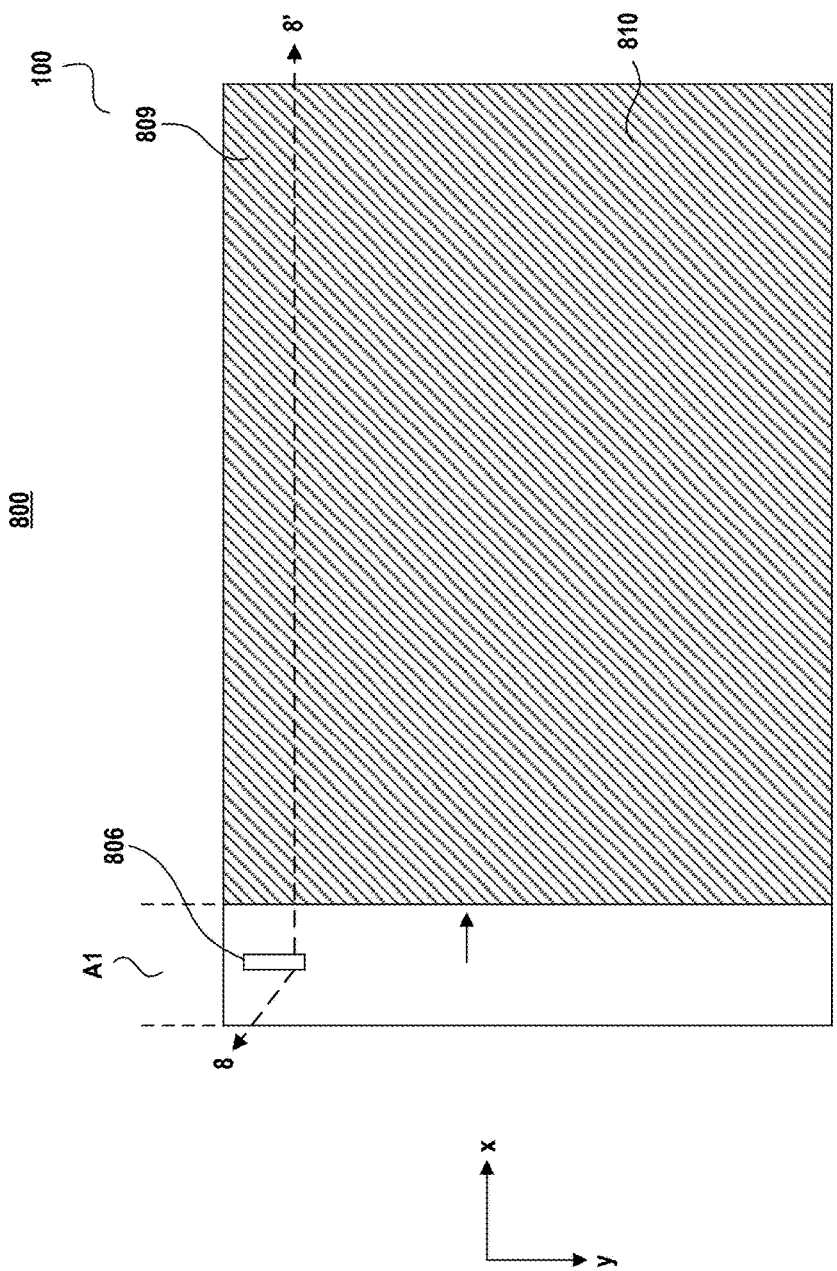
FIG. 8A illustrates a top view of an exemplary 3D memory structure, according to some embodiments.

FIG. 8A illustrates a top view 800 of staircase structure 100 after the second etching process and FIG. 8B illustrates a cross-sectional view 801 of staircase structure 100 along 8-8' direction, according to some embodiments. Dielectric stack 810 represents the dielectric stack 710 after the second etching process and the first PR layer can be represented by element 809. As shown in FIGS. 8A and 8B, trimming mark 806 can be formed over A1, and A1 is exposed for subsequent etching/processing. Further, first PR layer 809 can be trimmed horizontally (e.g., along the x-axis) for the etching/formation of other staircase-forming areas (e.g., A2 and A3). After a desired number of staircase-forming areas are formed, the PR layer for forming the staircases and over the dielectric stack (e.g., the first PR layer) can be removed and a subsequent trimming mark can be formed by patterning the top dielectric pair (O, N) of the dielectric stack.

Figure 9A:
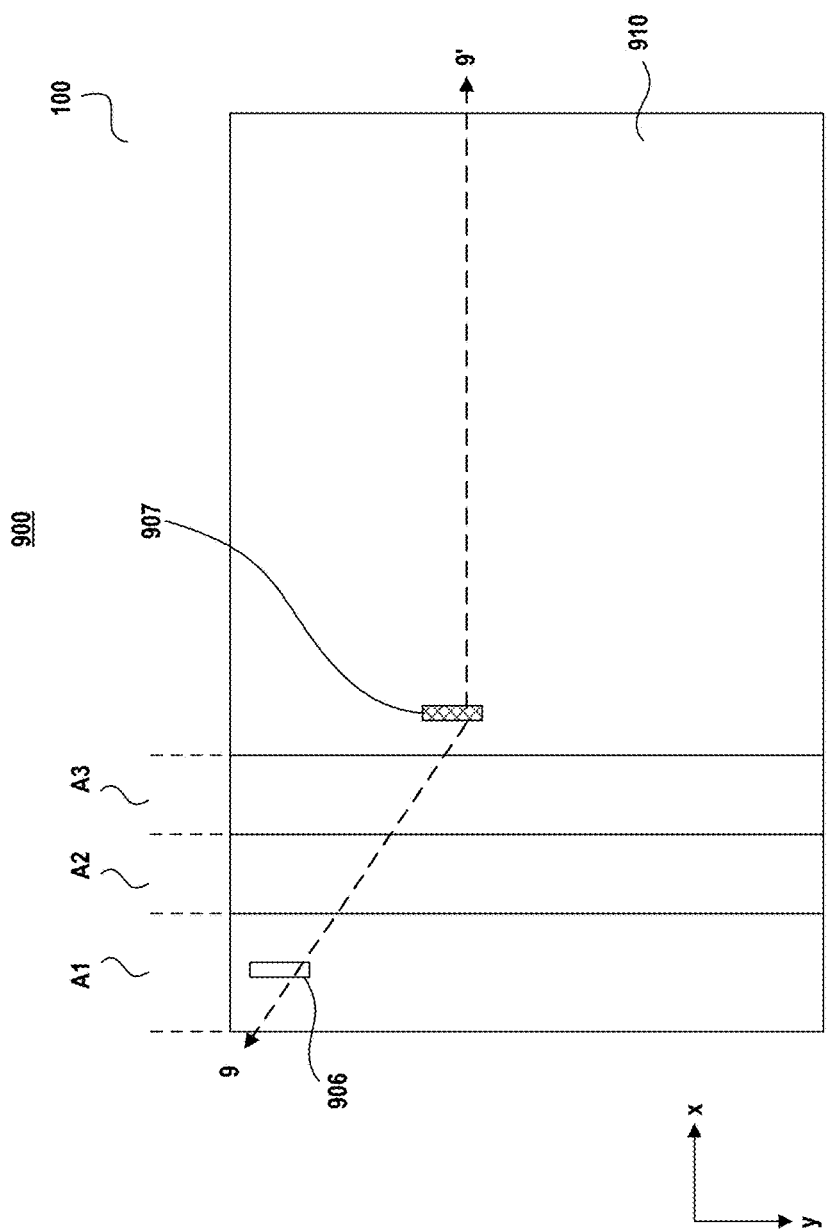
FIG. 9A illustrates a top view of an exemplary 3D memory structure, according to some embodiments.
Figure 9B:
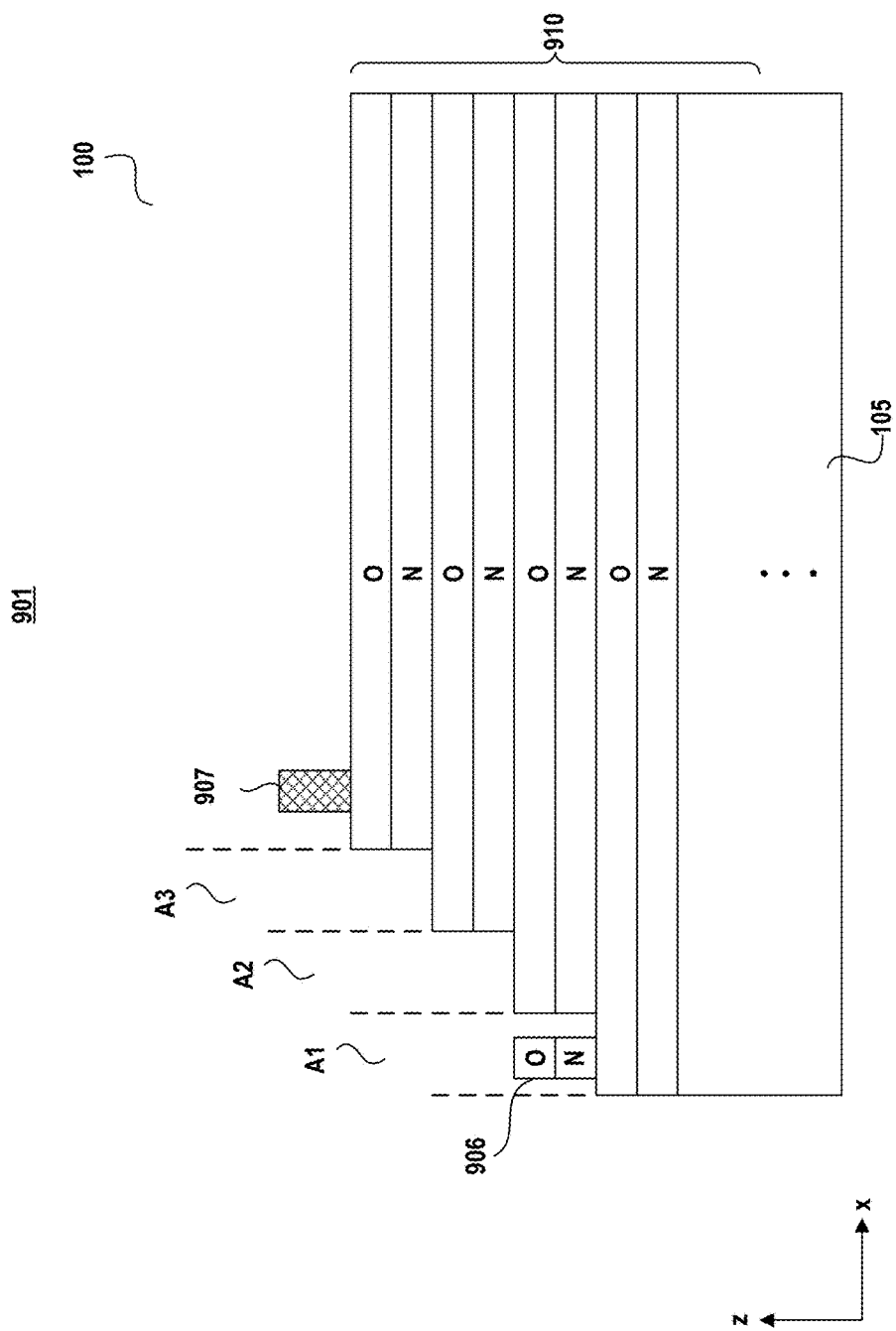
FIG. 9B illustrates a cross-sectional view of the 3D memory structure in FIG. 9A.

FIG. 9A illustrates a top view 900 of staircase structure 100 after the PR layer (e.g., the first PR layer) for forming the staircases is removed, and another PR portion is formed over staircase structure 100 for forming a trimming mark over another staircase-forming area, and FIG. 9B illustrates a cross-sectional view of staircase structure 100 along 9-9' direction, according to some embodiments. As an example, PR portion 907 can be formed in A4, after the formation of A1-A3. Trimming mark 906 represents trimming mark 806 after the etching/processing for A2 and A3. Dielectric stack 910 can be dielectric stack 810 after the etching/formation of A2 and A3. As shown in FIGS. 9A and 9B, PR portion 907 can be used as an etch mask for the subsequent etching/formation of the trimming mark located in A4.

Further, portions of the dielectric pairs of dielectric stack 910 exposed by PR portion 907 can be etched and removed, and PR portion 907 can be removed after the etch. The etching process to remove the exposed dielectric pairs (O, N) of dielectric stack 910 can be the same as or similar to any one of the first etching process, the second etching process, and the third etching process described in FIGS. 2A-6B. A trimming mark can then be formed in A4. Further, a second PR layer can be formed and patterned over the etched dielectric pair to expose A1-A4, and an etching process can be performed to remove portions of the dielectric pairs (O, N) stack exposed by the second PR layer.

Figure 10A:
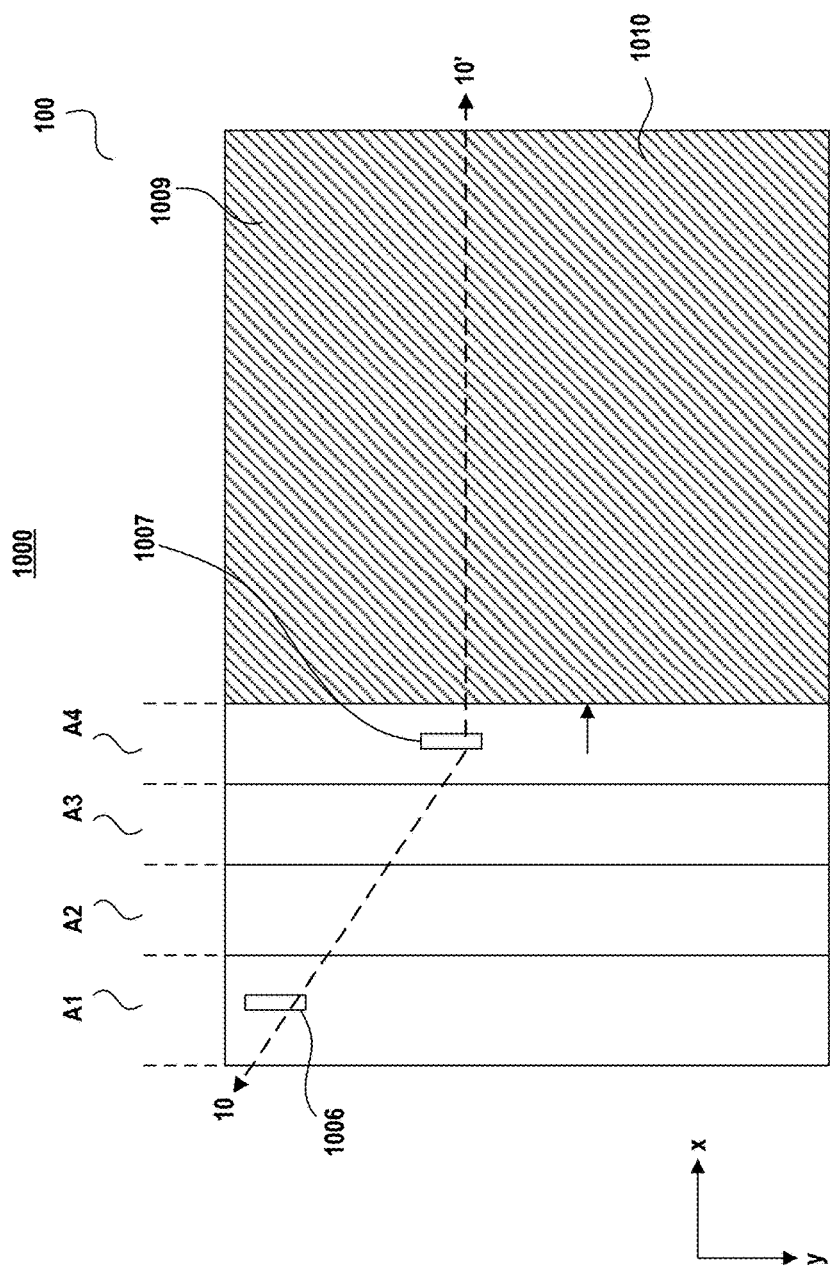
FIG. 10A illustrates a top view of an exemplary 3D memory structure, according to some embodiments.
Figure 10B:
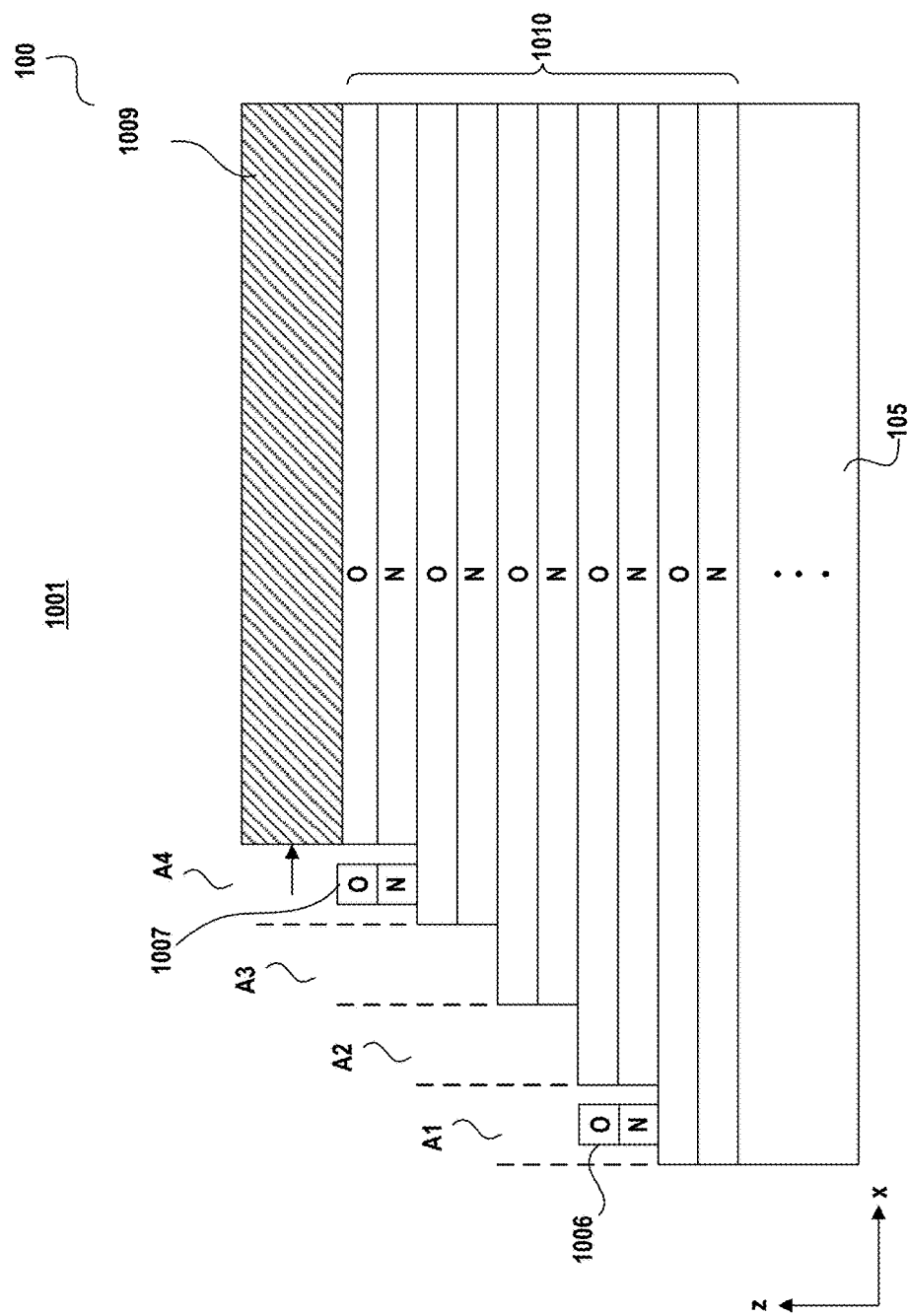
FIG. 10B illustrates a cross-sectional view of the 3D memory structure in FIG. 10A.

FIG. 10A illustrates a top view 1000 of staircase structure 100 after the top dielectric pair of dielectric stack 910 is removed to form A4 and FIG. 10B illustrates a cross-sectional view of staircase structure 100 along 10-10' direction, according to some embodiments. Dielectric stack 1010 represents dielectric stack 910 after the top dielectric pair of dielectric stack 910 is removed, and the second PR layer is represented by element 1009. Trimming marks 1006 and 1007 can be formed in A1 and A4, respectively. Further, second PR layer 1009 can be trimmed horizontally (e.g., along the x-axis) for the formation of subsequent staircases. Additional trimming marks can be formed using similar methods for forming trimming marks 906, 1006, and 1007. In some embodiments, trimming marks can be formed after a PR layer no longer has sufficient thickness (e.g., along the z-axis) and/or width (in the x-y plane) after repetitive trimming is removed and before a subsequent new PR layer is formed and patterned for forming subsequent staircases.

As described above, locations of trimming marks can be determined before or during the formation of staircases of a staircase structure. Staircases and trimming marks can further be formed by repetitively etching the dielectric pairs (O, N) of the dielectric stack. Because a trimming mark can function as an etch mask or patterning mask for the formation of the trimming mark of the lower adjacent dielectric pair along the z-axis, the horizontal location of a trimming mark of a staircase can be preserved or stay unchanged during and after the etching processes. Thus, the trimming marks can be used to reflect/measure the actual PR trimming rate during the formation of staircases, and the PR trimming parameters can be controlled or adjusted based on the measurement.

Trimming marks can also have a recessed structure, and the locations of the trimming marks with a recessed structure can also be formed before or during the formation of staircases. FIGS. 11A, 11B, 12A, 12B, 13A, 13B, 14A, and 14B illustrate another exemplary method for forming staircase structure 100, according to some embodiments. The locations of the trimming marks can be formed before the formation of staircases of staircase structure 100. Different from the methods shown in FIGS. 2A-10B, the trimming marks formed using the method illustrated in FIGS. 11A-14B can have a recessed structure.

Figure 11A:
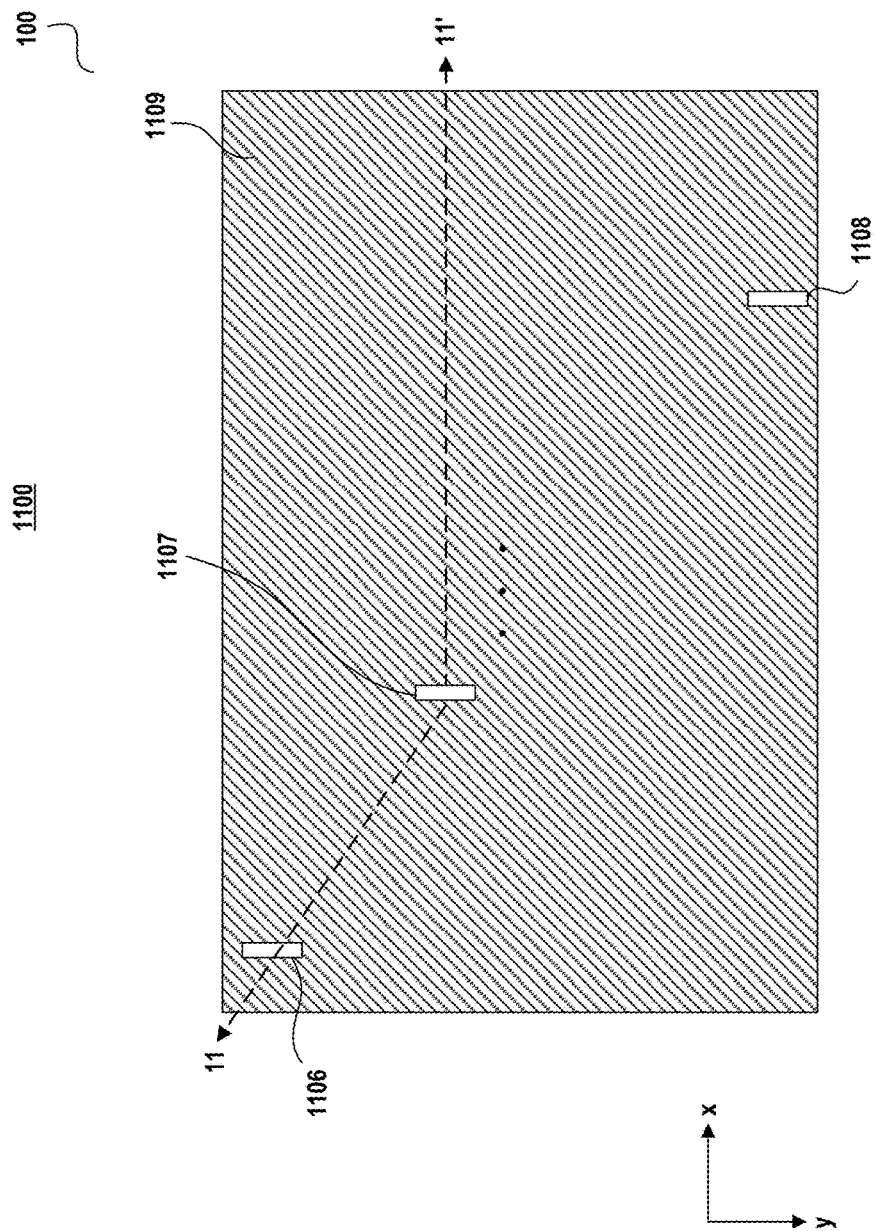
FIG. 11A illustrates a top view of an exemplary 3D memory structure, according to some embodiments.
Figure 11B:
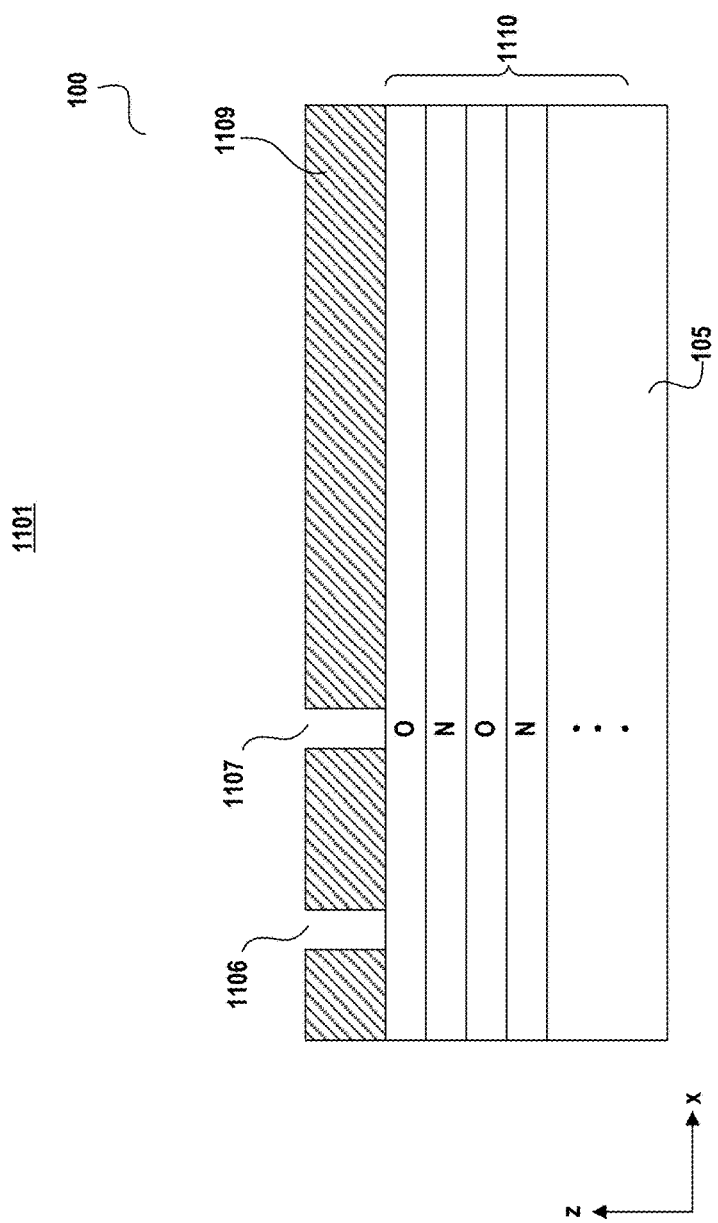
FIG. 11B illustrates a cross-sectional view of the 3D memory structure in FIG. 11A.

FIG. 11A illustrates a top view 1100 of staircase structure 100 at the beginning of a fabrication process for forming trimming marks with a recessed structure and FIG. 11B illustrates a cross-sectional view 1101 along the 11-11' direction, according to some embodiments. At the beginning of the fabrication process, a substrate 105 having a dielectric stack 1110 can be provided. Dielectric stack 1110 can be the same as or similar to dielectric stack 210 illustrated in FIGS. 2A and 2B. A PR layer 1109 can be formed and patterned over dielectric stack 1110 to expose patterns (e.g., 1106, 1107, . . . , and 1108) of the subsequently-formed trimming marks. Further, an etching process can be performed to remove the portions of the top dielectric pair (O, N) of dielectric stack 1110 exposed by PR layer 1109. The etching process can be similar to or the same as any one of the first etching process, the second etching process, and the third etching process illustrated in FIGS. 2A-7B. Further, PR layer 1109 can be removed and trimming marks can be formed over the etched dielectric stack.

Figure 12A:
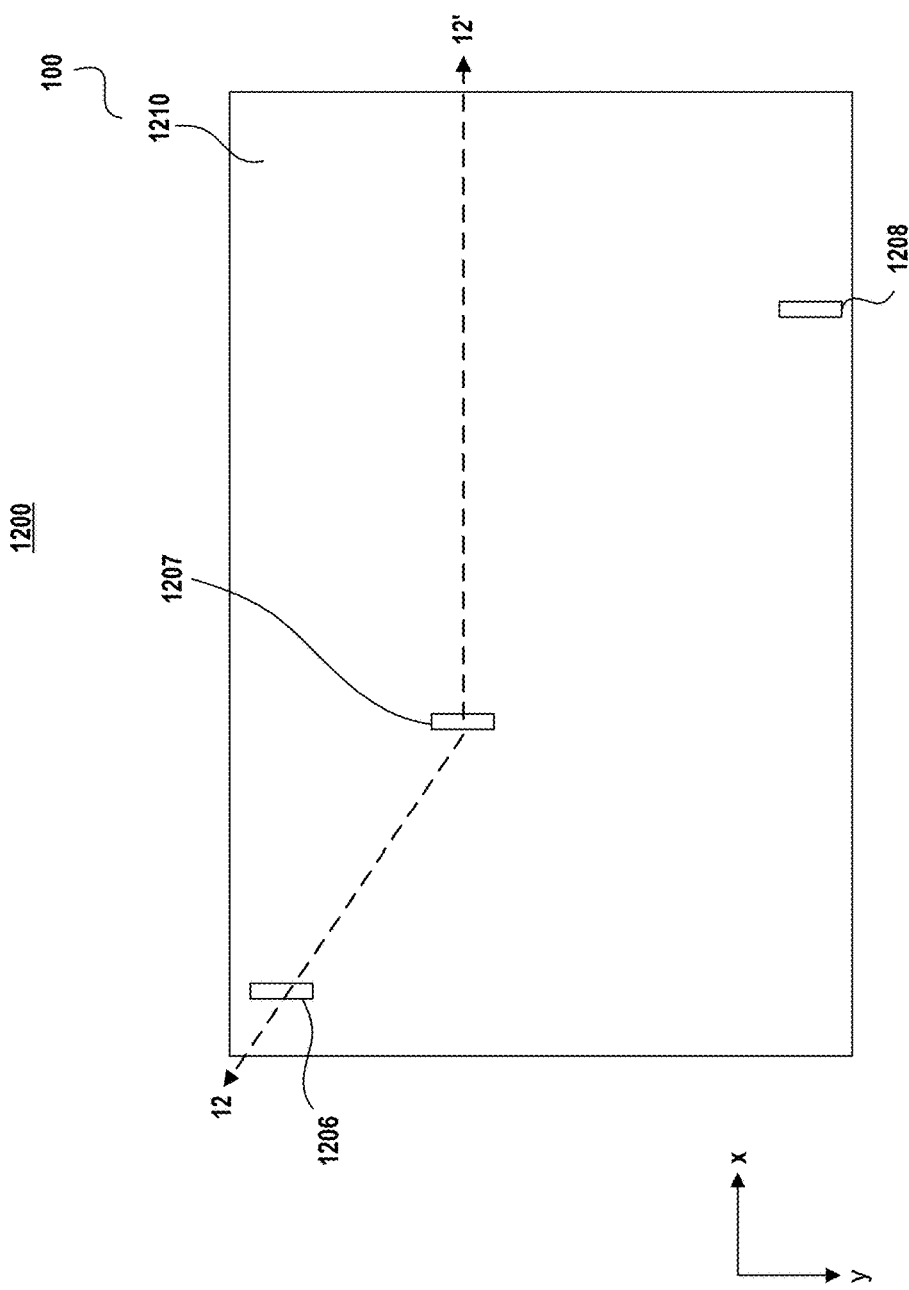
FIG. 12A illustrates a top view of an exemplary 3D memory structure, according to some embodiments.
Figure 12B:
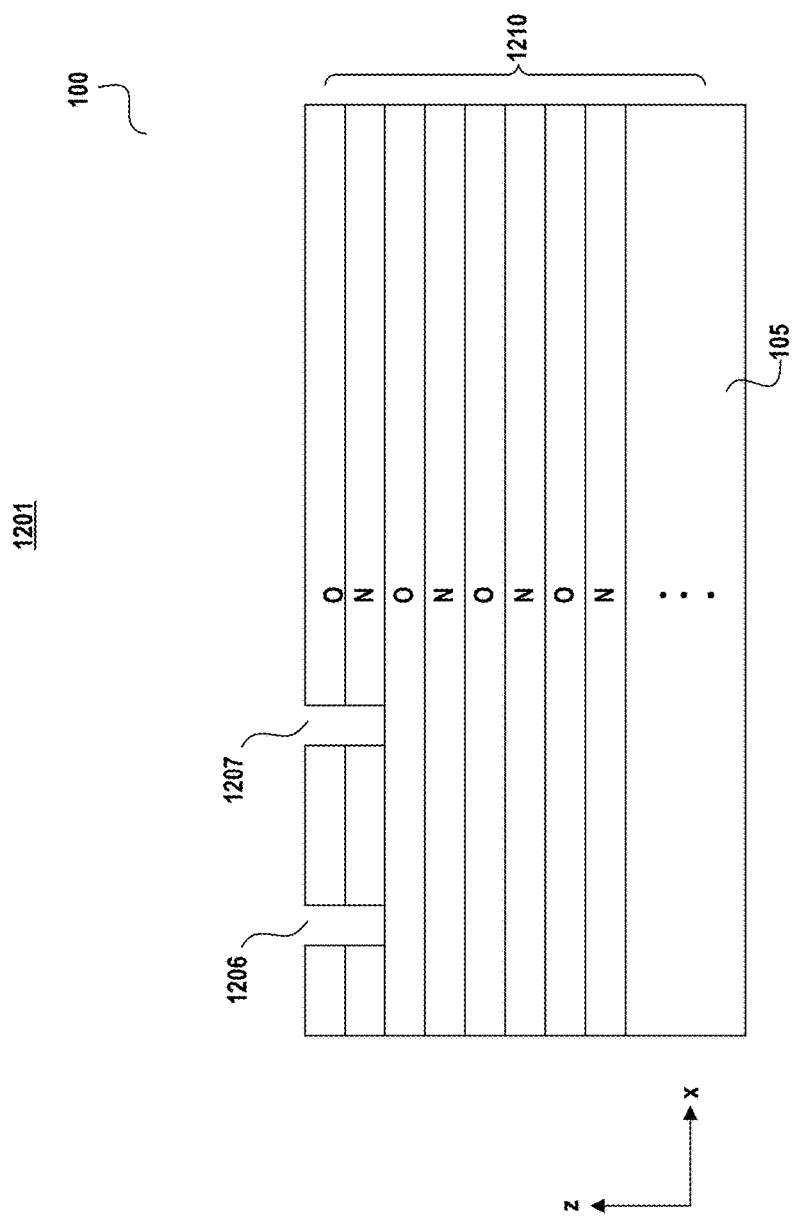
FIG. 12B illustrates a cross-sectional view of the 3D memory structure in FIG. 12A.

FIG. 12A illustrates a top view of 1200 of staircase structure 100 after a plurality of trimming marks are formed over the etched dielectric stack and FIG. 12B illustrates a cross-sectional view 1201 of staircase structure 100 along 12-12' direction, according to some embodiments. Dielectric stack 1210 represents dielectric stack 1110 after the top dielectric pair is etched. As shown in FIGS. 12A and 12B, trimming marks 1206, 1207, . . . , and 1208 are formed. Different from the trimming marks 306, 307, . . . , and 308 illustrated in FIGS. 3A and 3B, the trimming marks formed in FIGS. 12A and 12B have a recessed structure, and the depth of a trimming mark can be nominally equal to the thickness of the top dielectric pair (O, N) of dielectric stack 1210. Further, a first PR layer can be formed and patterned over dielectric stack 1210 to expose the first staircase-forming area, and the exposed top dielectric pair (O, N) of dielectric stack can be etched and removed.

Figure 13A:
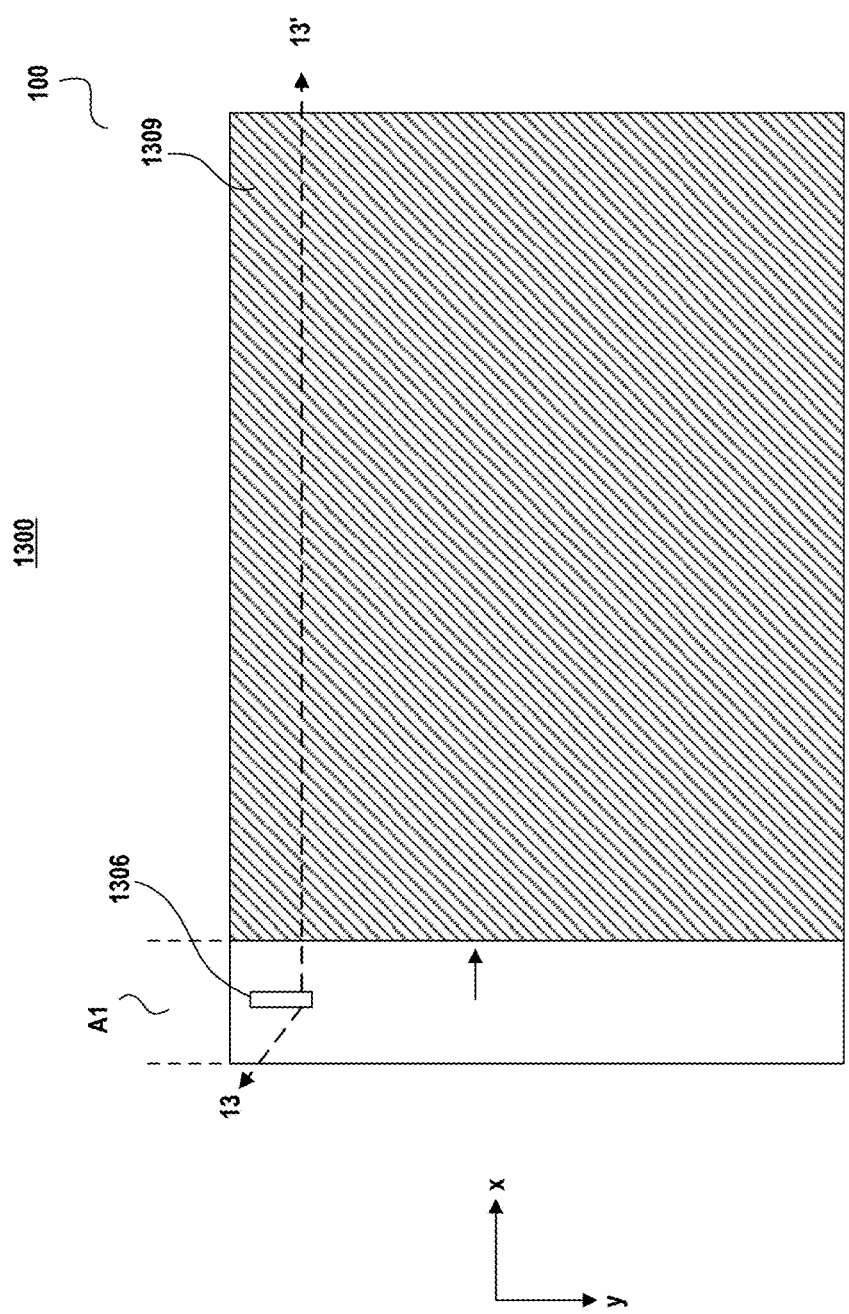
FIG. 13A illustrates a top view of an exemplary 3D memory structure, according to some embodiments.
Figure 13B:
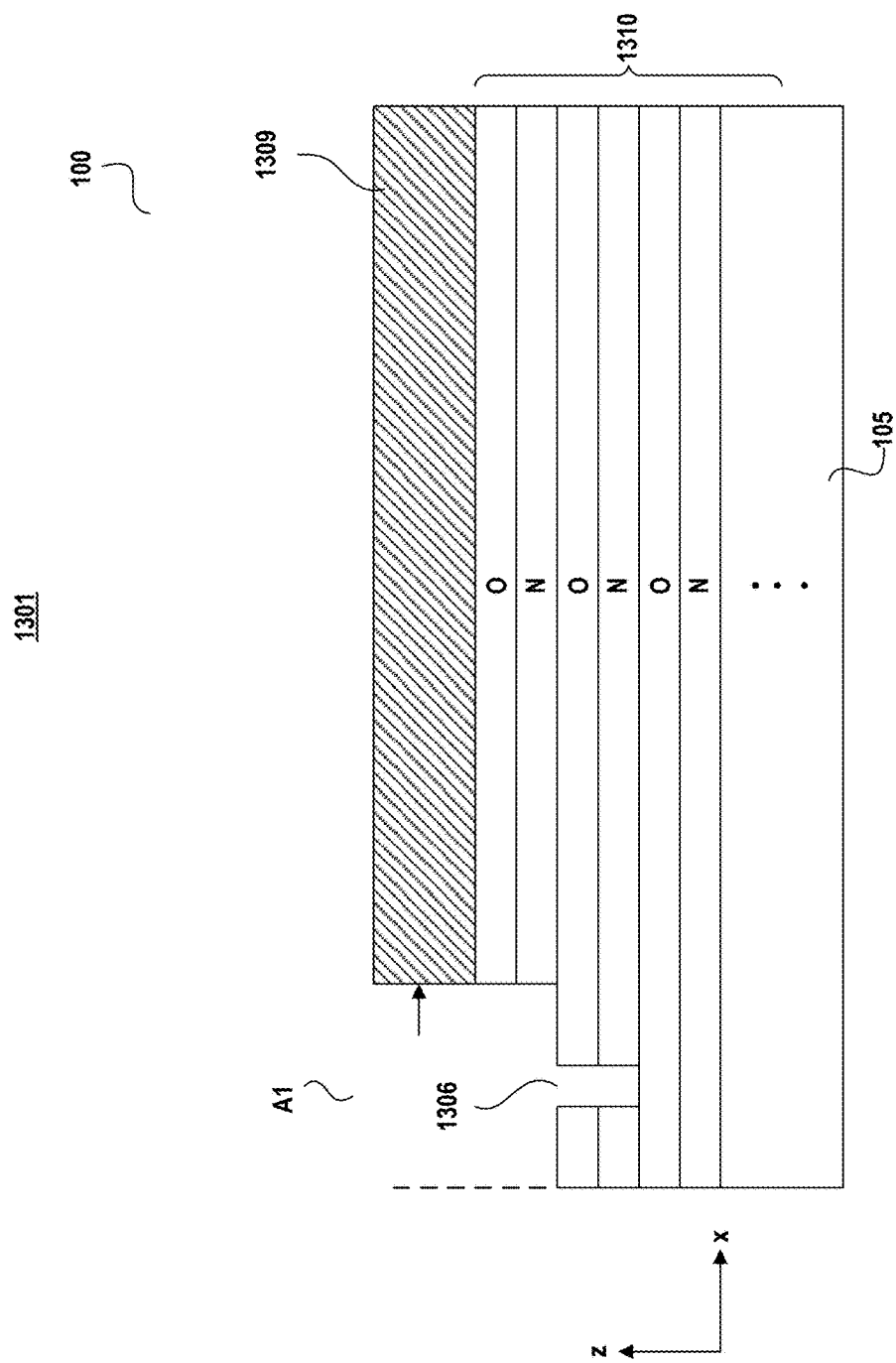
FIG. 13B illustrates a cross-sectional view of the 3D memory structure in FIG. 13A.

FIG. 13A illustrates a top view 1300 of staircase structure 100 after the top dielectric pair of A1 is removed and FIG. 13B illustrates a cross-sectional view 1301 along the 13-13' direction, according to some embodiments. Dielectric stack 1310 represents dielectric stack 1210 after the top dielectric pair is etched. First PR layer is represented by element 1309. As shown in FIGS. 13A and 13B, trimming mark 1306 can be formed in the A1. First PR layer 1309 can be further trimmed horizontally (e.g., along the x-axis) for the subsequent formation of staircases of staircase structure 100. Because a trimming mark can function as an etch mask or patterning mask for the formation of the trimming mark of the lower adjacent dielectric pair along the z-axis, the locations of the trimming marks formed in FIGS. 12A and 12B can be preserved during the fabrication process.

Figure 14A:
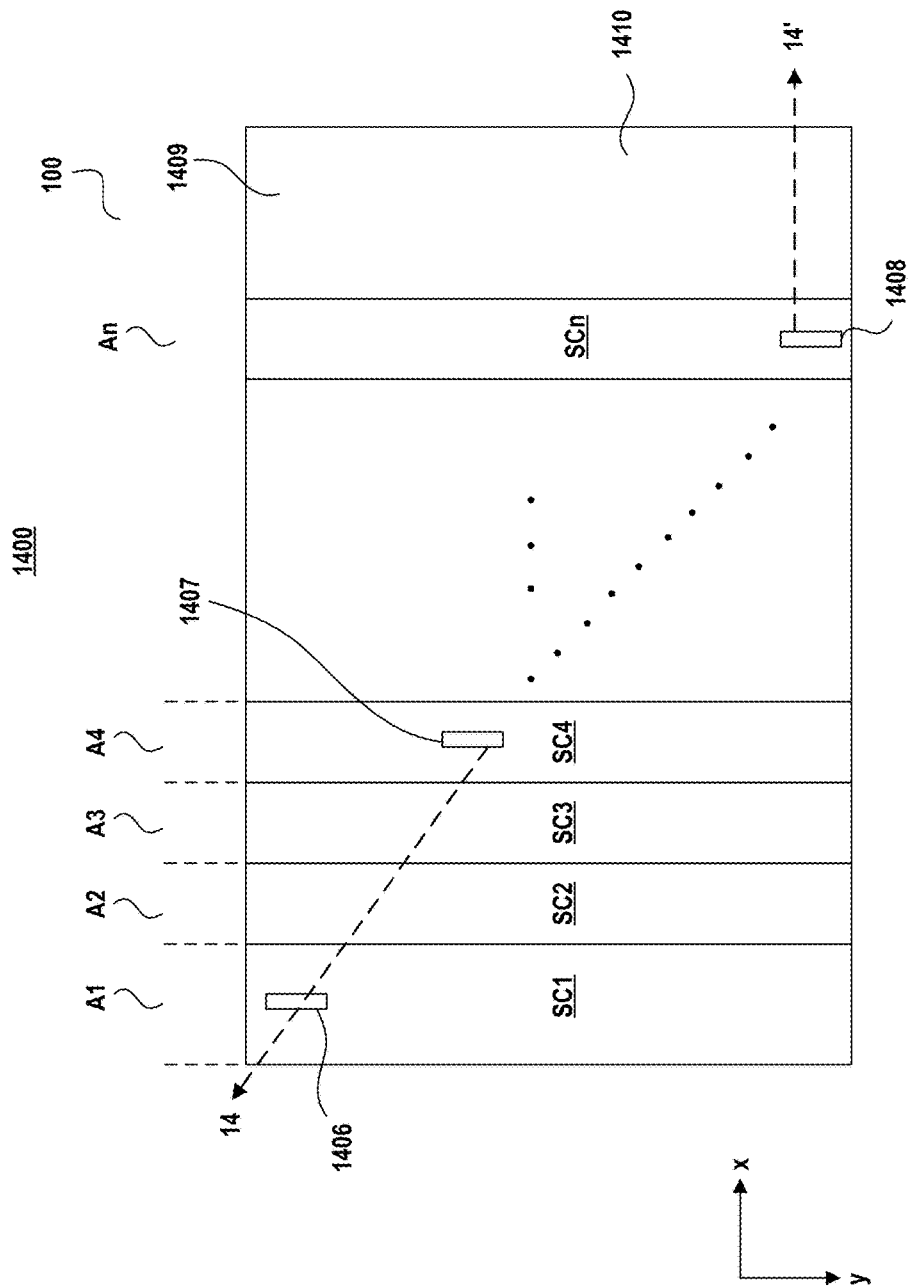
FIG. 14A illustrates a top view of an exemplary 3D memory structure, according to some embodiments.
Figure 14B:
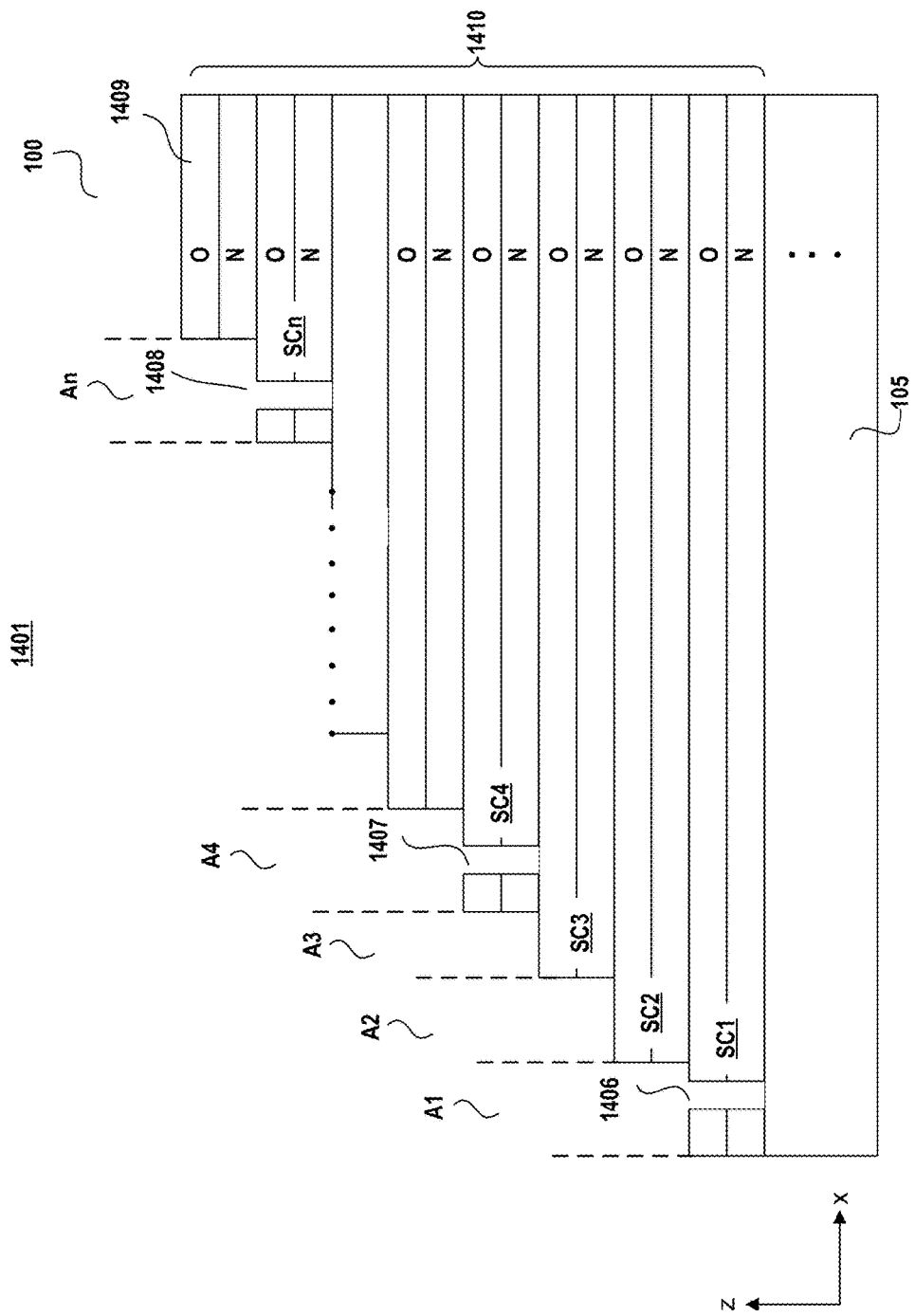
FIG. 14B illustrates a cross-sectional view of the 3D memory structure in FIG. 14A.

FIG. 14A illustrates a top view 1400 of staircase structure 100 after all the staircases are formed, according to some embodiments. FIG. 14B illustrates a cross-sectional view 1401 along 14-14' direction. Dielectric stack 1410 represents dielectric stack 1310 after the formation of the staircases (SC1, SC2, . . . , SCn) and the trimming marks. Top surface 1409 of dielectric stack 1410 can be exposed to provide the fabrication base for the subsequent fabrication of staircase structure 100. As shown in FIGS. 14A and 14B, trimming marks 1406, 1407, . . . , 1408 can be formed over the staircases of staircase structure 100. The actual PR trimming rate can be determined based on the locations of the trimming marks, e.g., 1206-1208, 1306-1308, and/or 1406-1408, during or after the formation of staircase structure 100. The determined actual PR trimming rate can be further used to control the next trimming of the PR layer in the same batch of staircase structures or the next batch of staircase structures. Details can be described in the following paragraphs.

FIGS. 15A, 15B, 16A, 16B, 17A, and 17B illustrate another exemplary method for forming staircase structure 100 having trimming marks with a recessed structure, according to some embodiments. Different from the method shown in FIGS. 11A-14B, according to the method illustrated in FIGS. 15A-17B, the trimming marks can be formed separately/individually. Each trimming mark can be separately formed at a desired location during the formation of the staircase structure.

Figure 15A:
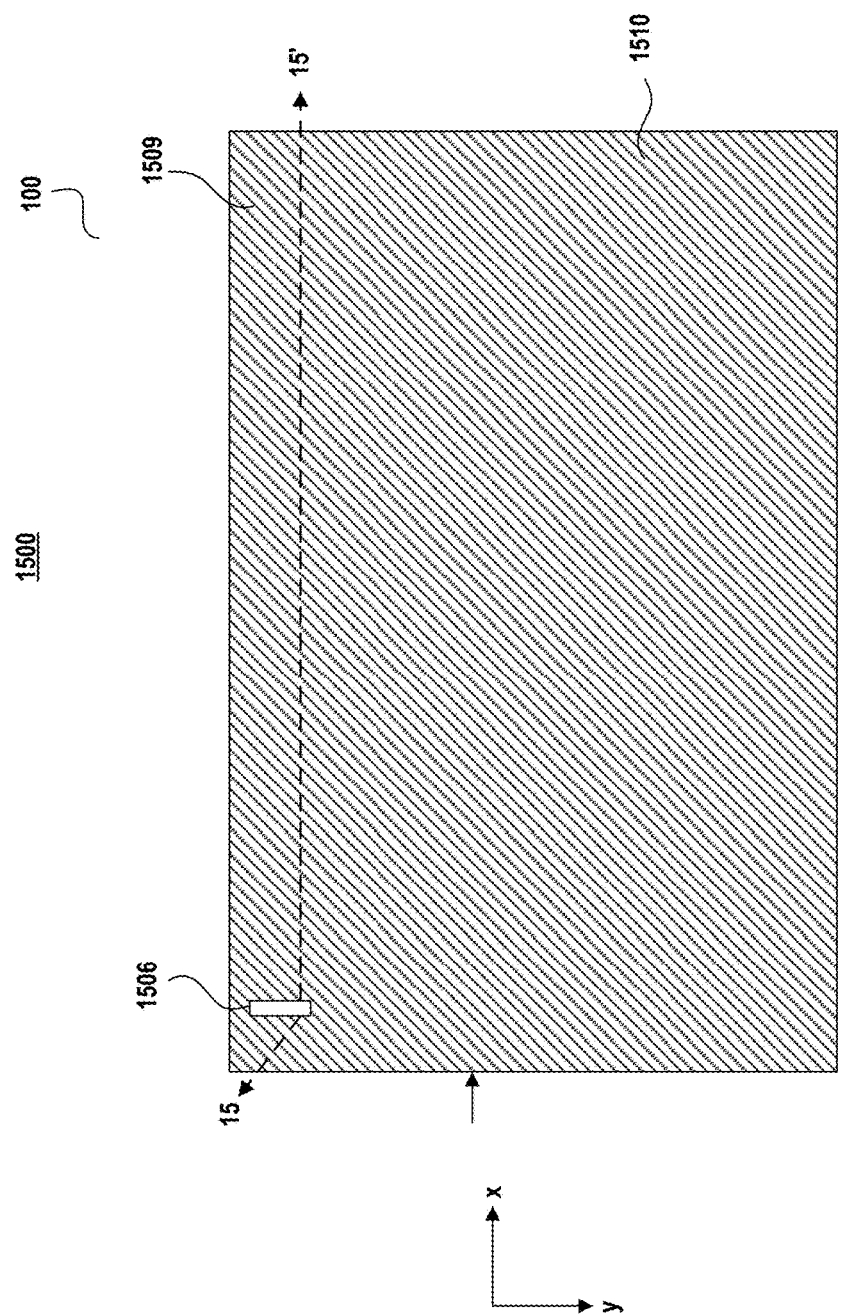
FIG. 15A illustrates a top view of an exemplary 3D memory structure, according to some embodiments.
Figure 15B:
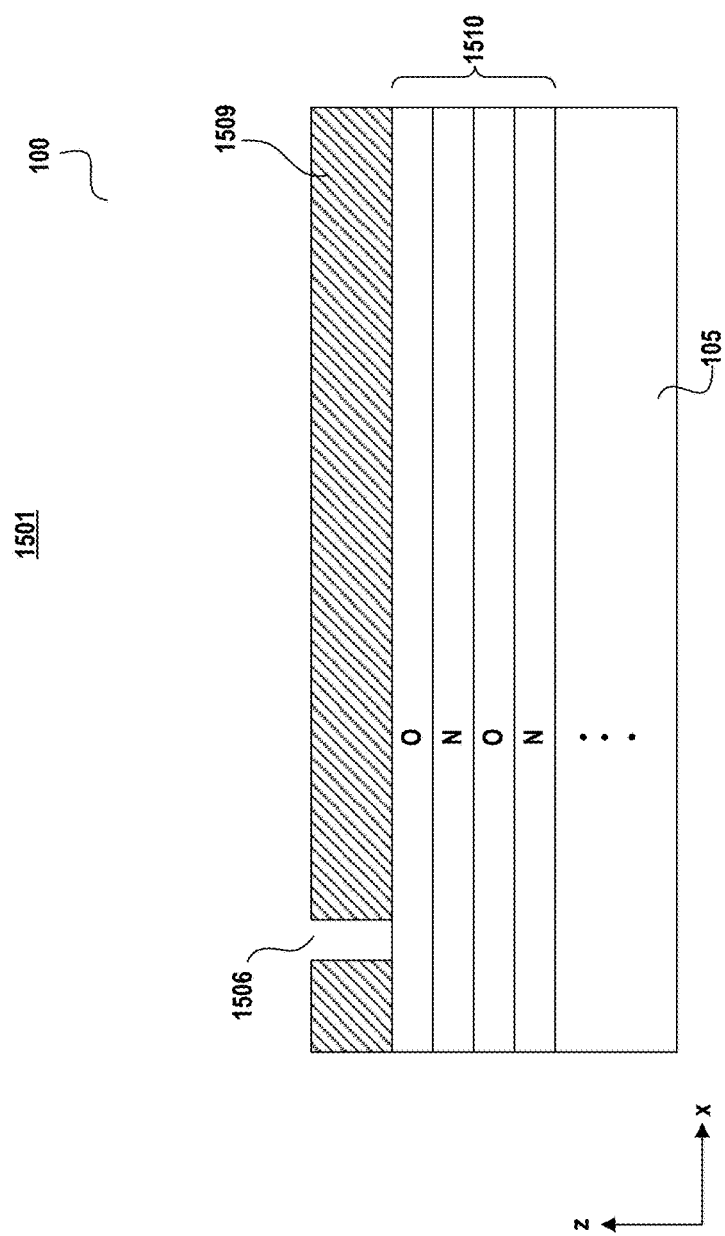
FIG. 15B illustrates a cross-sectional view of the 3D memory structure in FIG. 15A.

FIG. 15A illustrates a top view 1500 of staircase structure 100 at the beginning of an exemplary fabrication process and FIG. 15B illustrates a cross-sectional view of staircase structure 100 along 15-15' direction. At the beginning of the fabrication process, substrate 105 having dielectric stack 1510 over substrate 105 can be provided. A PR layer 1509 can be formed and patterned over dielectric stack 1510 to expose the pattern of a trimming mark over the A1. Patterned PR layer 1509 can function as an etch mask in the subsequent etching of the top dielectric pair (O, N) of dielectric stack 1510 such that portion 1506 of the top dielectric pair exposed by patterned PR layer 1509 can be removed to form a trimming mark (e.g., an initial trimming mark).

Further, the portions of top dielectric pair of dielectric stack 1510 exposed by patterned PR layer 1509 can be removed using similar or the same etching process as any one of the first etching process, the second etching process, and the third etching process described in FIGS. 2A-6B, and patterned PR layer 1509 can be removed after the etch. A trimming mark can be formed in the first staircase-forming area. Further, a first PR layer can be formed and patterned over the etched dielectric stack to expose the first staircase-forming area. A second etching process can be performed to remove the exposed portion/area of the top dielectric pair (O, N). The second etching process can be similar to or the same as any one of the first etching process, the second etching process, and the third etching process described in FIGS. 2A-6B.

Figure 16B:
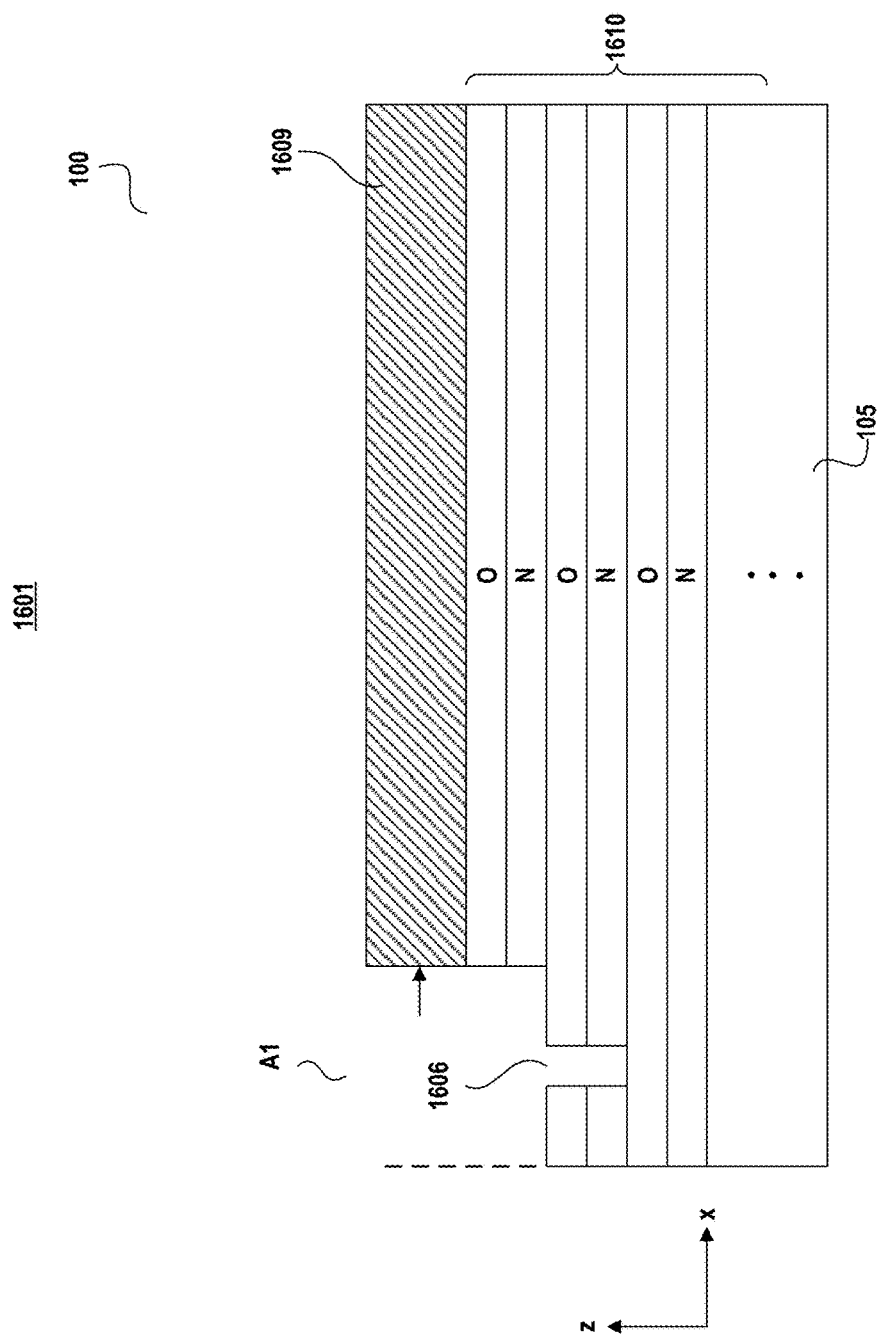
FIG. 16B illustrates a cross-sectional view of the 3D memory structure in FIG. 16A.

FIG. 16A illustrates a top view 1600 of staircase structure 100 after the exposed portion of top dielectric pair is removed and FIG. 16B illustrates a cross-sectional view 1601 of staircase structure 100 along 16-16' direction, according to some embodiments. Dielectric stack 1610 represents dielectric stack 1510 after the exposed portion of top dielectric pair (O, N) are removed. The first PR layer is represented by element 1609. As shown in FIGS. 16A and 16B, trimming mark 1606 can be formed over A1, and A1 is exposed for subsequent etching/processing. Further, first PR layer 1609 can be trimmed horizontally (e.g., along the x-axis) for the etching/formation of other staircase-forming areas (e.g., A2 and A3). After a desired number of staircase-forming areas are formed, the PR layer for forming the staircases and over the dielectric stack (e.g., the first PR layer) can be removed and a subsequent trimming mark can be formed by patterning the top dielectric pair (O, N) of the dielectric stack.

Figure 17A:
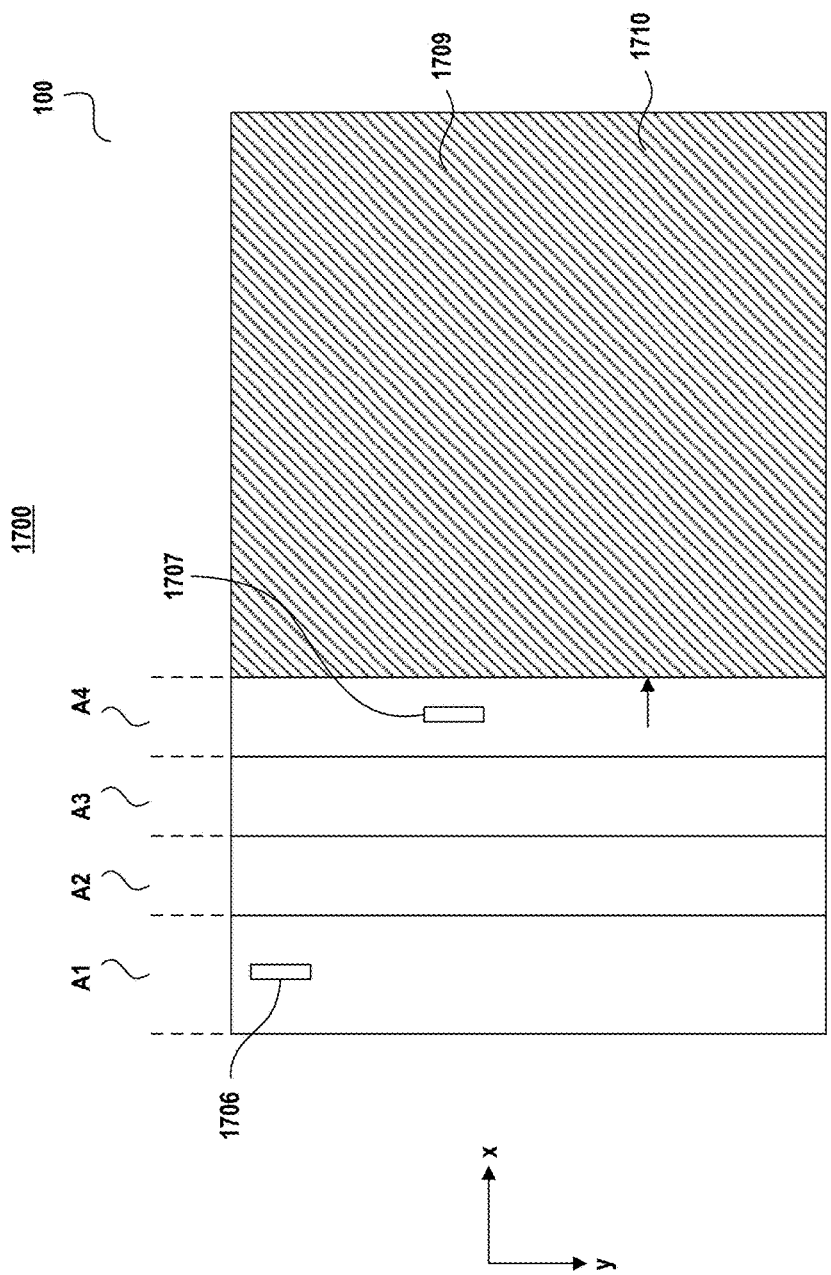
FIG. 17A illustrates a top view of an exemplary 3D memory structure, according to some embodiments.
Figure 17B:
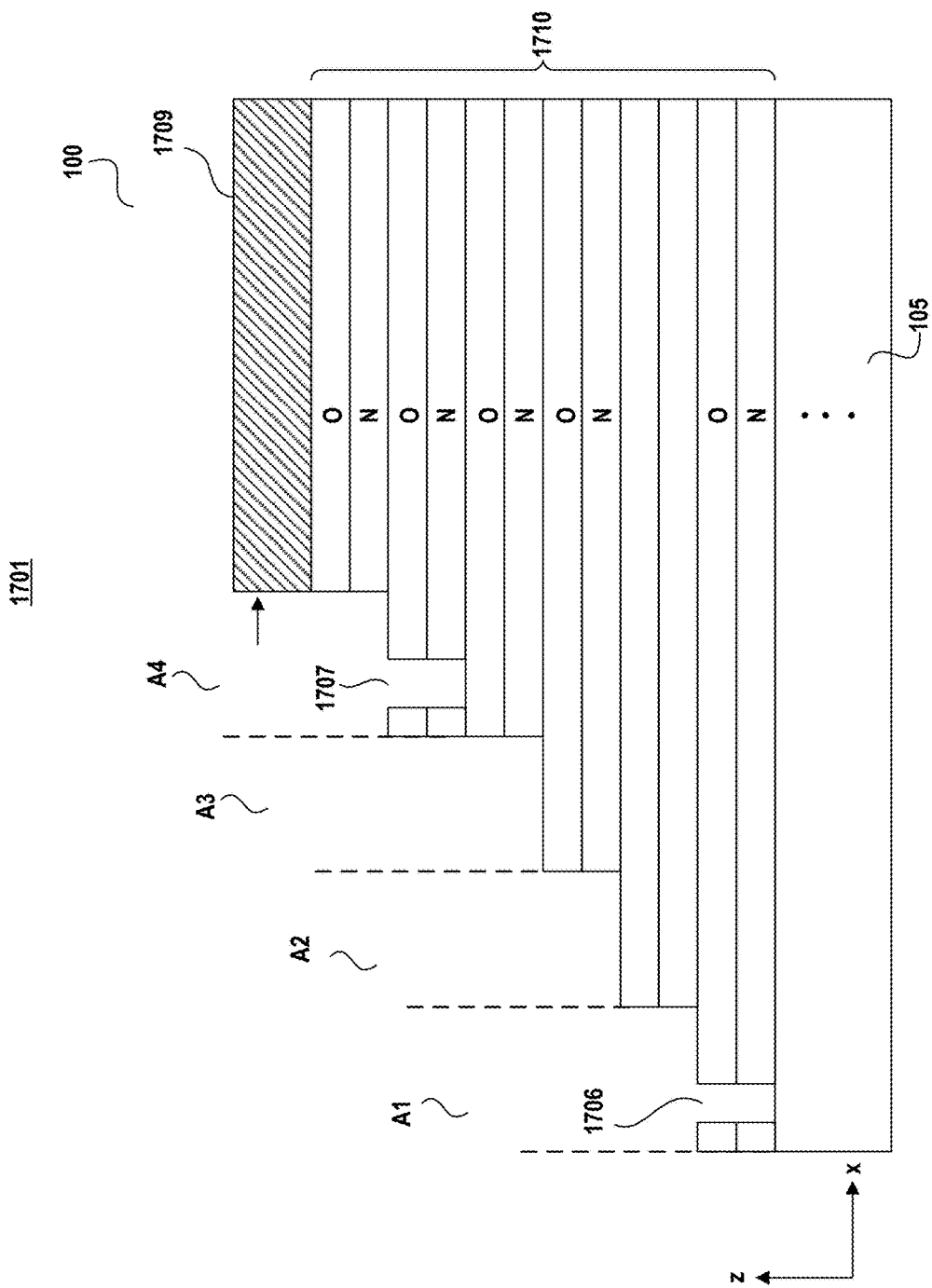
FIG. 17B illustrates a cross-sectional view of the 3D memory structure in FIG. 17A.

FIG. 17A illustrates a top view 1700 of staircase structure 100 after all the staircases are formed, according to some embodiments. FIG. 17B illustrates a cross-sectional view 1701 along 17-17' direction. Dielectric stack 1710 represents dielectric stack 1310 after the formation of the staircases (SC1, SC2, . . . , SCn) and the trimming marks. As shown in FIGS. 17A and 17B, trimming marks 1706, 1707, . . . , 1708 can be formed over the staircases of staircase structure 100. The actual PR trimming rate of PR layer 1709 can be determined based on the locations of the trimming marks, e.g., 1606-1608 and/or 1706-1708, during or after the formation of staircase structure 100. The determined actual PR trimming rate can be further used to control the next trimming of the PR layer in the same batch of staircase structures or the next batch of staircase structures. The working principles of trimming marks having a recessed structure can be the same as or similar to the working principles of trimming marks having a protruding structure. Details of the working principles are described below.

In some embodiments, the sacrificial layers are replaced by conductor layers after the formation of staircase structure 100 is completed. The conductor layers are insulated from one another by the insulating layers in between. The conductor layers can form the gate electrodes (e.g., word lines) of the 3D memory device.

In some embodiments, trimming marks described in FIGS. 2A-17B can also be formed over a neighboring area, e.g., a dummy staircase structure or a neighboring planar area on the same substrate the staircase structure is formed. In the present disclosure, the term "neighboring" can refer to any suitable location/region that is on the same substrate and undergoes the same etching process as the staircase structure. A neighboring area/region can be adjacent to an object (e.g., the staircase structure) or away from the object. For example, a dummy staircase structure, e.g., adjacent to staircase structure 100, can be formed at the same time when staircase structure 100 is formed. Same PR layers can be used to form the staircases of the dummy staircase structure so that the trimming marks formed over the dummy staircase structure can reflect the actual PR trimming rate. Measurement based on the trimming marks can thus be taken place using the dummy staircase structure without changing the topography of staircase structure 100.

Figure 19:
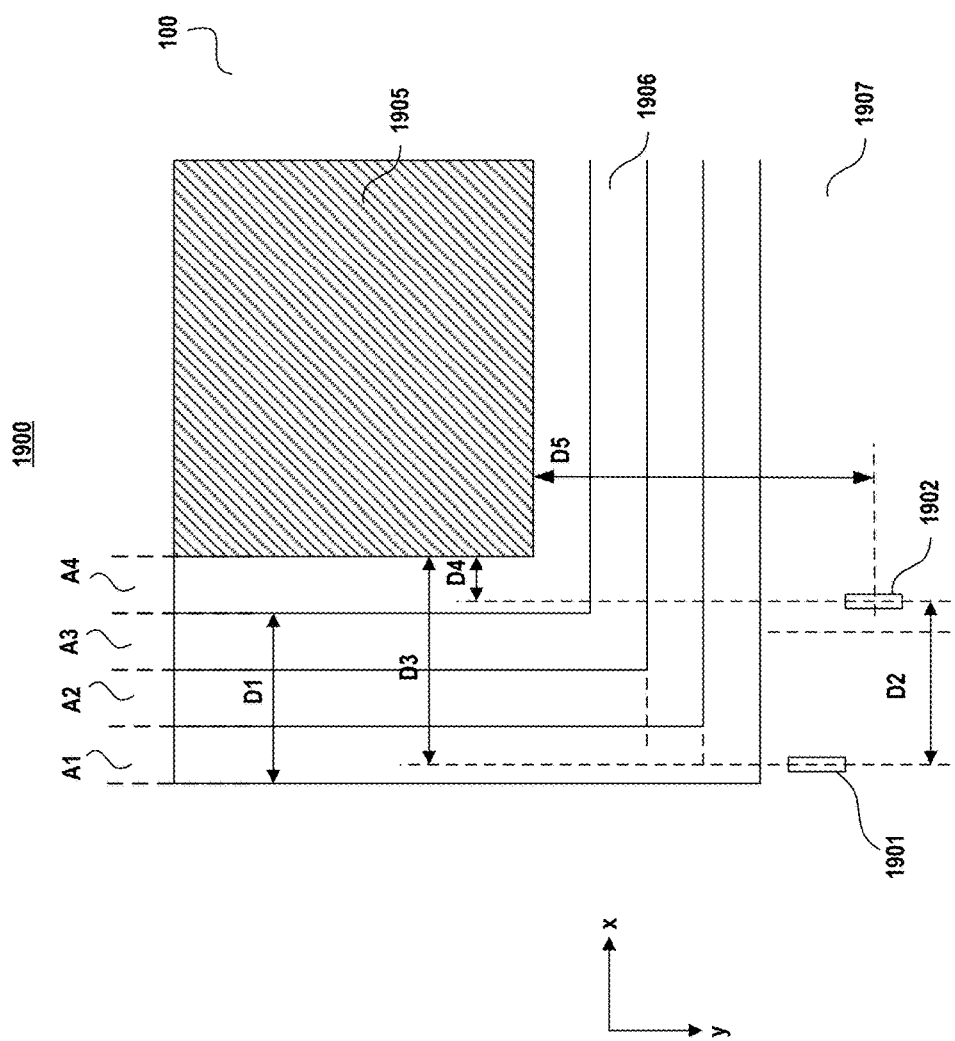
FIG. 19 illustrates an enlarged view of a portion of the 3D memory structure in FIG. 18.

FIGS. 18 and 19 illustrate another exemplary staircase structure 100 having trimming marks formed in a neighboring planar region, according to some embodiments. For example, the neighboring planar region can also be referred to as a test region or a dummy region, and the region to form the functioning staircase structure can be referred to as a device region. The trimming marks can be formed to reflect the actual PR trimming rate for forming staircases. For illustrative purposes, only a portion of staircase structure 100 and the dummy region is shown. In some embodiments, the trimming marks in a neighboring planar region can be formed at the same time as the trimming marks over staircase structure 100, e.g., before the etching of the dielectric stack.

As shown in FIG. 18, staircase structure 100 can be formed in device region 1806, and a plurality of trimming marks (e.g., 1801, 1802, . . . , 1803) can be formed in dummy region 1807. The trimming marks can be formed before or during the formation of staircase structure 100. In some embodiments, staircase structure 100 can be formed using a PR layer 1805, which is being trimmed vertically and horizontally (e.g., along the x-axis and the y-axis) to form staircases of staircase structure 100. In some embodiments, the trimming marks can be formed using a separate PR layer followed by an etching process, similar to or same as any one of the first etching process, the second etching process, and the third etching mask illustrated in FIGS. 2A-7B. The trimming marks can be distributed in any suitable pattern, e.g., along the x-axis, along a direction having an angle to the x-axis, or in an irregular pattern. In some embodiments, the trimming marks are each aligned with the middle position of a staircase along the x-axis. Because the locations of the trimming marks can stay unchanged during the formation of staircase structure 100, measurement based on the trimming marks, during or after the formation of staircase structure 100, can be used to reflect the actual PR trimming rate.

FIG. 19 illustrates an enlarged view 1900 of the circled area in FIG. 18, according to some embodiments. As shown in FIG. 19, staircase-forming areas A1-A4 can be formed in staircase structure 100. Trimming marks 1901 and 1902 can be formed at the same locations of trimming marks 1801 and 1802 before the formation of A1-A4. Trimming mark 1901 can be designed to be aligned with the middle position of A1 along the x-axis, and trimming mark 1902 can be designed to be aligned with the middle position of A4 along the x-axis. As an example, distance D1 between A1 and A2 along the x-axis can be measured and compared with distance D2 between the centers (e.g., geometric centers) or edges of the same side of trimming marks 1901 and 1902 along the x-axis. If the distances are nominally the same, the actual PR trimming rate along the x-axis is nominally the same as the estimated PR trimming rate along the x-axis. If the difference between the distances are sufficiently large, the actual PR trimming rate along the x-axis is different from the estimated PR trimming rate along the x-axis. The PR trimming parameters along the x-axis can then be adjusted accordingly. Depending on the locations of the trimming marks, PR trimming rates along different directions can be measured using different trimming marks as references. In another example, distance D3 between the center of trimming mark 1901 and PR layer 1905 along the x-axis and/or distance D4 between the center of trimming mark 1902 and PR layer 1905 along the x-axis can be measured and compared with estimated distances to determine the difference between the actual PR trimming rate and the estimated PR trimming rate along the x-axis. The PR trimming parameters along the x-axis can be adjusted based on the result of the comparison. In some embodiments, distance D5 between the center of trimming mark 1902 and PR layer 1905 along the y-axis can be measured to determine the actual PR trimming rate along the y-axis. In some embodiments, trimming marks can be formed at other locations surrounding or adjacent to the staircases for any suitable measurements. The specific locations and patterns of the trimming marks should not be limited by the embodiments of the present disclosure. Other measurements of the actual PR trimming rate using the trimming marks as references should also be within the scope of the present disclosure. In some embodiments, trimming marks are formed over staircase structure 100 and neighboring/surrounding staircase structure 100 for measuring of PR trimming rate along different directions.

FIG. 20 illustrates a cross-sectional view 2000 of staircase structure 100, according to some embodiments. The working principles of trimming marks formed over staircases can be described in detail. As shown in FIG. 20, staircase structure 100 includes a dielectric stack 2004 and trimming marks 2001 and 2002 distributed over A1 and A4, respectively. A PR layer 2003, for forming staircases can be formed over the top surface of dielectric stack 2004. In some embodiments, PR layer 2003 is trimmed horizontally (along the x-axis) and vertically (along the z-axis). In some embodiments, the distance (D6 and/or D7) between an edge of a trimming mark (e.g., 2001 and/or 2002) and a horizontal edge of PR layer 2003 is measured to determine the actual PR trimming rate along the direction (e.g., a horizontal direction or the x-axis) that points from the trimming mark to the horizontal edge of PR layer 2003, at a desired time (during the formation of the staircases and/or after the formation of the staircases). The determined/measured actual PR trimming rate can be compared to the estimated/calculated PR trimming rate to determine whether the actual PR trimming rate is nominally the same as the estimated PR trimming rate. Based on the result of comparison, the PR trimming rate can be adjusted, e.g., by changing etching power, etchant flow rates, etc. In various embodiments, the specific ways to form the trimming marks can vary. For example, trimming marks can be formed from depositing and patterning a layer of materials different from the sacrificial material and the insulating material over the dielectric stack. The patterning of the trimming marks can be performed before the etching of the staircases. The locations and/or patterns of the trimming marks can stay unchanged during and/or after the fabrication process. The specific ways to form the trimming marks should not be limited by the embodiments of the present disclosure.

The actual PR trimming rate can be monitored in real-time or measured after the etching of one batch of staircase structures is completed. For example, cameras and/or optical means can be used to monitor desired distances during the etching of staircases and/or after the etching of the staircases. The measured actual PR trimming rate can then be used to adjust or control the PR trimming parameters of the current batch or next batch of staircase structures. Thus, the PR layers can be trimmed at a more controllable rate, and the etching of the staircases can be more controllable.

Figure 21A:
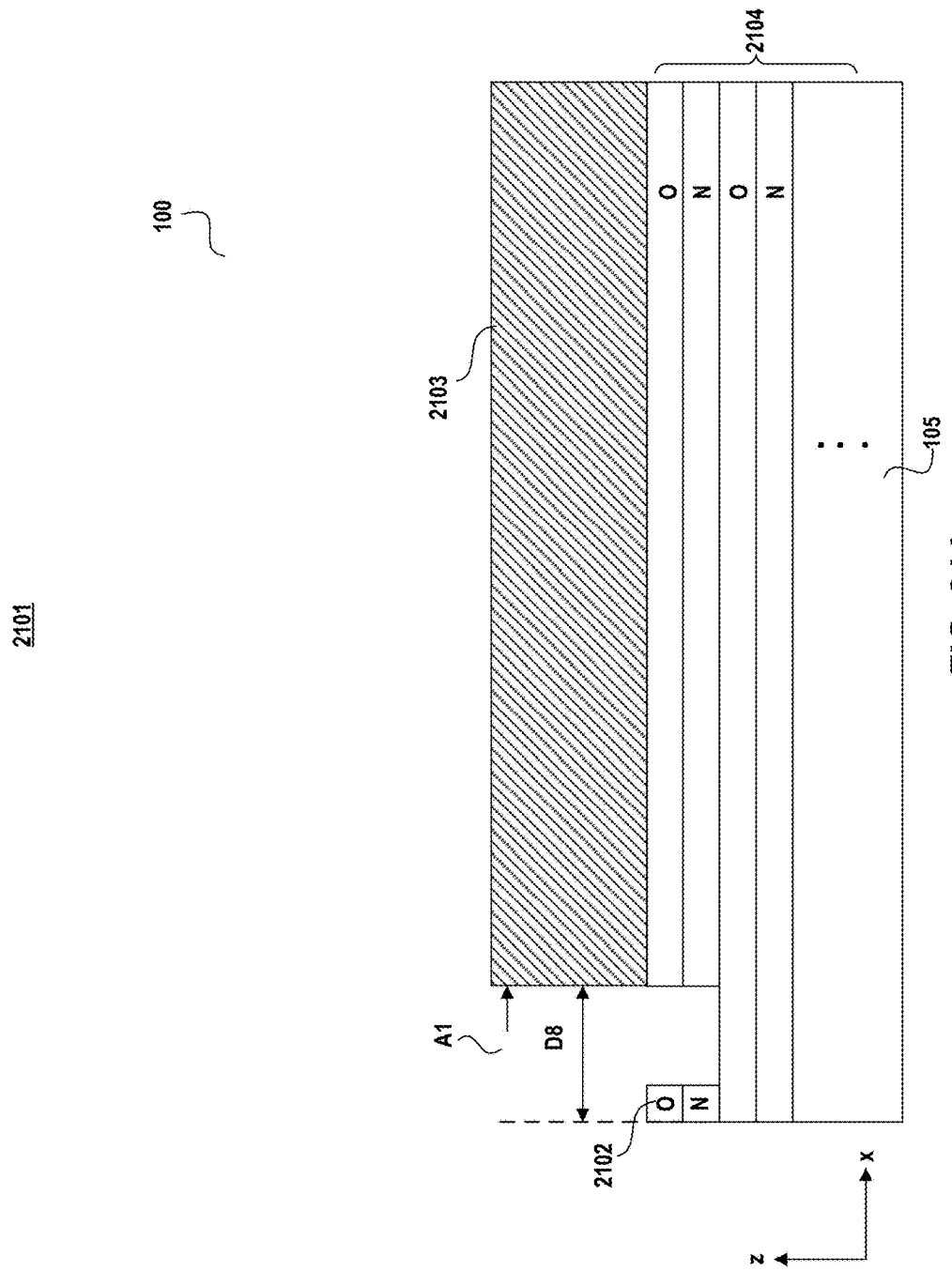
FIGS. 21A and 21B each illustrates a cross-sectional view of an exemplary 3D memory structure, according to some embodiments.
Figure 21B:
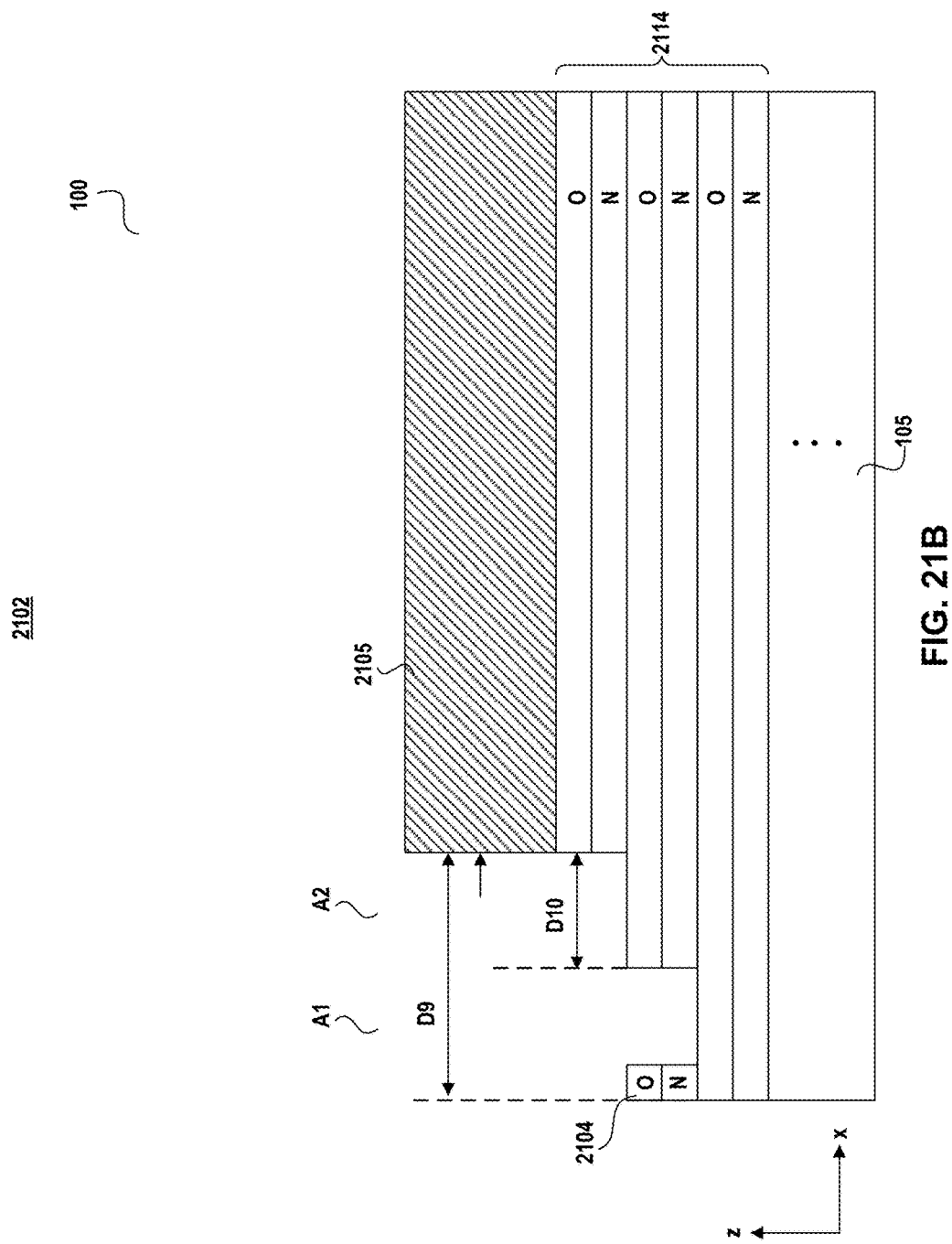

FIGS. 21A and 21B each illustrates an exemplary 3D memory structure, in some embodiments. FIGS. 21A and 21B illustrate another application of the trimming marks provided by the present disclosure. In some embodiments, the first distance between a first trimming mark and the PR layer before trimming is measured, during the formation of a staircase structure. The PR layer can then be trimmed. The first trimming mark and the trimmed PR layer can then be used as etch masks to etch the dielectric stack. Further, a second trimming mark, formed from etching the dielectric stack using the first trimming mark as the etch mask, can be formed, and one or more staircases can be formed between the second trimming mark and the trimmed PR layer. A second distance between the second trimming mark and the trimmed PR layer can be measured. The first distance can then be compared to the second distance to obtain the width (e.g., the measured horizontal width) of the one or more staircases. The measured width can then be compared with the designed width of the one or more staircases, and a deviation/difference between the measured width and the designed width can be obtained. This difference can be used to reflect whether the actual PR trimming rate (e.g., along the horizontal direction) is higher/lower than or nominally the same as the estimated/calculated PR trimming rate. PR trimming parameters can be adjusted based on the difference. For example, the amount of adjustment can be based on the value of the difference. Further, the adjusted PR trimming parameters can be used to control the trimming of the PR layer in subsequent etches of staircases of the same batch or a different batch. Thus, the widths of the staircases can be more precisely controlled to approach the designed widths. In some embodiments, the adjustment of PR trimming parameters can be performed one or more times (e.g., forming a feedback loop).

FIG. 21A illustrates the cross-sectional view 2101 of structure 100 having a first trimming mark 2102 over dielectric stack 2104 in A1, and a PR layer 2103 is formed over dielectric stack 2104. PR layer 2103 represents the PR layer before trimming, and the distance between first trimming mark 2102 and PR layer 2103 is D8. In some embodiments, trimming mark 2102 is formed at the edge of A1 and distance D8 is defined as the distance between the edge of trimming mark 2102 (e.g., at the edge of A1) and PR layer 2103. PR layer 2103 can be trimmed (e.g., horizontally or along the x-axis) and be used as an etch mask for the etching of dielectric stack 2104. First trimming mark 2101 can be used as an etch mask for forming one or more trimming marks at the same horizontal location.

FIG. 21B illustrates the cross-sectional view 2102 of structure 100 after PR layer 2103 is trimmed and used as an etch mask for the etching of dielectric stack 2104. Dielectric stack 2114 represents dielectric stack 2104 after the etching. PR layer 2105 represents PR layer 2103 after the trimming and the etching of dielectric stack 2104. A2 can be formed by the etching process. A second trimming mark 2104 can be formed using first trimming mark 2103 as the etch mask. The distance between second trimming mark 2104 and PR layer 2105 can be D9. In some embodiments, the difference between D8 and D9 can be D10, which represents the measured width of A2 or the measured width of a subsequently-formed staircase in A2. D10 can further be compared with a designed width of a staircase-forming area or a staircase to determine whether the PR trimming rate is higher/lower than or nominally the same as the estimated/calculated/expected PR trimming rate.

For example, if D10 is greater than the designed width, the PR trimming rate can be too high. The PR trimming parameters, such as gas flow rate and etching power, can be adjusted (e.g., tuned down), and vice versa. If D10 is nominally the same as the designed width, the PR trimming parameters can remain the same. In some embodiments, a threshold value can be used to determine whether the PR trimming parameters can be adjusted based on the difference. In an example, if the difference (e.g., absolute difference value) between D10 and the designed width is greater than a threshold value, the difference is considered "non-zero" and the difference is used to generate the feedback control value to adjust the PR trimming parameters. The threshold value can be a percentage (e.g., 5% of the designed width) or an absolute value (e.g., 0.5 nm). In some embodiments, if the difference is within (e.g., smaller than or equal to) the threshold value, the difference is considered "zero" and no feedback control value is generated.

In various embodiments, the adjustment of PR trimming parameters can be performed more than one time. For example, the PR layer can be repetitively trimmed and the distance between trimming marks at a certain location and the trimmed PR layer can be repetitively measured and compared to designed widths of staircase-forming areas or staircases. Accordingly, the PR trimming parameters can be adjusted repetitively, if necessary. In some embodiments, more than one trimming marks can be used to adjust the PR trimming parameters. For example, the more than one trimming marks can be distributed in the horizontal plane to adjust the PR trimming rate at different locations. In an example, the trimming marks are aligned along a line in the x-y plane, and the line can have an angle to the x-axis and the y-axis. PR trimming rates as a function along the x-axis and the y-axis can be reflected using the disclosed method. In another example, the trimming marks can also be formed over a region neighboring the dielectric stack (e.g., over a dummy staircase structure and/or a planar region, as shown in FIGS. 18 and 19). In this case, similar operations can be performed to adjust the PR trimming parameters. Thus, the PR trimming rate can be more precisely controlled and the widths of the staircases can be closer to the designed value. In some embodiments, the adjustment of PR trimming rate can be performed during the formation of a staircase structure. The method can be used to monitor/control the PR trimming rate for the current batch of staircase structure, and/or the PR trimming rate for the subsequent batches of staircase structures.

In various embodiments, the working principles of trimming marks can be used in other applications. For example, any suitable reference marks can be formed in an etching process for etching control. The object of which the etch rate is being monitored or being controlled (e.g., the PR layer) and the reference marks (e.g., the trimming marks) can be formed at different regions/locations. Any suitable measurements (e.g., the distance between a reference mark and the object) can be used to reflect the deviation of actual etch rate from the estimated etch rates. Accordingly, etching parameters (e.g., RF power, etchant flow rates, and chamber pressure) can be adjusted to allow the actual etch rate to approach the estimated etch rate.

In some embodiments, the dielectric stack (e.g., dielectric stack 210) can also have a plurality of (N, O) pairs stacking alternatingly. For example, the top dielectric pair can be formed over or neighboring the staircases. The trimming marks can also include a recessed structure, which is formed in a dielectric pair. The thickness/depth of a trimming mark can be equal to the thickness of a dielectric pair. Details of forming staircases of (N, O) pairs can be referred to the description of FIGS. 2A-17B and are not repeated herein.

Figure 22:
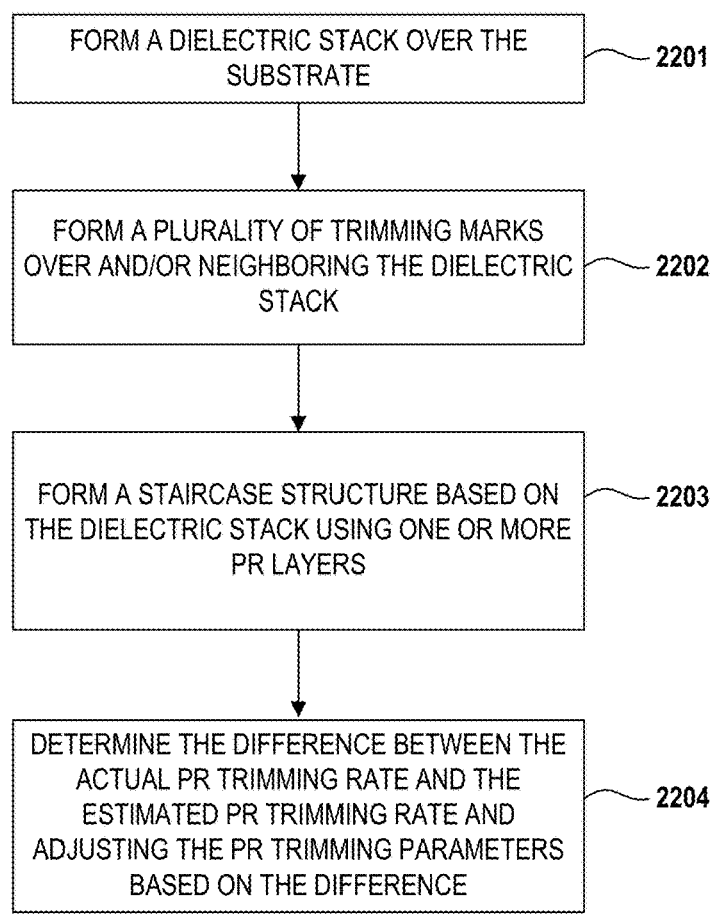
FIG. 22 is a flowchart of an exemplary method for forming trimming marks, according to some embodiments.

Embodiments of the present disclosure further provide a method for forming trimming marks in/with a staircase structure. FIG. 22 illustrates an exemplary process flow for forming trimming marks, according to some embodiments. For explanation purposes, the operations shown in method 2200 are described in the context of FIGS. 2A-18. In various embodiments of the present disclosure, the operations of method 2200 can be performed in a different order and/or vary.

At operation 2201, a substrate and a dielectric stack over the substrate are provided.

In some embodiments, the substrate can include any suitable material for forming the 3D memory structure. For example, the substrate can include silicon, silicon germanium, silicon carbide, silicon on insulator (SOI), germanium on insulator (GOI), glass, gallium nitride, gallium arsenide, and/or other suitable III-V compounds.

In some embodiments, the dielectric stack includes an alternating stack of sacrificial material layers "N" and insulating material layers "O", arranged vertically (along the z-axis) over the substrate. A sacrificial material layer and the underlying insulating material layer forms a dielectric pair. In some embodiments, sacrificial material layers N include any suitable material different from insulating material layers O. For example, sacrificial material layers N can include poly-crystalline silicon, silicon nitride, poly-crystalline germanium, and/or poly-crystalline germanium-silicon. In some embodiments, sacrificial material layers N include silicon nitride. Insulating material layers O can include any suitable insulating materials, e.g., silicon oxide. The dielectric stack can be formed by alternatingly depositing sacrificial material layers and insulating material layers over the substrate. The deposition of sacrificial material layers and insulating material layers can include any suitable deposition methods such as CVD, PVD, PECVD, sputtering, MOCVD, and/or ALD. In some embodiments, the sacrificial material layers and the insulating material layers are each formed by CVD.

At operation 2202, a plurality of trimming marks are formed over and/or neighboring the dielectric stack. The trimming marks can be formed by patterning the dielectric stack and/or patterning a region (e.g., a test region or a dummy region) neighboring the dielectric stack. The trimming marks can have any suitable shapes, arrangement patterns, and number, and can be formed at any suitable locations depending on the fabrication requirements. In some embodiments, the shapes of trimming marks can vary at different locations, e.g., for measurement purposes. The trimming marks can have a protruding structure or a recessed structure. In some embodiments, a trimming mark can be formed by etching a dielectric pair, and the height of a protruding trimming mark and the depth of a recessed trimming mark are each equal to the thickness of a dielectric pair. The trimming marks can be formed before and/or during the formation of staircases from the dielectric stack. The formation of trimming marks can be referred to the description of FIGS. 2A-17B.

At operation 2203, a staircase structure can be formed based on the dielectric stack using one or more PR layers. The staircase structure can be formed by repetitively trimming the PR layer and etching the dielectric pairs of the dielectric stack using the PR layer as the etch mask. The sacrificial material layers and the insulating material layers can be etched by any suitable etchants. In some embodiments, the etchant of the insulating material layers has desirably high selectivity over the sacrificial material layers so that the etching of one dielectric pair can stop at the lower adjacent dielectric pair, and the etching of the dielectric stack can be more precisely controlled. In some embodiments, each trimming mark can function as an etch mask or a patterning mask for the etching of the lower adjacent dielectric pair so that the locations of the trimming marks can stay unchanged during the etches. The formation of the staircase structure can be referred to the description of FIGS. 2A-17B. In some embodiments, operation 2202 and 2203 can be performed at the same time.

At operation 2204, the difference between the actual PR trimming rate and the estimated PR trimming rate can be determined using the trimming marks as references and the PR trimming parameters can be adjusted based on the difference. The difference between the actual PR trimming rate for forming the current batch of staircase structures can be reflected in difference in the measured widths and designed widths of staircases/staircase-forming areas, using the trimming marks as references. The measured widths can be compared with the predetermined designed widths to determine whether the actual PR trimming rate is nominally the same as the estimated PR trimming rate. The PR trimming parameters for etching the next batch or subsequent dielectric pairs can be adjusted based on the result of the comparison. Details of the working principles of the trimming marks can be referred to in the description of FIGS. 18-21.

Figure 23:
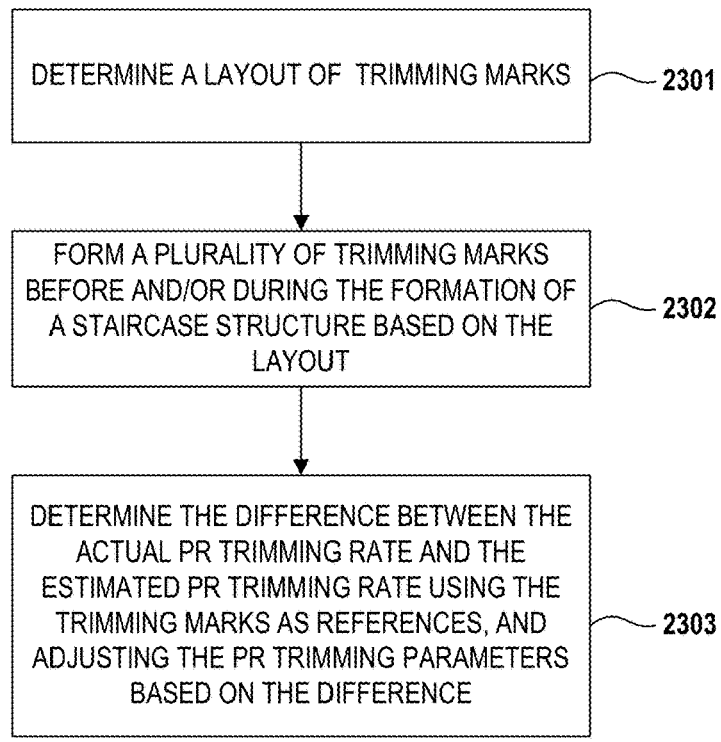
FIG. 23 is a flowchart of an exemplary method for PR trimming rate control, according to some embodiments.

Embodiments of the present disclosure further provide a method for controlling and monitoring the actual PR trimming rate in the 3D memory structure fabrication. FIG. 23 illustrates an exemplary method 2300 for forming trimming marks, according to some embodiments. For explanation purposes, the operations shown in method 2300 are described in the context of FIGS. 2A-21. In various embodiments of the present disclosure, the operations of method 2300 can be performed in a different order and/or vary.

At operation 2301, a layout of one or more trimming marks is determined. The layout of the trimming marks can include locations of the trimming marks. In some embodiments, the trimming marks can be formed over or neighboring a dielectric stack that is to be processed/etched.

At operation 2302, the one or more trimming marks are formed before and/or during the formation of a staircase structure based on the layout. In some embodiments, the staircase structure can be formed based on the dielectric stack using a PR layer that is trimmed during the fabrication process. The trimming marks can have any suitable shapes, arrangement patterns, and number, and can be formed at any suitable locations depending on the fabrication requirements. In some embodiments, the shapes of trimming marks can vary at different locations, e.g., for measurement purposes. The trimming marks can have a protruding structure or a recessed structure. In some embodiments, the locations of the trimming marks stay unchanged during the fabrication process.

At operation 2303, the difference between the actual PR trimming rate and the estimated PR trimming rate is determined using the trimming marks as references, and the PR trimming parameters are adjusted based on the difference. In some embodiments, the comparison of trimming rates can be obtained by a comparison between one or more measured widths and one or more designed widths using the trimming marks as references. If the actual PR trimming rate is higher or lower than the estimated PR trimming rate, the PR trimming parameters can be adjusted, e.g., by changing the etching power and/or etchant gas flows, to approach the estimated PR trimming rate for etching of the current batch of staircase structures or the next batch of staircase structures. In some embodiments, the value or scale of the difference can be used to proportionally adjust the PR trimming parameters. For example, a greater difference can lead to a greater change in the PR trimming parameters, and vice versa.

Figure 24:
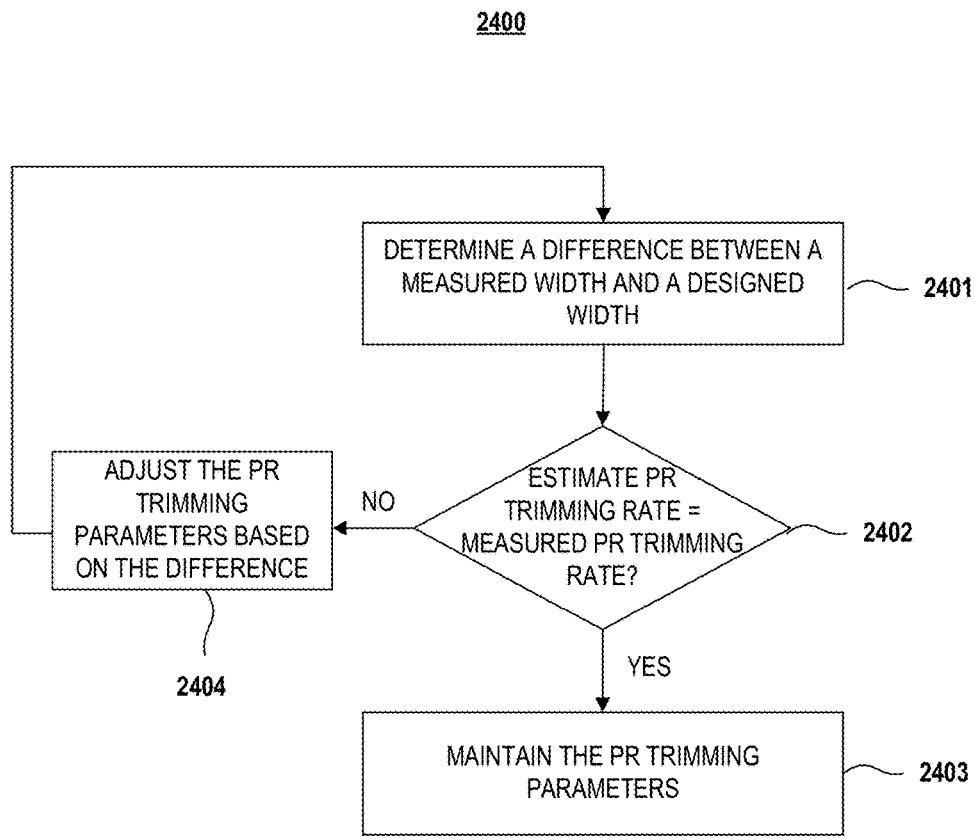
FIG. 24 is a flowchart of an exemplary method for PR trimming rate control using a feedback loop, according to some embodiments.

In some embodiments, operation 2303 can include a feedback loop 2400 for continuing to adjust the PR trimming parameters so that the actual PR trimming rate can constantly approach the estimated PR trimming rate. FIG. 24 illustrates an exemplary feedback loop for adjusting the PR trimming parameters, according to some embodiments.

At operation 2401, the difference between a measured width and a designed width can be determined using one or more trimming marks as references. In some embodiments, the difference between the actual PR trimming rate and the estimated PR trimming rate is reflected in the difference between the measured width and the designed width. In some embodiments, the difference can be greater than, equal to, or smaller than zero.

At operation 2402, it is determined whether the estimated PR trimming rate is nominally equal to the actual PR trimming rate.

At operation 2403, if the estimated PR trimming rate is nominally equal to the actual PR trimming rate, the PR trimming parameters can be maintained.

At operation 2404, if the estimated PR trimming rate is different from the actual PR trimming rate, the PR trimming parameters are adjusted based on the difference between the measured width and the designed width and the loop returns to operation 2401.

In some embodiments, if the difference (e.g., absolute difference value) between the actual PR trimming rate and the estimated PR trimming rate is greater than a threshold value, the difference is considered "non-zero" and the difference is used to generate the feedback control value to adjust the PR trimming parameters. For example, the threshold value can be a percentage (e.g., 5% of the estimated PR trimming rate) or an absolute value (e.g., 0.5 nm). In some embodiments, if the difference is within (e.g., smaller than or equal to) the threshold value, the difference is considered "zero" and no feedback control value is generated.

In various embodiments, the methods and structures provided by the present disclosure can also be used in other applications such as etch rate control in various semiconductor fabrications, etc. The specific application of the method and structure should not be limited by the embodiments of the present disclosure.

By using the disclosed feedback loop, the actual PR trimming rate can constantly approach/follow the estimated PR trimming rate. Accordingly, the trimming of the PR layer can be more controllable, and the widths of the staircases can be closer to design. In some embodiments, feedback loop 2400 and/or at least part of method 2300 are performed using suitable software and/or hardware. For example, measuring tools such as cameras and/or optical means can be used to obtain desired parameters, e.g., distances, and a computer can be used to determine differences in distances. The computer can further determine the difference between the actual PR trimming rate and the estimated PR trimming rate and adjust the PR trimming parameters by controlling the gas valves and/or radio frequency (RF) power supply of the reaction chamber, to adjust actual the PR trimming rate.

In the present disclosure, a trimming mark over an area/object can refer to a trimming mark with a protruding structure formed on the area/object or a trimming mark with a recessed structure formed in the area/object.

In some embodiments, a method for controlling a PR trimming rate in a PR trimming process includes, providing a substrate, forming a PR layer over a first region of the substrate, and forming a first trimming mark over a second region neighboring the first region. The method also includes trimming the PR layer, measuring a first distance between the first trimming mark and the PR layer along a first direction parallel to a top surface of the substrate to determine an actual PR trimming rate of the PR trimming process along the first direction, comparing the actual PR trimming rate along the first direction with an estimated PR trimming rate along the first direction to determine a first difference between the actual PR trimming rate along the first direction and the estimated PR trimming rate along the first direction, and adjusting one or more PR trimming parameters of the PR trimming process based on the first difference.

In some embodiments, a method for controlling a PR trimming rate in a PR trimming process includes providing an estimated PR trimming rate, determining an actual PR trimming rate, and comparing the actual PR trimming rate and the estimated PR trimming rate to determine a difference between the actual PR trimming rate and the estimated PR trimming rate. In response to the difference being greater than a threshold, one or more PR trimming parameters for the PR trimming process are adjusted so that the actual PR trimming rate is same as the estimated PR trimming rate.

In some embodiments, a method for controlling a PR trimming rate in a PR trimming process for forming a 3D memory structure includes forming a dielectric stack over a substrate, the dielectric stack including a plurality of sacrificial material layers and a plurality of insulating material layers arranged alternatingly, trimming a PR layer over the dielectric stack, etching the dielectric stack, using the trimmed PR layer as an etch mask, to form a plurality of staircases, and forming a first trimming mark for the trimmed PR layer. The method also includes measuring a first distance between the first trimming mark and the trimmed PR layer along a first direction parallel to the top surface of the substrate to determine an actual PR trimming rate of the PR trimming process along the first direction, comparing the actual PR trimming rate along the first direction with an estimated PR trimming rate along the first direction to determine a first difference between the actual PR trimming rate along the first direction and the estimated PR trimming rate along the first direction, and adjusting one or more PR trimming parameters of the PR trimming process based on the first difference.

In some embodiments, a 3D memory structure includes a substrate, a staircase structure disposed over the substrate, the staircase structure including a plurality of conductor layers and a plurality of insulating layers arranged alternatingly. In some embodiments, a conductor layer and an insulating layer adjacent to the conductor layer form a staircase, and a first trimming mark over one or more of the staircase structure and a region neighboring the staircase structure over the substrate, wherein the first trimming mark has one or more of a protruding structure and a recessed structure.

In some embodiments, a method for controlling a PR trimming rate in a PR trimming process for forming a three-dimensional memory structure includes forming a dielectric stack over a substrate, the dielectric stack including a plurality of sacrificial material layers and a plurality of insulating material layers arranged alternatingly. In some embodiments, a PR layer is disposed over the dielectric stack. In some embodiments, the method further includes forming a first trimming mark for the PR layer, measuring a first distance between the first trimming mark and the PR layer along a first direction parallel to the top surface of the substrate, trimming the PR layer along the first direction, and etching the dielectric stack, using the trimmed PR layer as an etch mask, to form a staircase. In some embodiments, the method further includes forming a second trimming mark, using the first trimming mark as an etch mask, for the trimmed PR layer, measuring a second distance between the second trimming mark and the trimmed PR layer along the first direction, comparing the first distance with the second distance to determine a difference between an actual PR trimming rate and an estimated PR trimming rate along the first direction, and adjusting one or more PR trimming parameters of the PR trimming process based on the difference.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for controlling a photoresist (PR) trimming rate in a PR trimming process, comprising:
   forming a PR layer over a first region of a substrate;
   forming a first trimming mark over a second region of the substrate neighboring the first region;
   trimming the PR layer;
   measuring a first distance between the first trimming mark and the PR layer along a first direction parallel to a top surface of the substrate to determine an actual PR trimming rate of the PR trimming process along the first direction;
   comparing the actual PR trimming rate along the first direction with an estimated PR trimming rate along the first direction to determine a first difference between the actual PR trimming rate along the first direction and the estimated PR trimming rate along the first direction; and
   adjusting one or more PR trimming parameters of the PR trimming process based on the first difference.

2. The method of claim 1, wherein:
   the first trimming mark is formed by patterning the second region of the substrate;
   the first trimming mark comprises one or more of a protruding structure and a recessed structure; and
   the first trimming mark comprises a rectangular shape, a circular shape, an irregular shape, a squared shape, and a combination thereof.

3. The method of claim 2, further comprising:
   forming a second trimming mark over the second region;
   measuring a second distance between the second trimming mark and the PR layer along a second direction parallel to the top surface of the substrate to determine an actual PR trimming rate of the PR trimming process along the second direction;
   comparing the actual PR trimming rate along the second direction with an estimated PR trimming rate along the second direction to determine a second difference between the actual PR trimming rate along the second direction and the estimated PR trimming rate along the second direction; and
   adjusting the one or more PR trimming parameters of the PR trimming process based on the second difference.

4. The method of claim 3, wherein:
   the first direction and the second direction are different from one another.

5. The method of claim 4, wherein:
   the second trimming mark and the first trimming mark are formed by a same patterning process; and
   the second trimming mark and the first trimming mark have same or different shapes.

6. The method claim 5, wherein the second region comprises one or more of a planar surface and a three-dimensional surface.

7. A three-dimensional (3D) memory structure, comprising:
   a substrate;
   a staircase structure disposed over the substrate, the staircase structure comprising a plurality of conductor layers and a plurality of insulating layers arranged alternatingly, wherein a conductor layer and an insulating layer adjacent to the conductor layer form a staircase; and
   a first trimming mark over one or more of the staircase structure and a region neighboring the staircase structure over the substrate, wherein the first trimming mark has a same thickness as the staircase and has one or more of a protruding structure and a recessed structure.

8. The structure of claim 7, wherein the first trimming mark is over one staircase of the staircase structure.

9. The structure of claim 8, wherein the first trimming mark comprises a rectangular shape, a circular shape, an irregular shape, a squared shape, or a combination thereof.

10. The structure of claim 8, further comprising a second trimming mark disposed over another staircase of the staircase structure, the second trimming mark having a same thickness and same shape as the first trimming mark.

11. The structure of claim 10, wherein: staircases of the staircase structure are aligned along a first direction; and the first trimming mark and the second trimming mark are aligned along a direction that has an angle to the first direction.

12. A method for controlling a photoresist (PR) trimming rate in a PR trimming process for forming a three-dimensional memory structure, comprising:
   forming a dielectric stack over a substrate, the dielectric stack comprising a plurality of sacrificial material layers and a plurality of insulating material layers arranged alternatingly, wherein a PR layer is disposed over the dielectric stack;
   forming a first trimming mark for the PR layer;
   measuring a first distance between the first trimming mark and the PR layer along a first direction parallel to the top surface of the substrate;
   trimming the PR layer along the first direction;
   etching the dielectric stack, using the trimmed PR layer as an etch mask, to form a staircase;
   forming a second trimming mark, using the first trimming mark as an etch mask, for the trimmed PR layer;
   measuring a second distance between the second trimming mark and the trimmed PR layer along the first direction;

comparing the first distance with the second distance to determine a difference between an actual PR trimming rate and an estimated PR trimming rate along the first direction; and adjusting one or more PR trimming parameters of the PR trimming process based on the difference.

13. The method of claim 12, wherein forming a first trimming mark comprises forming the first trimming mark over one or more of the dielectric stack and a region neighboring the dielectric stack.

14. The method of claim 13, wherein forming the first trimming mark comprises:

patterning the one or more of the dielectric stack and the region neighboring the dielectric stack to form an initial trimming mark; and etching, repetitively, the dielectric stack using the initial trimming mark as an etch mask to form the first trimming mark.

15. The method of claim 12, wherein the first trimming mark has one or more of a protruding structure and a recessed structure.

16. The method of claim 15, wherein the protruding structure includes a height of a thickness of a staircase and the recessed structure includes a depth of the thickness of the staircase.

17. The method of claim 13, wherein the region over the dielectric stack and the region neighboring the dielectric stack include one or more of a planar surface and a three-dimensional surface.

18. The method of claim 12, further comprising:

controlling the trimming of the trimmed PR layer based on the adjusted one or more PR trimming parameters; and etching the dielectric stack using the trimmed PR layer as an etch mask to form an other staircase.

19. The method of claim 12, further comprising:

controlling a trimming of an other PR layer based on the adjusted one or more PR trimming parameters; and etching an other dielectric stack using the other trimmed PR layer as an etch mask to form an other staircase.

\* \* \* \* \*